US011031265B2

(12) United States Patent
Sunugatov et al.

(10) Patent No.: US 11,031,265 B2
(45) Date of Patent: Jun. 8, 2021

(54) LOAD PORT MODULE

(71) Applicant: Brooks Automation, Inc., Chelmsford, MA (US)

(72) Inventors: Radik Sunugatov, Santa Clara, CA (US); Robert Carlson, Milpitas, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 12 days.

(21) Appl. No.: 16/692,443

(22) Filed: Nov. 22, 2019

(65) Prior Publication Data

US 2020/0168488 A1  May 28, 2020

Related U.S. Application Data

(60) Provisional application No. 62/772,481, filed on Nov. 28, 2018.

(51) Int. Cl.
*H01L 21/67* (2006.01)
*B65G 49/06* (2006.01)

(52) U.S. Cl.
CPC ...... *H01L 21/67201* (2013.01); *B65G 49/068* (2013.01)

(58) Field of Classification Search
CPC ......... H01L 21/67201; H01L 21/67393; H01L 21/67017; H01L 21/67772; H01L 21/67259; H01L 21/67775; H01L 21/67173; B65G 49/68
See application file for complete search history.

(56) References Cited

U.S. PATENT DOCUMENTS

| 9,536,765 | B2 | 1/2017 | Iwamoto et al. |
| 9,620,399 | B2 | 4/2017 | Tanimura et al. |
| 2012/0309286 | A1* | 12/2012 | Nakano ............ H01L 21/67389 454/305 |

(Continued)

FOREIGN PATENT DOCUMENTS

| JP | 2017112394 | 6/2017 |
| KR | 101575652 | 12/2015 |
| KR | 101619379 | 5/2016 |

*Primary Examiner* — Jason K Niesz
(74) *Attorney, Agent, or Firm* — Perman & Green, LLP; Colin C. Durham

(57) ABSTRACT

Substrate loading device including a frame adapted to connect the substrate loading device to a substrate processing apparatus, the frame having a transport opening through which substrates are transported between the loading device and processing apparatus, a cassette support for holding at least one substrate cassette container, and cassette support purge ports with purge port nozzle locations disposed on the cassette support, each nozzle location being configured so that a nozzle at the nozzle location couples to at least one purge port of the substrate cassette container, wherein each nozzle location defines an interchangeable purge port nozzle interface so that different interchangeable purge port nozzles are removably mounted to respective nozzle interfaces of the nozzle locations that correspond to the different nozzle configurations of the interchangeable purge port nozzle modules, in conformance with and effecting coupling to different ports of different substrate cassette containers having different purge port characteristics.

29 Claims, 25 Drawing Sheets

(56) References Cited

U.S. PATENT DOCUMENTS

2013/0011223 A1    1/2013   Emoto et al.
2013/0326841 A1   12/2013   Natsume et al.
2016/0276188 A1    9/2016   Morihana et al.

\* cited by examiner

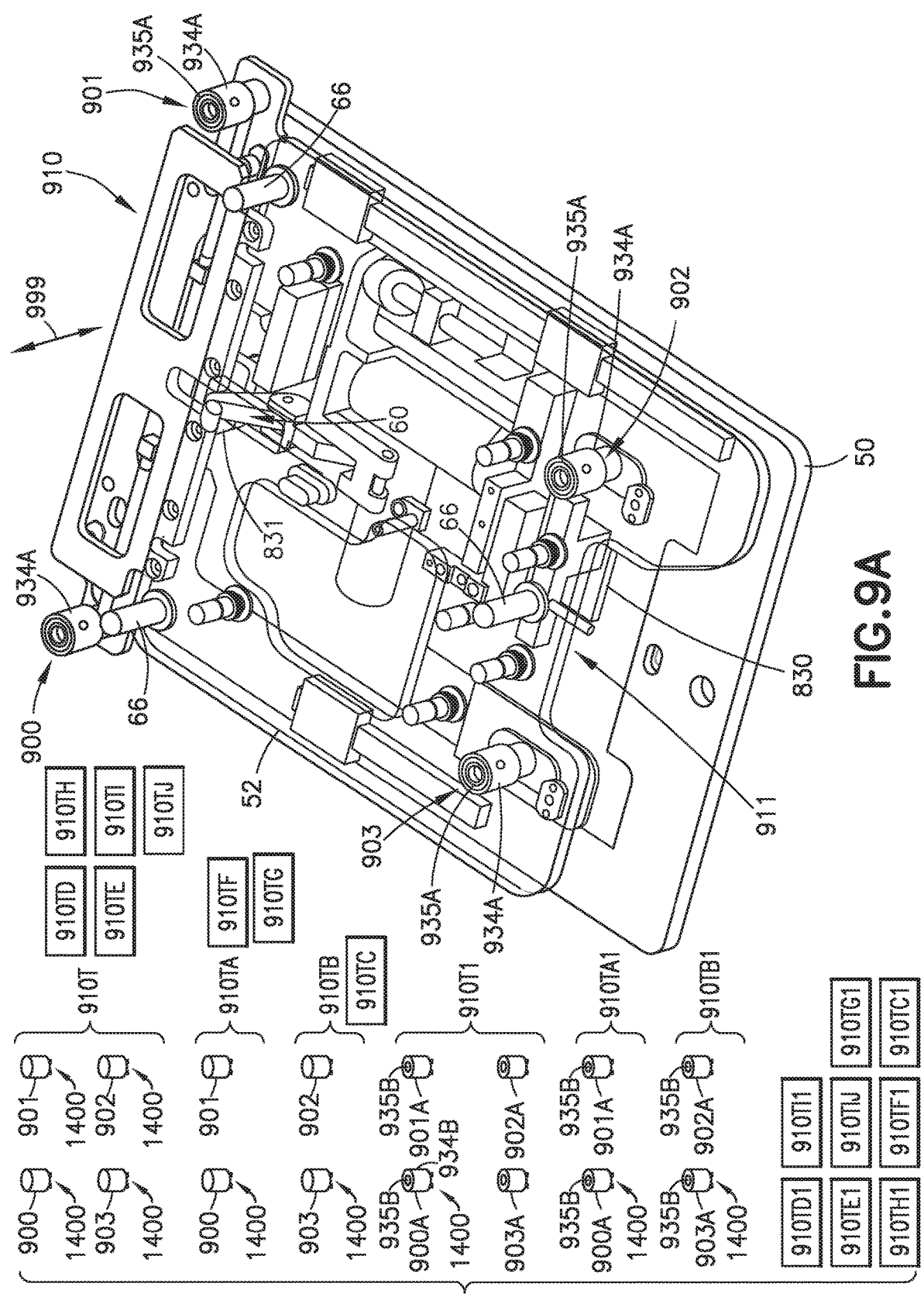

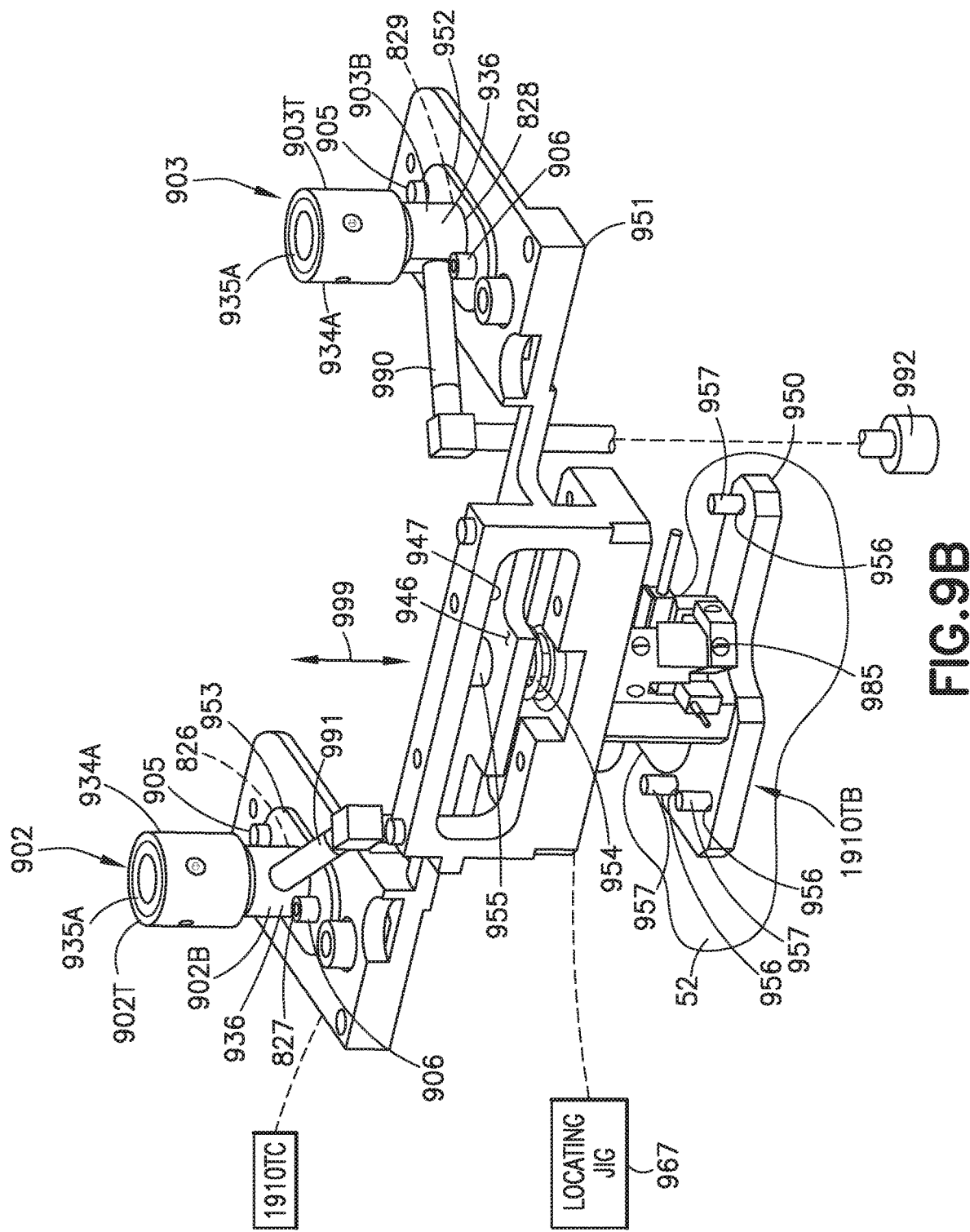

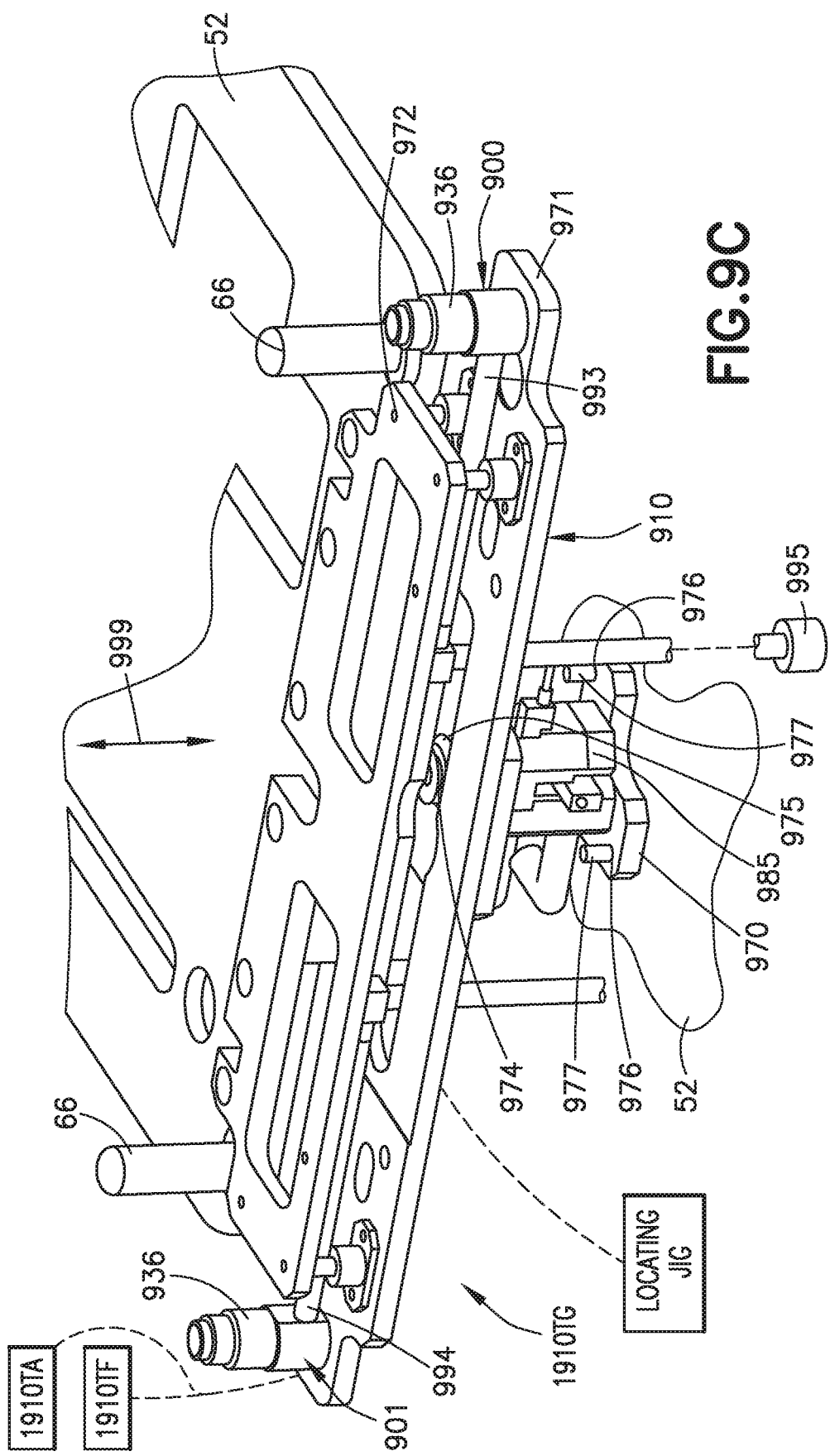

1910T FLU

1910TAFLU

1910TBFLU

1910TCFLU

1910TDFLU

1910TEFLU

1910TFFLU

1910TGFLU

1910THFLU

1910TIFLU

1910TJFLU

FIG.9G

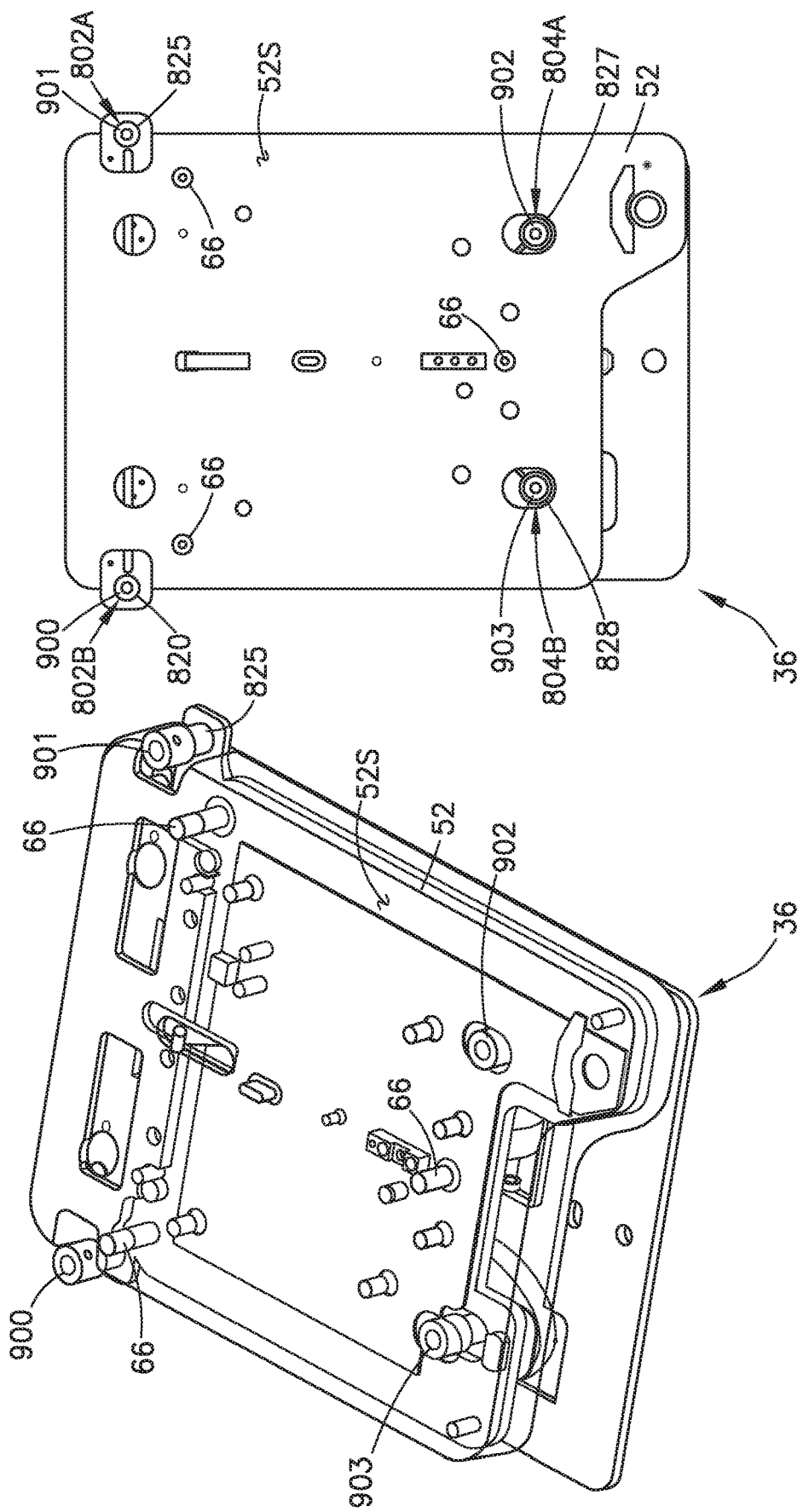

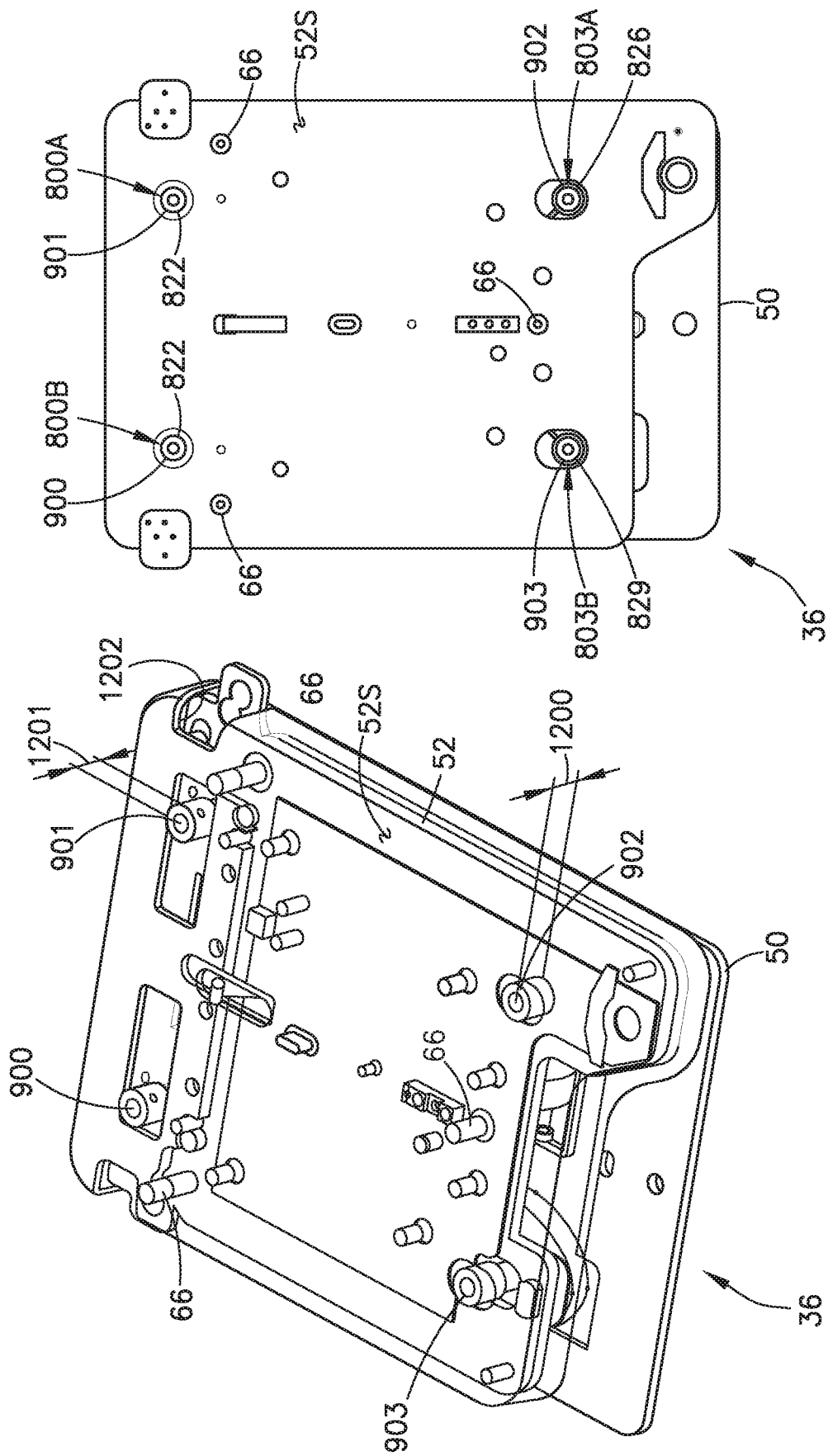

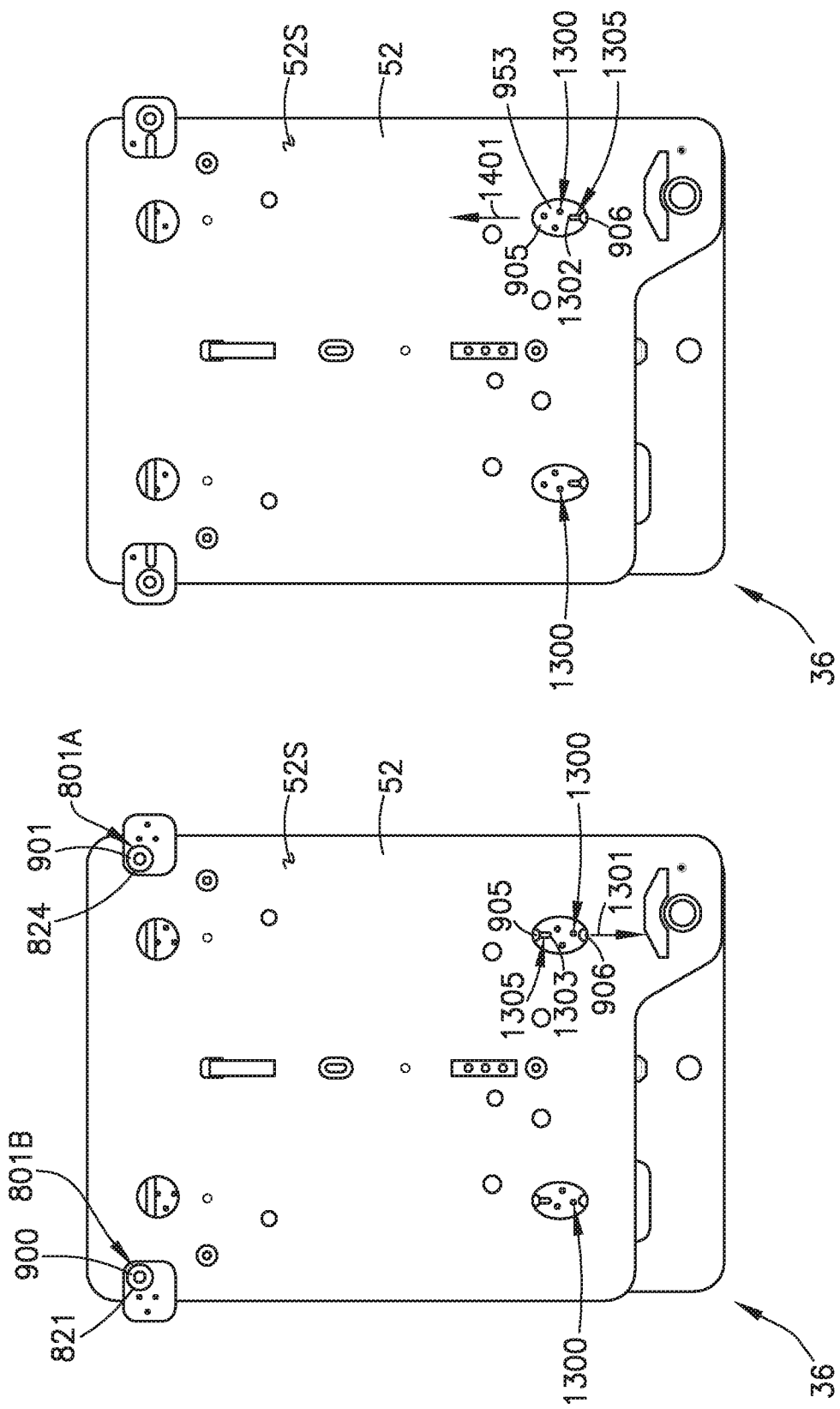

LOAD PORT MODULE

CROSS-REFERENCE TO RELATED APPLICATIONS

This Non-provisional Application claims priority from and benefit of U.S. provisional application No. 62/772,481, filed Nov. 28, 2018, the disclosure of which is incorporated herein by reference in its entirety.

BACKGROUND

1. Field

The aspects of the present disclosure generally relate to substrate processing apparatus and, more particularly, to an improved load port module for the substrate processing apparatus.

2. Brief Description of Related Developments

Generally, clean dry air/gas enabled load ports used in semiconductor manufacturing are employed to purge substrate carrier containers (referred to herein as containers) such as Front Opening Unified Pods (FOUPS). FOUPS with purge options generally include front and/or rear (e.g., relative to the container substrate passage opening) port locations. As an example, 300 mm FOUPS with purge options are made by various manufacturers including but not limited to Entegris, Inc., Shin-Etsu Polymer Co. Ltd., and Miraial Co., Ltd.; however, there is no industry standard for the FOUP purge port locations on the containers.

Given the lack of any industry standard for purge port locations, the purge port locations may vary from manufacturer to manufacturer. As an example, between the manufacturers noted above, there may be three different locations for the front purge ports and two different locations for the rear purge ports. The number of purge ports may also differ between manufacturers. The number of purge ports may also differ between different products from the same manufacturer. For example, some FOUPS have only two front purge ports, while other FOUPS have two front purge ports and two rear purge ports. The flow of purge gas into and out of a FOUP may also vary in that the input port and/or an exhaust port designations of the purge ports on the FOUPS may be different.

The purge port mating interfaces (i.e., the portion of the purge port that mates with purge nozzles of the load port) are another variable between manufacturers. For example, some FOUPS have hard plastic purge port mating interfaces; while other FOUPS have fluoroelastomer (such as sold under the tradename Viton™ by DuPont Performance Elastomers LLC) purge port mating interfaces, among other types of interfaces.

BRIEF DESCRIPTION OF THE DRAWINGS

The foregoing aspects and other features of the present disclosure are explained in the following description, taken in connection with the accompanying drawings, wherein:

FIG. 9A is an schematic illustration of a portion of the load port module of FIG. 2 in accordance with aspects of the present disclosure;

FIG. 9B is an schematic illustration of a portion of the load port module of FIG. 2 in accordance with aspects of the present disclosure;

FIGS. 9C-9G are schematic illustrations of a portion of the load port module of FIG. 2 in accordance with aspects of the present disclosure;

FIGS. 11A and 11B are schematic illustrations of a portion of the load port module of FIG. 2 in accordance with aspects of the present disclosure;

FIGS. 12A and 12B are schematic illustrations of a portion of the load port module of FIG. 2 in accordance with aspects of the present disclosure;

FIG. 13 is a schematic illustration of a portion of the load port module of FIG. 2 in accordance with aspects of the present disclosure;

FIG. 14 is a schematic illustration of a portion of the load port module of FIG. 2 in accordance with aspects of the present disclosure;

DETAILED DESCRIPTION

Figure 1A:
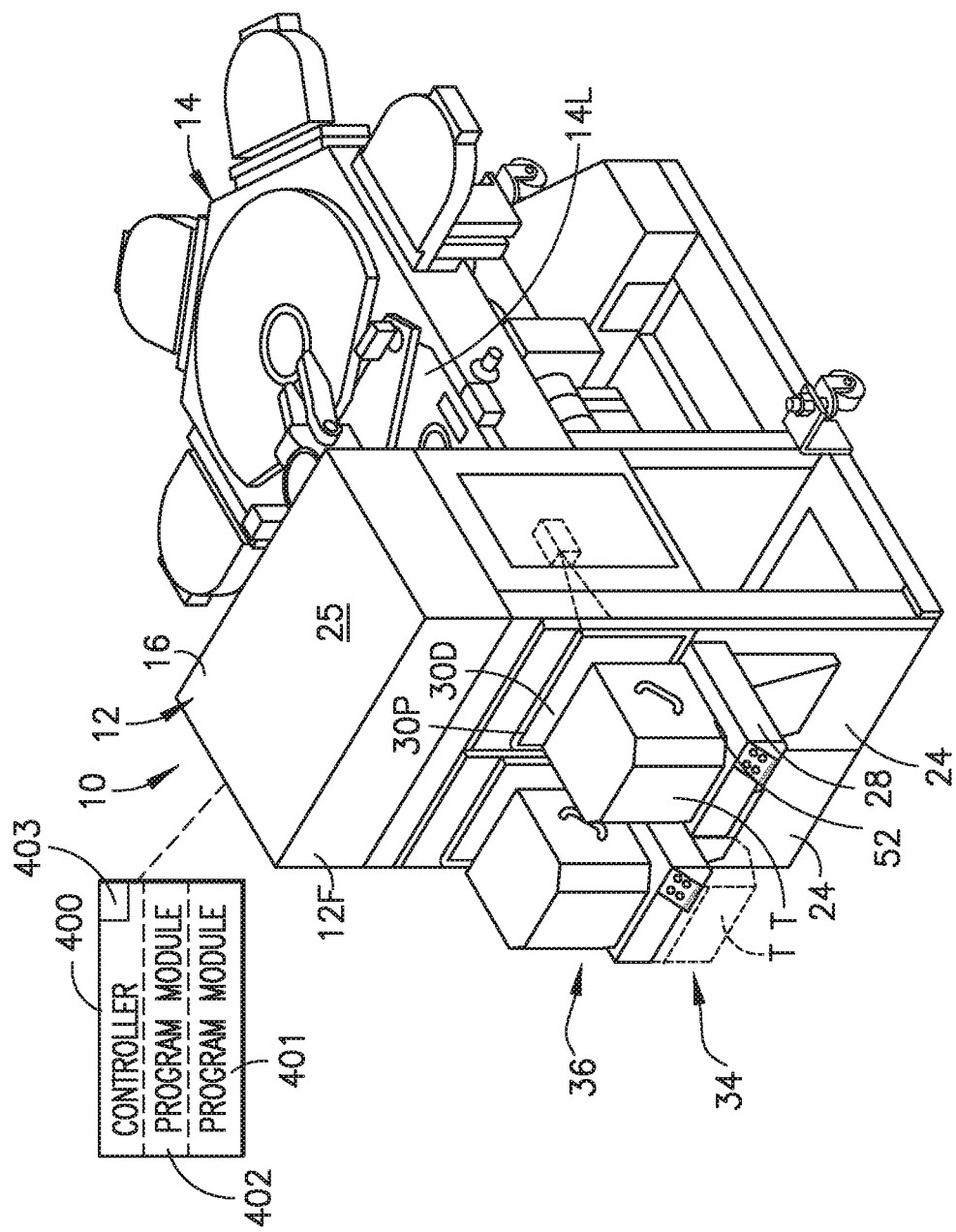
FIG. 1A is a schematic perspective view of a substrate processing apparatus in accordance with aspects of the present disclosure.

Referring to FIG. 1A, a perspective view of a substrate processing apparatus 10 incorporating features of the present disclosure is illustrated. Although the present disclosure will be described with reference to the aspects shown in the drawings, it should be understood that the present disclosure can be embodied in many alternate forms of aspects. In addition, any suitable size, shape or type of elements or materials could be used.

In the aspect illustrated in FIG. 1A, the apparatus 10 has been shown, for example purposes only, as having a general substrate batch processing tool configuration. In alternate embodiments, the substrate processing apparatus may have any other suitable configuration, as the features of the present invention, as will be described in greater detail below, are equally applicable to any substrate processing tool configuration including tools for individual substrate processing and/or linear tool stations such as those illustrated in FIGS. 1B and 1C and described in U.S. patent application Ser. No. 11/442,511, entitled "Linearly Distributed Semiconductor Workpiece Processing Tool," filed May 26, 2006, the disclosure of which is incorporated by reference herein in its entirety. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus). The front section 12 has a system (as will be described in greater detail below) providing an interface allowing the importation of substrates from the fab into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus may have a controlled atmosphere (e.g. vacuum, inert gas), and generally comprises a processing system for processing substrates. For example, the rear section may generally include a central transport chamber, with substrate transport device, and peripheral processing modules for performing desired manufacturing processes to substrates within the apparatus (e.g. etching, material deposition, cleaning, baking, inspecting, etc.). Substrates may be transported, within the fab, to the processing apparatus 10 in containers T (also known as carriers). The containers T may be positioned on or in proximity to the front section interface. From the containers, the substrates may be brought through the interface, such as BOLTS (Box Opener/Loader to Tool Standard) interface, into the front section 12 using automation components in the front section. The substrates may them be transported, via load locks, to the atmospherically controlled rear section for processing in one or more of the processing modules. Processed substrates may then be returned, in a substantially reversed manner, to the front section 12 and then to the transport containers T for removal.

The front section 12, which may otherwise be referred to as an environmental front end module or EFEM, may have a shell or casing defining a protected environment, or mini-environment where substrates may be accessed and handled with minimum potential for contamination between the transport containers T, used to transport the substrates within the FAB, and the load locks 14L providing entry to the controlled atmosphere in the rear processing section 14. Load ports or load port modules 24 (one or more in number as will be described further below) are located on one or more of the sides of the front section providing the interface between the front section and FAB. The load port modules may be substantially similar to those described in U.S. Pat. No. 8,821,099 and entitled "Load Port Module", issued on Sep. 2, 2014, the disclosure of which is incorporated herein by reference in its entirety. The load port modules 24 may have closable ports 30P forming a closable interface, such as the BOLTS interface, between the EFEM interior and exterior. As seen in FIG. 1A, the load port modules may have a support area for a substrate transport container T. A secondary holding area may also be provided under the support area, where transport containers may be temporarily buffered. The transport container support area may allow automated movement of the transport container T supported thereon to a final or docked position. A port door, of the load port module, may engage the transport container when in a docked position in order to open the transport container while also opening the access port 30P in the load port frame, to provide access to substrates within the transport container as well as access for transporting the substrates between the container and EFEM interior. Engagement between the port door and transport container may be effected by independently operable keys as described in U.S. Pat. No. 8,821,099.

Figure 8:
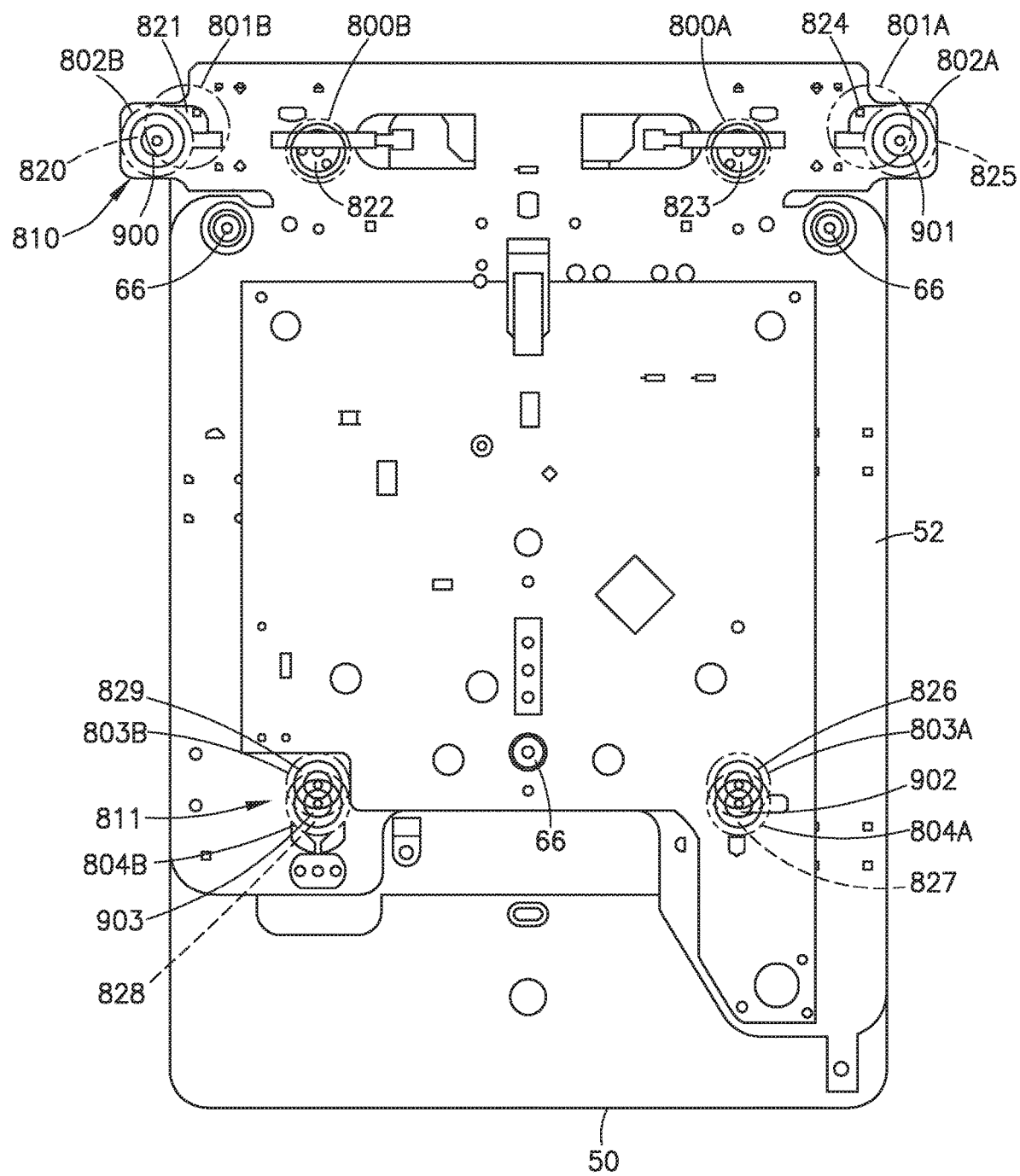
FIG. 8 is an exemplary plan view of a portion of the load port module of FIG. 2 in accordance with aspects of the present disclosure.
Figure 9D:
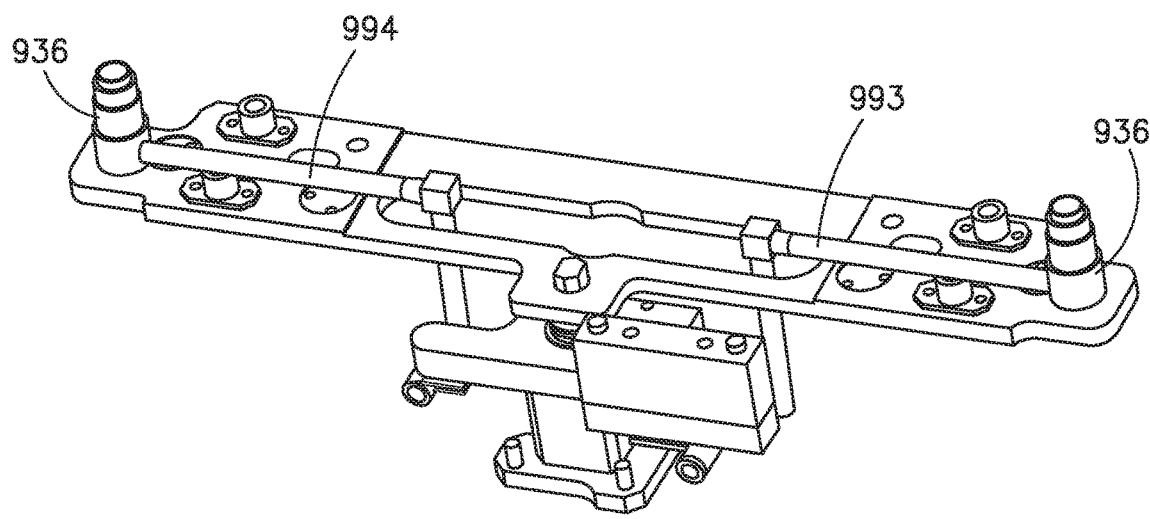

In accordance with the aspects of the present disclosure, the load port module(s) 24 described herein are clean dry air/gas enable load port modules that provide for a reconfigurable purge nozzle configuration (see FIG. 8 illustrating different purge port nozzle locations 800A, 800B, 801A, 801B, 802A, 802B, 803A, 803B, 804A, 804B). The purge nozzle configuration is selectable from a number of different purge nozzle configurations depending on, for example, a configuration of a container T to be coupled to the load port module 24. Conventionally load port manufacturers provide a single purge nozzle configuration on the load port that is tailored to a single type of container having a predetermined purge port configuration. The load port(s) 24 in accordance with the aspects of the present disclosure provides for a load port 24 that is flexible in that the purge nozzles 900-903 (FIG. 9A) of the load port module 24 may be reconfigured in a modular fashion so that a semiconductor manufacturer is not restricted to using only a single type of container from a single container manufacturer. The load port module(s) 24 of the present disclosure provide for the use of containers having different purge port configurations without the expense and logistics of manufacturing a different load port module for each container purge port configuration. The load port module(s) 24 of the present disclosure may also provide for on-the-fly (or otherwise referred to herein as fast swap) reconfiguration of the purge nozzle 900-903 (FIG. 9A) locations, a number of the purge nozzles 900-903, and a designation of the purge nozzles as an input nozzle or an output nozzle. It is noted that on-the-fly reconfiguration is where the purge nozzles 900-903 are reconfigured/repositioned as desired by the load port manufacturer and/or the end user/customer depending on a type of container being used at a particular time within a semiconductor fabrication environment, where purge nozzle modules 1910T, 1910TA, 1910TB, 1910TC, 1910TD, 1910TE, 1910TF, 1910TG, 1910TH, 1910TI, 1910TJ, 1910TFLU, 1910TAFLU, 1910TBFLU, 1910TCFLU, 1910TDFLU, 1910TEFLU, 1910TFFLU, 1910TGFLU, 1910THFLU, 1910TIFLU, 1910TJFLU (referred to herein generally as purge nozzle modules 1910—see FIGS. 9B, 9C, 9F, 9G) and purge nozzle modules 910T, 910TA, 910TB, 910TC, 910TD, 910TE, 910TF, 910TG, 910TH, 910TI, 910TJ, 91011, 910TA1, 910TB1, 910TC1, 910TD1, 9101E1, 910TF1, 910TG1, 910TH1, 910TJ1, 910TJ1 (referred to herein generally as purge nozzle modules 910—see FIG. 9A) are fast swapped and are located in a predetermined fixed positions corresponding to a predetermined purge nozzle configuration of the container T without in-situ position adjustment of the purge nozzles 900-903 on the load port 24 after coupling of the purge nozzle modules 1910, 910 to the load port 24. As described herein, each of the interchangeable purge port nozzle interfaces and the different predetermined purge nozzle configurations of each respective one of the different interchangeable purge port nozzle modules 1910, 910 is configured so as to effect fast swap mounting of each respective one of the different interchangeable purge port nozzle modules 1910, 910 with another one of the different interchangeable purge port nozzle modules 1910, 910. Suitable containers T (see also containers TA-TJ) that may be used with the aspects of the present disclosure are FOUPS manufactured by Entegris, Inc., Shin-Etsu Polymer Co. Ltd, and Miraial Co., Ltd. (e.g., in one aspect the containers T-TJ may correspond to FOUPS such as the Shin-Etsu Polymer Co. Ltd. CT-CF-S_SHIN_ETSY, T-CF-S_SHIN_ETSY, CF-A_SHIN-ENSY, OB-CB_SHIN_ETSY; the Entegris, Inc. Spectra™, A300, F300; and the Miraial Co., Ltd. 4 port and 2 Port).

Figure 9E:
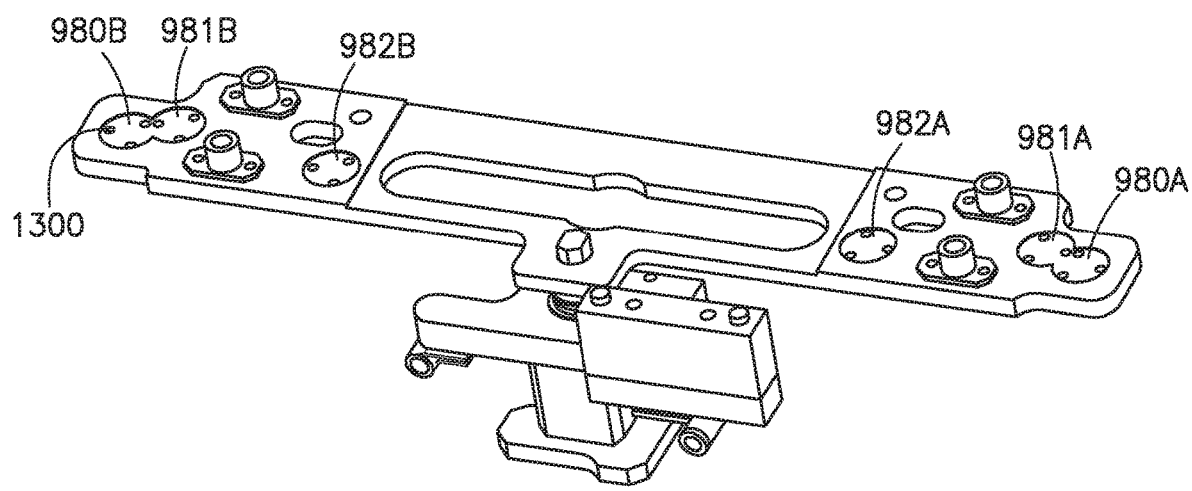

As will be described herein, each purge nozzle 900-903 of the load port 24 may be moved, by an operator, to any one of a number of predetermined purge port nozzle locations 800A, 800B, 801A, 801B, 802A, 802B, 803A, 803B, 804A, 804B (FIG. 8). Flexible fluid hoses 10020-10023 (FIG. 10), at least in part, selectably couple each purge nozzle 900-903 (FIG. 9) to either an input gas manifold 10030 (FIG. 10) or an exhaust gas manifold 10040 (FIG. 10). A type of purge nozzle configuration (e.g., for interfacing with a hard plastic configured purge port of the container T, a fluoroelastomer (such as sold under the tradename Viton™ by DuPont Performance Elastomers LLC) configured purge port of the container T, or any other suitably configured purge port of the container T) may also be selected from a number of different interchangeable purge nozzle configurations depending on the purge nozzle mating interface of the container T selected for use with the load port 24. It is noted that while the aspects of the present disclosure are described with respect to front opening unified pod (FOUP) style containers T, the aspects of the present disclosure may be equally extended for employment with any desired type of transport container including, but not limited to, SMIF containers.

Figure 1B:
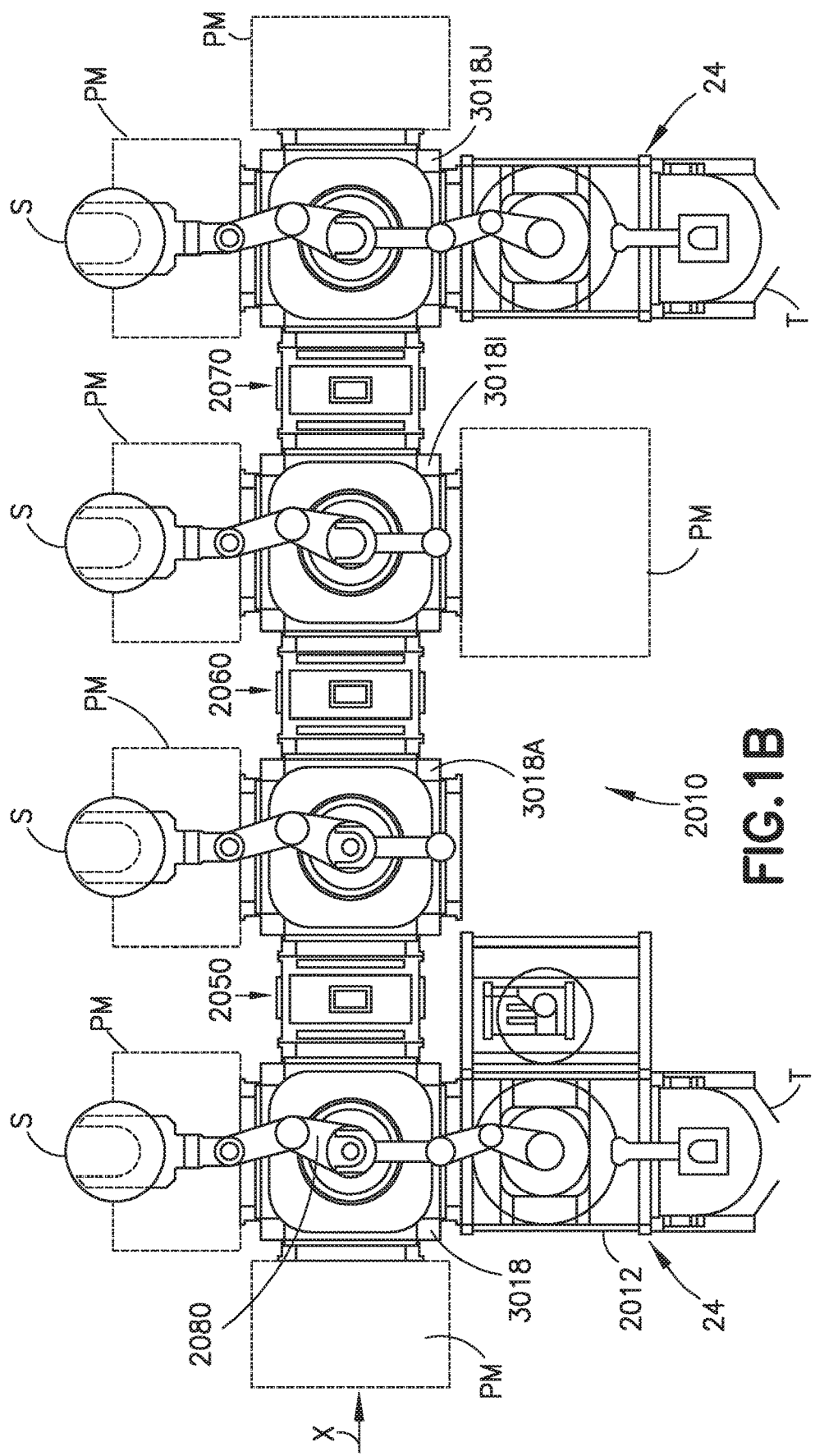
FIG. 1B is a schematic illustration of a substrate processing apparatus in accordance with aspects of the present disclosure.

Referring now to FIG. 1B, a schematic plan view of a linear substrate processing system 2010 is shown where the tool interface section 2012 is mounted to a transfer chamber module 3018 so that the interface section 2012 is facing generally towards (e.g. inwards) but is offset from the longitudinal axis X of the transfer chamber 3018. The transfer chamber module 3018 may be extended in any suitable direction by attaching other transfer chamber modules 3018A, 3018I, 3018J to interfaces 2050, 2060, 2070 as described in U.S. patent application Ser. No. 11/442,511, previously incorporated herein by reference. Each transfer chamber module 3018, 3019A, 3018I, 3018J includes a substrate transport 2080 for transporting substrates throughout the processing system 2010 and into and out of, for example, processing modules PM. As may be realized, each chamber module may be capable of holding an isolated, controlled or sealed atmosphere (e.g. N2, clean air, vacuum).

Figure 1C:
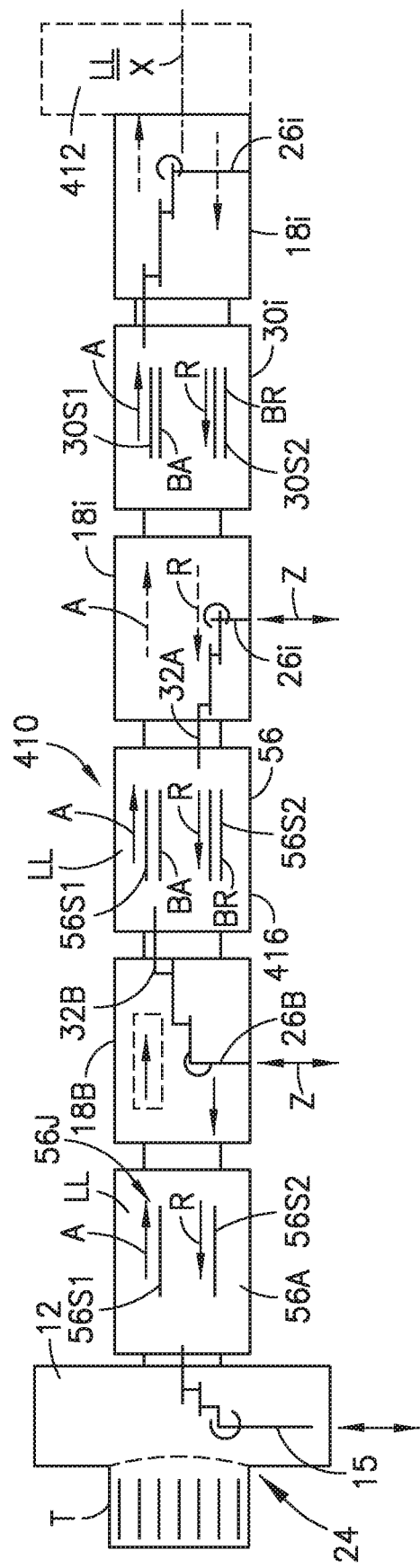
FIG. 1C is a schematic illustration of a substrate processing apparatus in accordance with aspects of the present disclosure.

Referring to FIG. 1C, there is shown a schematic elevation view of an exemplary processing tool 410 such as may be taken along longitudinal axis X of the linear transfer chamber 416. In one aspect, as shown in FIG. 1C, the tool interface section 12 may be representatively connected to the transfer chamber 416. In this aspect, interface section 12 may define one end of the tool transfer chamber 416. As seen in FIG. 1C, the transfer chamber 416 may have another workpiece entry/exit station 412 for example at an opposite end from interface section 12. In other aspects, other entry/exit stations for inserting/removing work pieces from the transfer chamber may be provided such as between the ends of the tool transfer chamber 416. In one aspect of the present disclosure, interface section 12 and entry/exit station 412 may allow loading and unloading of workpieces from the tool. In other aspects, workpieces may be loaded into the tool from one end and removed from the other end. In one aspect, the transfer chamber 416 may have one or more transfer chamber module(s) 18B, 18i. Each chamber module may be capable of holding an isolated, controlled or sealed atmosphere (e.g. N2, clean air, vacuum). As noted before, the configuration/arrangement of the transfer chamber modules 18B, 18i, load lock modules 56A, 56B and workpiece stations forming the transfer chamber 416 shown in FIG. 1C is merely exemplary, and in other aspects the transfer chamber may have more or fewer modules disposed in any desired modular arrangement. In one aspect station 412 may be a load lock. In other aspects, a load lock module may be located between the end entry/exit station (similar to station 412) or the adjoining transfer chamber module (similar to module 18i) may be configured to operate as a load lock. As also noted before, transfer chamber modules 18B, 18i have one or more corresponding transport apparatus 26B, 26i located therein. The transport apparatus 26B, 26i of the respective transfer chamber modules 18B, 18i may cooperate to provide the linearly distributed workpiece transport system 420 in the transfer chamber. In other aspects the transfer chamber modules 18B may be configured to allow any suitable transport cart (not shown) to travel between transfer chamber modules 18B along at least a portion of the length of the linear transfer chamber 416. As may be realized the transport cart 900 may include any suitable transport apparatus mounted thereto and substantially similar to those transport apparatuses described herein. As shown in FIG. 1C, in one aspect the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) (e.g. independent rotation about shoulder and elbow joints with Z axis motion) degrees of freedom from a simplified drive system compared to conventional drive systems. In other aspects, the drive section may provide the arm with more or less than three degrees of freedom. As seen in FIG. 1C, in one aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transfer chamber along linear axis X of the transfer chamber. By way of example, workpiece(s) may be loaded into the transfer chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transfer chamber and may be loaded to and unloaded from any desired module (processing or otherwise) communicating with the transfer chamber. In other aspects, interstitial transfer chamber modules with static workpiece supports or shelves may not be provided between transfer chamber modules 18B, 18i. In such aspects of the present disclosure, transport arms of adjoining transfer chamber modules may pass off workpieces directly (or through the use of a buffer station) from end effector or one transport arm to end effector of another transport arm to move the workpiece through the transfer chamber. The processing station modules may operate on the substrates through various deposition, etching, or other types of processes to form electrical circuitry or other desired structure on the substrates. The processing station modules are connected to the transfer chamber modules to allow substrates to be passed from the transfer chamber to the processing stations and vice versa. A suitable example of a processing tool with similar general features to the processing apparatus depicted in FIG. 1C is described in U.S. patent application Ser. No. 11/442,511, previously incorporated by reference in its entirety.

Figure 2:
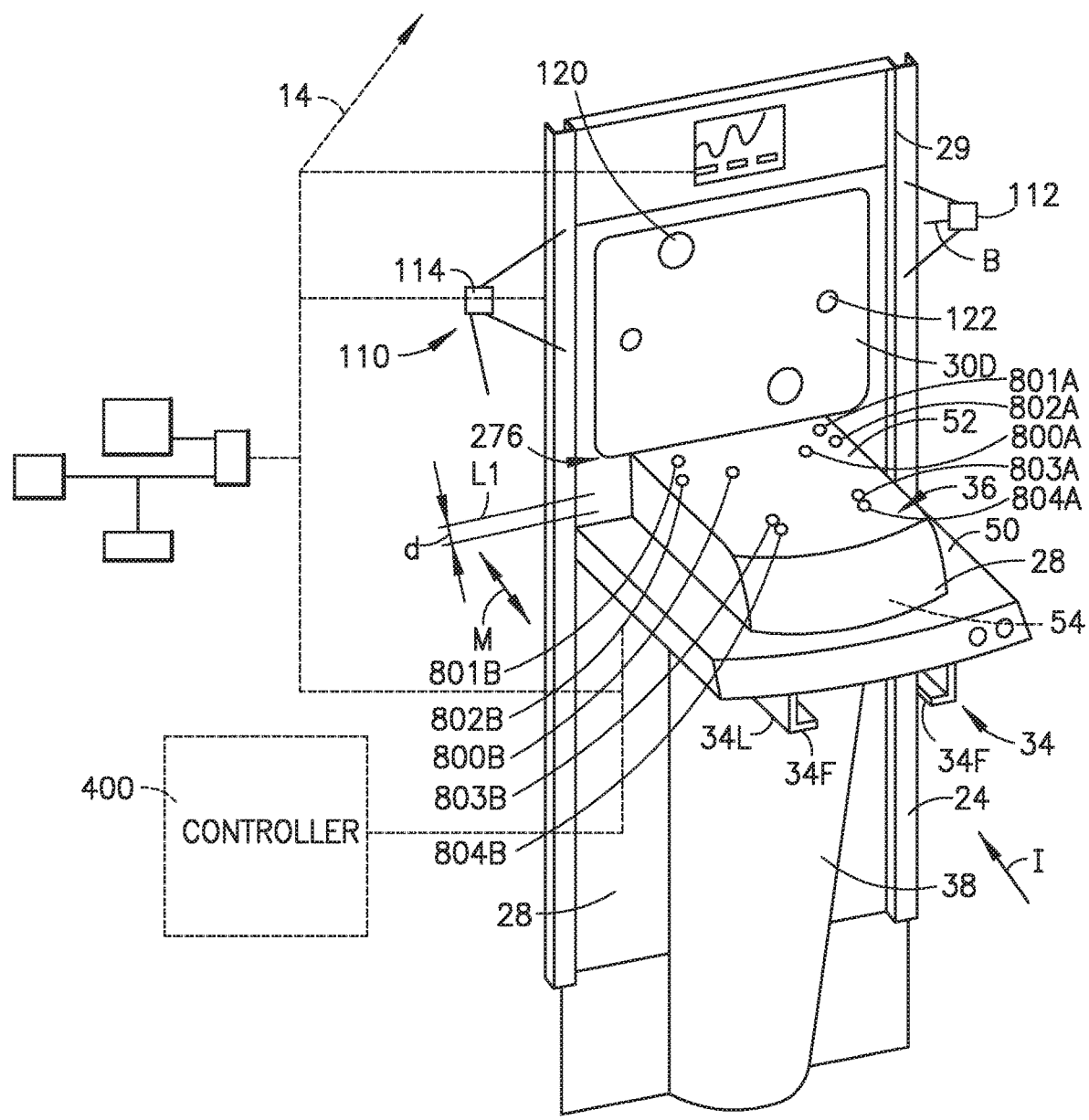
FIG. 2 is a schematic illustration of a load port module of any of the substrate processing apparatus of FIGS. 1A-1C in accordance with aspects of the present disclosure.

Referring to FIGS. 1A and 2 (which is a perspective view of the load port module 24 of the processing apparatus in accordance with this exemplary aspects of the present disclosure), the load port module 24 has a frame 29 that is adapted to connect the load port module 24 to any suitable processing apparatus. The load port module 24 frame 29 may generally define (as noted before) a transport container holding or support area 28 and a closable port 30P (or transport opening) through which substrates are transported in and out of the mini-environment inside the front section housing 16 (in other aspects, the closable port 30P is a transport opening through which substrates are transported between the load port module 24 and any suitable processing apparatus such as the EFEM, a process module, a transfer chamber, etc.). The load port module 24 may be substantially similar to that described in U.S. Pat. No. 8,821,099 entitled "Load Port Module" and issued on Sep. 2, 2014, the disclosure of which is incorporated herein by reference in its entirety. The housing 16 and load port module 24 of the EFEM are connected, as will be described further below, to form a chamber or space 25 that is substantially closed from the exterior, and as noted before, provides a controlled or mini-environment within the front section 12 (also referred to as an EFEM). For example, the front section may include a controlled air flow system (not shown), such as vents, louvers, laminar flow system, to avoid particulate contamination from entering the mini-environment in the front section 12. As seen in FIGS. 1A and 2, the transport container holding area 28 of the load port module 24 may have a primary or first station 36 and a secondary station 34. In this aspect, each station 36, 34 of the holding area 28 may be capable of holding a transport container T, though in alternate embodiments, the transport container holding area may have more or fewer holding stations, and each holding station may be capable of supporting any desired number of substrate transport containers. The transport container T (FIG. 1A) shown seated on the holding (or cassette support) stations 36, 34 are depicted for example purposes as being front opening unified pods (FOUPs) style containers, though in alternate embodiments, the holding stations of the load port holding area may be capable of supporting any desired type of transport container such as SMIF containers.

In the aspect shown in FIG. 1A, the front section 12 has the load port modules 24 located on the front face 12F of the front section 12 for example purposes. In this location, the load port module 24 may be positioned to facilitate placement and removal of transport containers T, onto at least one holding (or cassette support) station 34, 36 of the load port module holding area 28, using any suitable automated material handling system (AMHS) (not shown). As seen in FIGS. 1A-2, the load port module holding area 28 projects forwards from the face 12F of the front section, and access for removal/placement, with the AMHS, of the transport containers T onto the holding area 28 may be from the top or front. In alternate embodiments, the load port module may be located on other sides of the front section as desired. In still other alternate embodiments, the load port modules may be located on two or more sides of the front section 12. As seen in FIG. 2, the load port module 24 in this exemplary aspect may have an extension zone 38 projecting outwards from the base plate of the load port module 24.

Figure 3:
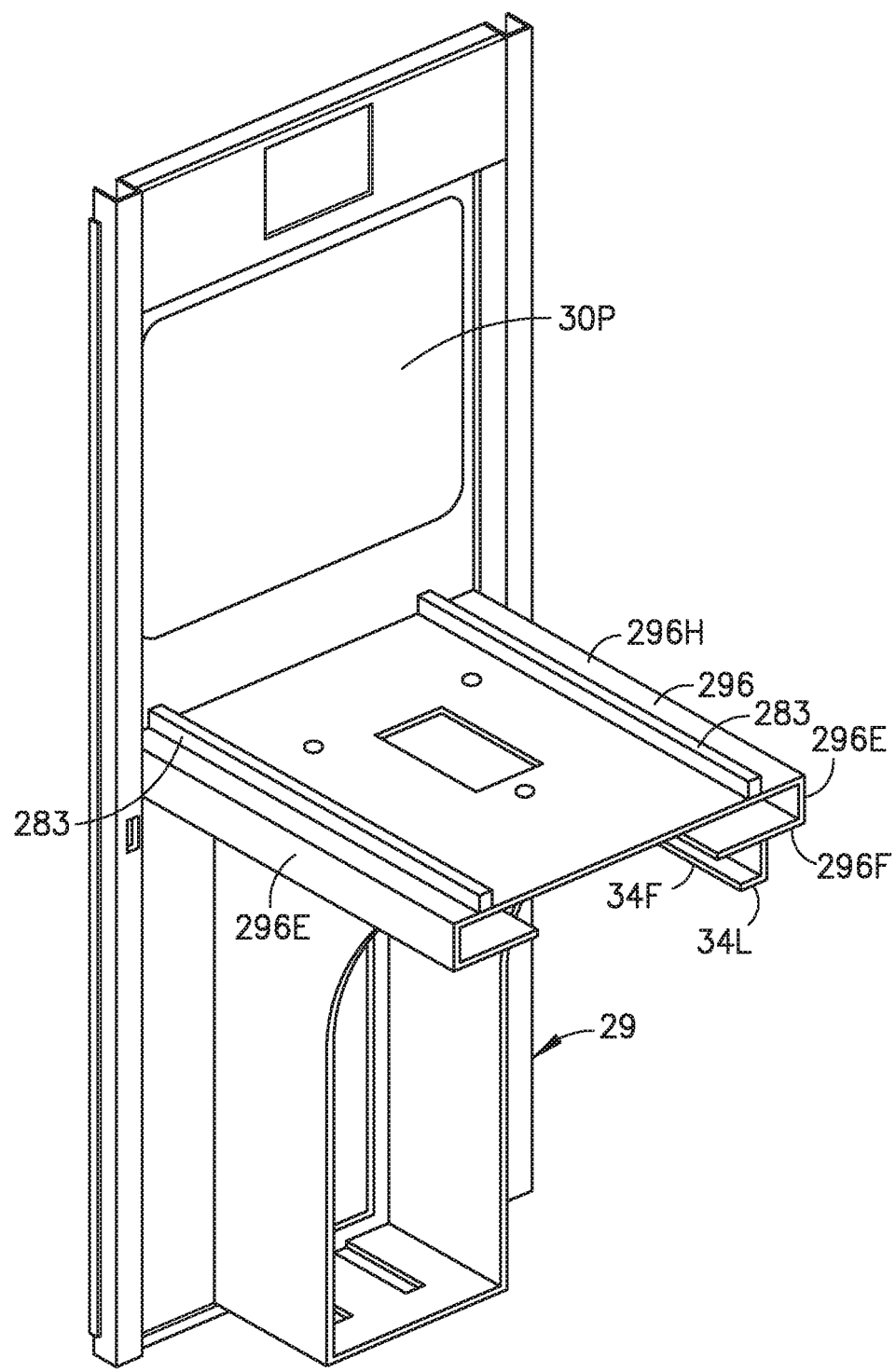
FIG. 3 is a schematic illustration of the load port module of FIG. 2 in accordance with aspects of the present disclosure.
Figure 6A:
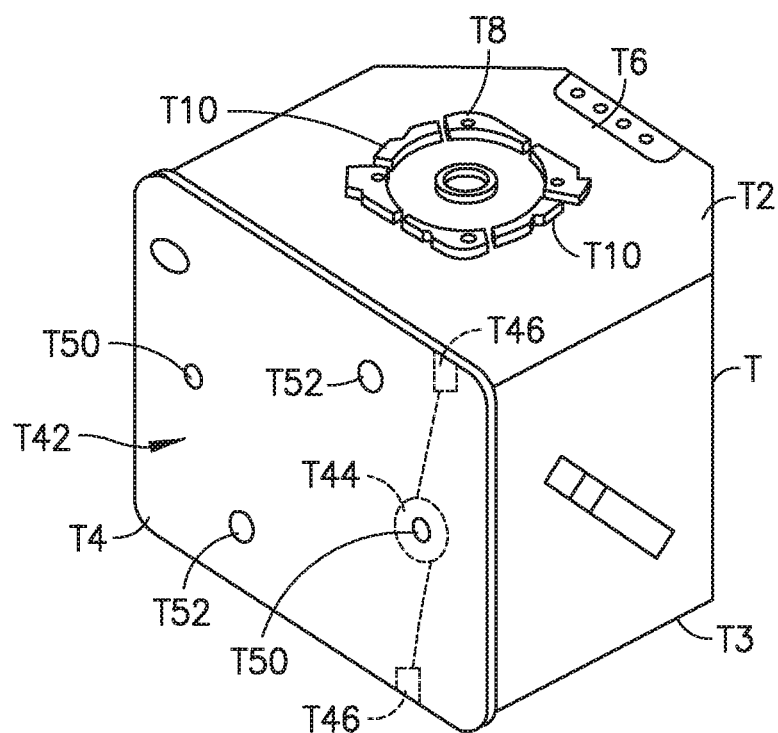
FIGS. 6A and 6B are schematic illustrations of a substrate transport container.
Figure 6B:
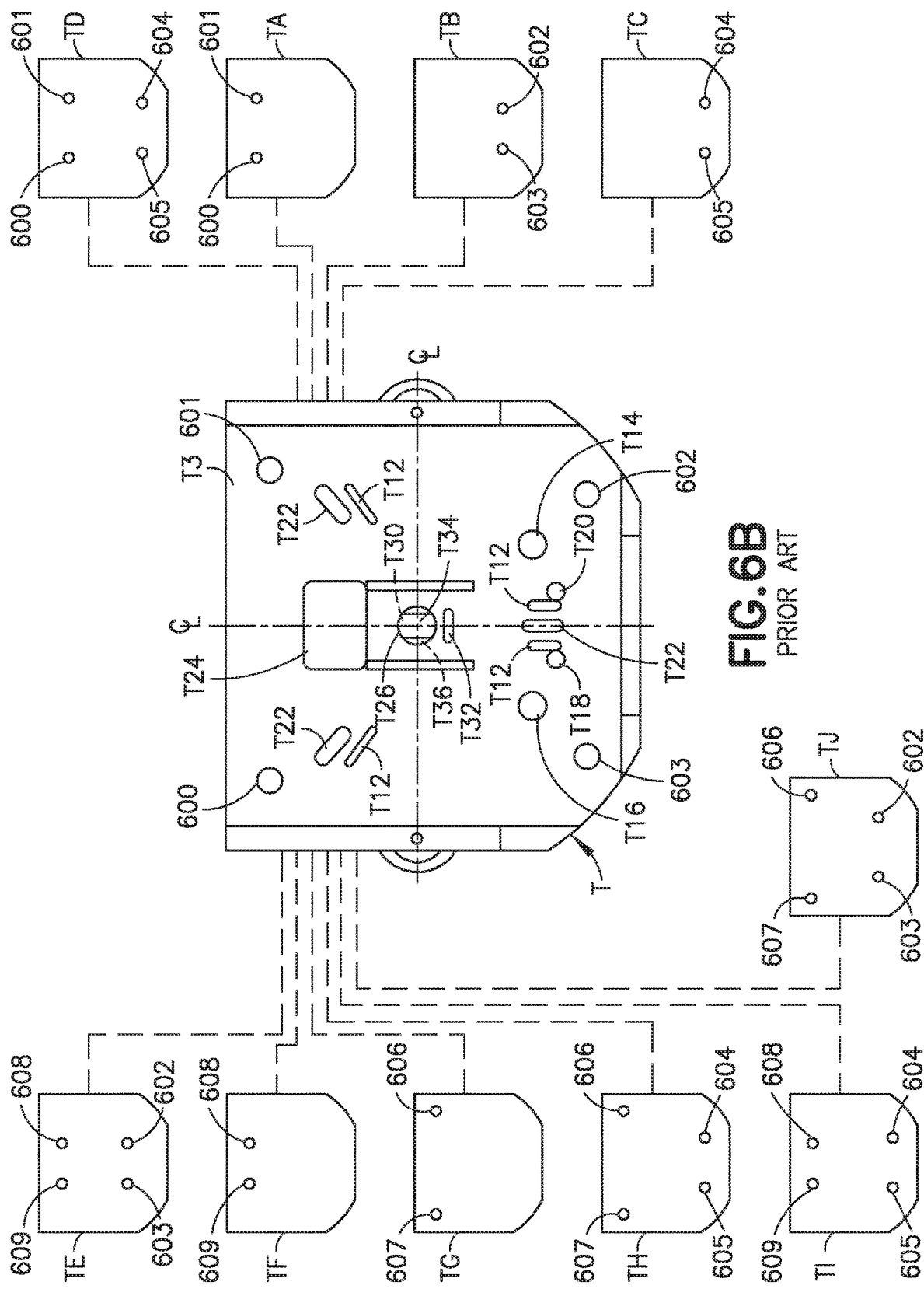

Referring again to FIGS. 1A-3, the transport container holding area 28, of the load port module 24 may have both an upper 36 and lower 34 support station, each support station 36, 34 may be capable of holding or supporting a transport container T as shown in FIG. 1A. In this aspect, the lower station 34 is located generally under the upper station 36. The lower station 34 may comprise opposing members 34L (only one of which is shown in FIG. 3) capable of conformally engaging structure of the transport container T so that when placed in the lower station 34, the transport container is supported from members 34L. FIGS. 6A-6B respectively are front and bottom perspective views of an exemplary substrate transport container T. The container T in FIGS. 6A-6B is shown as having FOUP type configuration. In alternate embodiments, the substrate container may have any other desired configuration as seen best in FIG. 6A, transport container T generally has a casing T2 and a casing cover or door T4 removably connected to the casing. The casing T4 has an upper surface T6 with a fixture T8 projecting therefrom. The fixture T8 may include lateral flanges or outwardly projecting seating surfaces T10 that are offset a distance from the upper surface T6 of the casing. The seating surfaces T10 may be part of a handling flange conforming to SEMI; E47.1-1001. The seating surfaces T10 may serve for engaging the coupling portion (not shown) of a container transporter of an automated material handling system and thereby supporting the container from the transporter. Referring again to FIGS. 2-3, the support members 34L of the lower station 34 on the load port module holding area 28, are shown in this aspect as having an angle or general L shaped configuration. The members 34L have inward projecting flanges 34F as shown. In alternate embodiments, the support members 34L may have any other suitable shape. The support members 34L may be for example metal, plastic, or any other suitable material, and may be connected as shown in FIG. 3 to support structure 296 of the load port frame 29. The inwardly pointing flanges 34F are sized to be admitted between seating surface T10 (see FIG. 6A) on the transport container and upper surface T6 of the container. The flanges 34F of the opposing members 34L are sufficiently separated to allow insertion of support fixture T8 of the container T between the flanges with the outward projecting seating surfaces T10 overhanging (at least partially) the corresponding flanges 34F. Accordingly, when loaded into the lower station 34, the transport container T is supported by seating surfaces T10 seated on the flanges 34F.

In this aspect, the transport container T may be manually positioned by an operator on the lower station 34, by inserting the container (in the direction indicated by arrow I in FIG. 2) so that fixture T8 is moved in between flanges 34F. In alternate embodiments, the support members of the lower support station may have any other desired orientation to allow the transport container to be positioned from any other desired direction. Removal of the transport container T from the lower station 34 may be accomplished in a substantially reverse manner, with the user manually withdrawing the container in the opposite direction from installation. The lower support station 34 provides the load port module with another container stowage location where the user may place a transport container T in the case when the upper support station 36 is either occupied by another transport container or is in some state (such as testing) preventing placement of the transport container T on the upper station. As noted before, in alternate embodiments, the load port module may not have a lower support station in the transport container holding area 28.

Referring now again to FIG. 2, the upper support station 36 of the transport container holding area 28 on load port module 24, generally comprises a base support or shelf 50 and a carriage or shuttle 52 movably mounted on the shelf 50. A shuttle drive system 54 operably connects the shuttle 52 to the shelf 50 and is capable of moving the shuttle 52 on the shelf 50. The drive system 54 moves the shuttle (in the direction indicated by arrow M in FIG. 2) between a first position and a second position. As will be described further below, the shuttle 52 is configured to allow placement of a transport container T thereon. The first shuttle position may be disposed such that the transport container T may be positioned automatically on (or picked off) the carriage by the automated material handling system (not shown). The second position to which shuttle 52 may be moved, is located so that the transport container T on the shuttle may be docked to the door 30D (see FIG. 1A) as will be described further below. When the shuttle is in this second position, the transport container T thereon is located in what will be referred to for convenience purposes as the docked location. The controller 400 is communicably connected to sensors on the shuttle and the drive system as will be described further below.

As seen in FIG. 1A, the transport container T is placed on the shuttle 52 with the bottom surface of the container seated on the shuttle. The shuttle 52 is hence configured, as will be described further below to conformally engage the bottom of the transport container T. FIG. 6B is a bottom view illustrating features of the bottom T3 of the exemplary substrate transport container T. In this aspect, the bottom T3 of the transport container has features generally conforming to specification in SEMI E47.1. In alternate embodiments, the bottom of the substrate transport container may have any other desired features. In this case bottom T3 generally includes container sensing pads T12, one each of a front end of line (FEOL) and back end of line (BEOL) information pads T14, T16, a container capacity (i.e. number of substrate holding locations) information pad T18 and a box or cassette information pad T20. The container bottom T3 may further include slots T22 for engagement by locating/kinematic coupling pins 66 on the shuttle 52. As may be realized, the kinematic coupling pins 66 define a deterministic positioning datum between the transport container holding area of the load port module 24 peripherals and the container features engaged thereby as will be described further below. A first recess T24 into the bottom surface is provided as a first retention feature. The bottom of the container also has a second retention feature T26 formed therein. The second retention feature generally comprises a generally circular recess T30 formed into the bottom that has an outer aperture T32 with substantially squared off edges T34 (forming engagement lips T36).

Figure 4A:
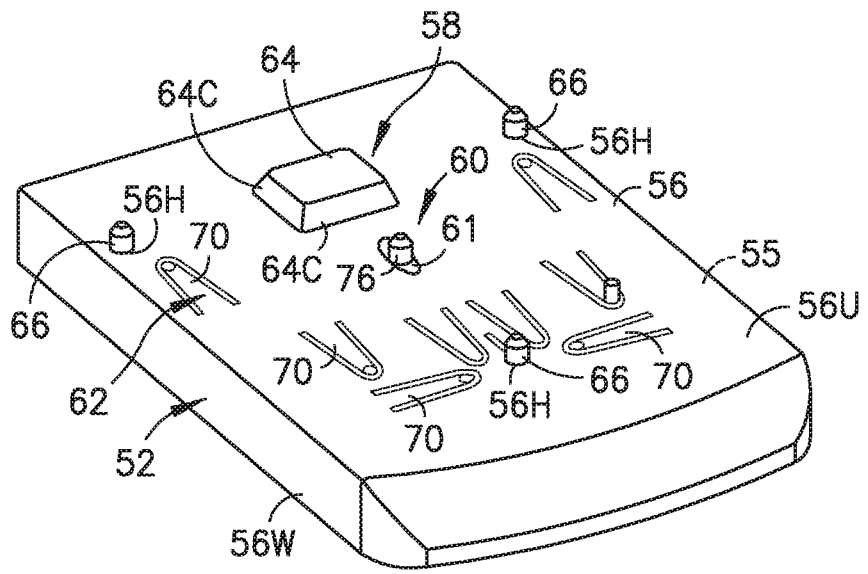
FIGS. 4A-4D are schematic illustrations of a portion of the load port module of FIG. 2 in accordance with aspects of the present disclosure.
Figure 4B:
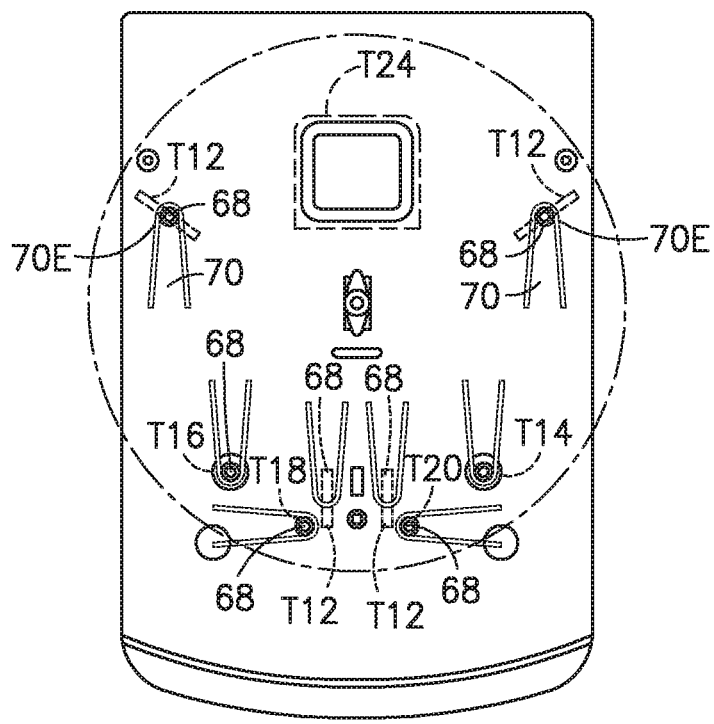
Figure 4C:
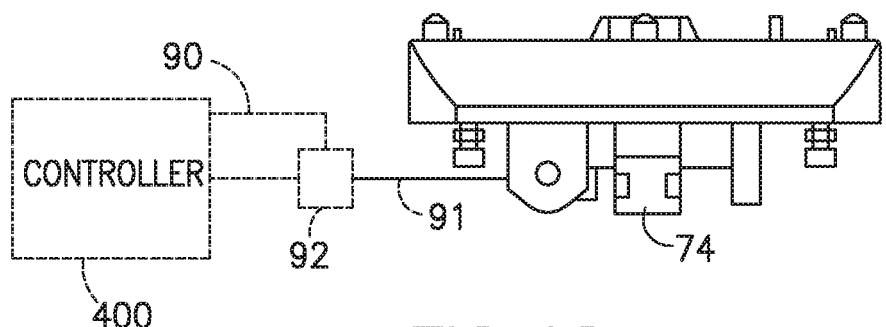
Figure 4D:
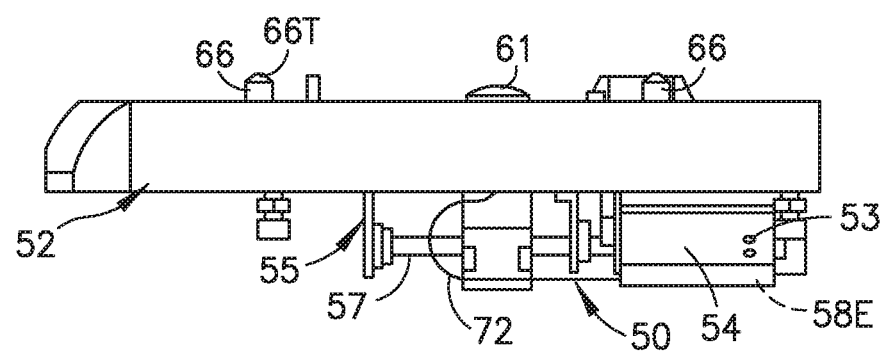
Figure 5:
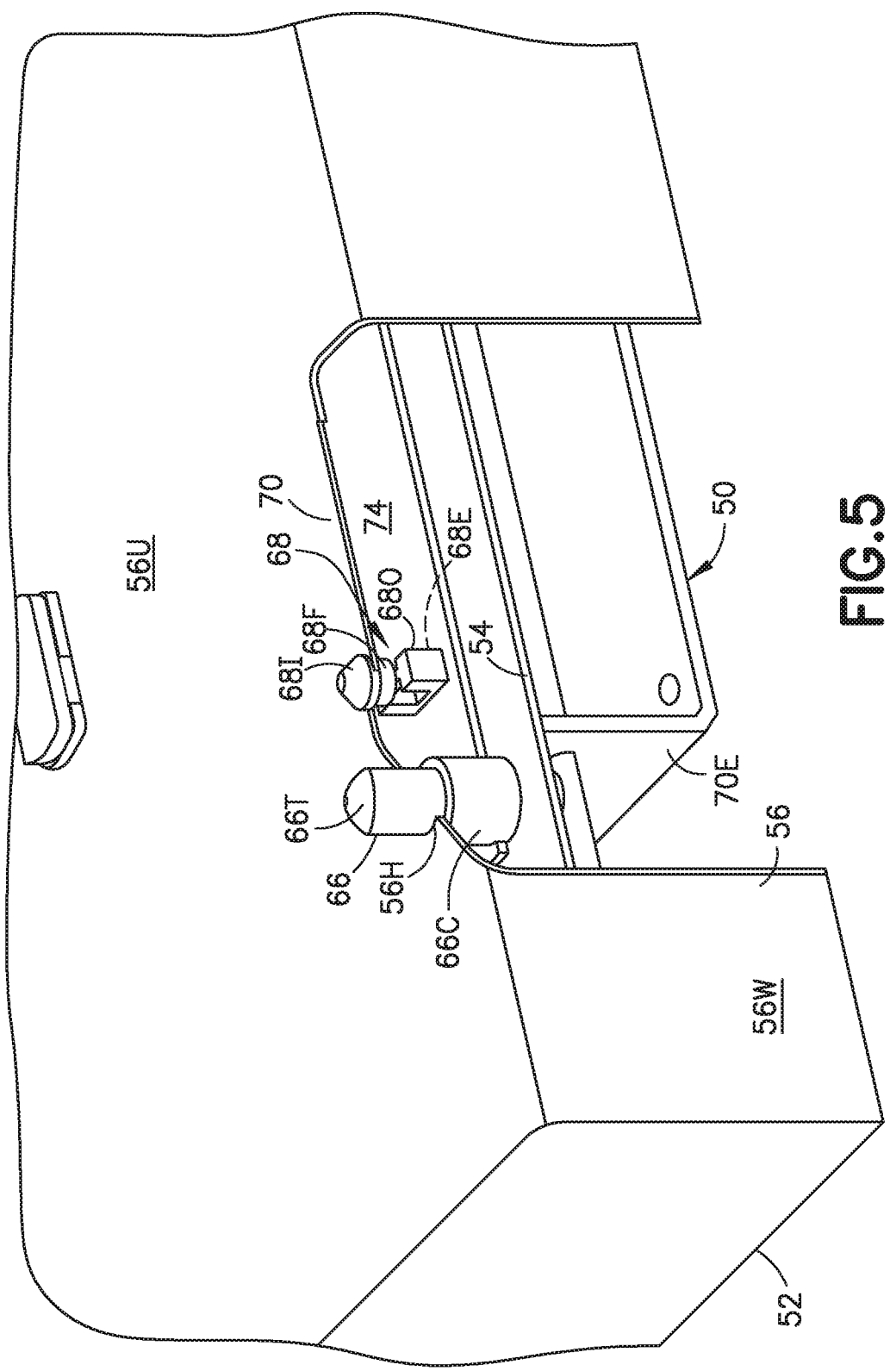
FIG. 5 is a schematic illustration of a portion of the load port module of FIG. 2 in accordance with aspects of the present disclosure.

FIGS. 4A-4D, are respectively a schematic perspective, a top plan, front and side elevation views of the shuttle 52 and part of the support shelf structure on which the shuttle sits (the support shelf structure 50 is visible only in FIGS. 4C-4D). The shuttle 52 generally comprises a chassis or frame 55 and a cover 56 positioned over the chassis. The shuttle 52 may also generally have locating features 58 for helping locate the container T properly onto the shuttle, coupling features 60 for positive coupling of the seated container T to the shuttle, and detection system 62 for detecting the presence and accurate placement of the container T on the shuttle 52. Referring now also to FIG. 5, showing a partial cutaway view of the shuttle 52, chassis 55 may have any suitable shape, and may be made from any suitable material, able to support the static and dynamic loads associated with placement and removal of the transport container T on the shuttle as well as movement of the container and shuttle between the first and second positions. The chassis may have a motion system (not shown) such as rollers or slides allowing free movement of the shuttle 52 (in the direction indicated by arrow M in FIG. 2) relative to the support shelf 50 of the load port module frame. Support shelf 50, shown partially in FIG. 5, (see also FIG. 2) may be formed by support structure 296 of frame 29 (see FIG. 3). The shelf 50 may include tracks or rails (not shown), formed on or depending from frame structure 296 (for example the top plate 296H or side plates 296E) on which the motion system of the chassis 55 rides. The container locating features 58, coupling features 60, detection system 62 and cover 56 are mounted to the chassis 55.

As seen best in FIGS. 4A-4B, in this aspect container locating features 58 on shuttle 52 may include a projecting engagement member 64. In this aspect, the engagement member 64 may have a general frusto-pyramidal shape, generally conformal to the shape of locating recess T24 (see FIG. 6B) in the bottom T3 of the container. The engagement member 64, may be anchored to the chassis 55, and project through a suitable opening in the cover 56 sufficiently above the upper surface 56U of the cover to engage the locating recess T24 in the container when the container T is seated on the shuttle 52. The engagement member 64 may have cam surfaces 64C for cooperating with the edges of the container locating feature in order to aid proper automatic positioning of the container T onto the shuttle. In alternate embodiments, the shuttle may not have an engagement member like member 64. In this aspect, the shuttle 52 may have locating posts (also referred to as kinematic coupling pins) 66. Posts may serve both as locating features aiding correct positioning of the container T on the shuttle 52, as well as to provide a means of positive coupling (i.e. Kinematic coupling) the container T to the shuttle 52. As may be realized from FIGS. 4B and 6B, the posts 66 are positioned on the shuttle 52 to cooperate with slots T22 in the container bottom T3. Posts 66, which may be formed from any suitable material, such as metal or plastic, may be anchored directly to the chassis 54 of the shuttle as shown in FIG. 5. The posts 66 may project through (suitable holes in) the cover 56 to engage the bottom of the container in slots T22 (see FIG. 6B). In this aspect, the posts 66 may define the supporting plane for the transport container T on the shuttle. The ends or tips 66T of the posts may have a generally conical or rounded shape as seen in FIGS. 4D and 5. This provides the desired three contact points between the shuttle 52 and bottom of the container for precise and repeatable definition of the support plane for the container on the shuttle. As may be realized, posts 66 support the weight of the container T, and hence have a configuration, such as radial flanges shown in FIG. 5, to distribute the container weight to the chassis. The conical tops 66T of the posts 66 may also operate as caming surfaces against the inclined sides of slots T22 in the container bottom mechanically guiding the container along the support plane until the desired position (effected by the geometry of the slots T22 and the tops 66T of posts 66) of the container on the shuttle is established.

The detection system 62 of the shuttle 52 generally comprises a number of switches 68 distributed over the area of the shuttle. The switches 68 may be located on the shuttle 52 to cooperate with the container sensing pads T12, the FEOL and BEOL info pads T14, T16, the container capacity and cassette information pads T18, T20 on the bottom of the container. FIG. 4B illustrates the positions of the pads T12-T20 on the bottom of the container T overlaid on the cover 56 and switches 68 of the shuttle 52. In this aspect, the switches 68 are generally of the same type and similar to each other and will be described below with reference to a representative switch. In alternate embodiments, different kinds of switches may be used in different locations on the shuttle corresponding to the different types of information capable of being relayed to the given switch by the different information pads T16-T20 of the container T. The architecture of representative switch 68 is seen best in FIG. 5. In this aspect, switch 68 may be an electro-optic switch generally comprising a base or sensor portion 68O and an actuation portion 68I. Actuation portion 68I is spring loaded as will be described further below, and is actuated by contact with a corresponding pad on the container bottom. The sensor portion 68O detects actuation of the actuation portion sending a signal to the control system. As seen in FIG. 5, sensor portion 68O may be mounted on a PCB 74 positioned on the chassis 55 of the shuttle. PCB 74 may have traces 68E formed therein for both power and signal transmission. The traces 68E may be terminated to suitable surface contacts (not shown) to which contact terminals of electronic components may be connected as desired (using any suitable means for mounting electronic components onto PCB's including flush wave soldering). The contact terminals (both power and signal) of the sensor portion 68O may be connected to the traces 68E in the PCB 74 in a similar manner. Mounting electronic components, such as the sensor portions 68O of the switches 68 to a PCB (such as PCB 74) with integral traces, serves to eliminate the individual conductors, as well as their costly and time consuming installation on the chassis, that would otherwise be used to connect the components to the power supply and control system. The traces 68E in the PCB may extend to a terminal connector (not shown) to which, for example, the connectorized end of a flexible wire harness 72 (see also FIG. 4D) may be mated. As may be realized the wire harness may link the traces 68E in the PCB 74, and hence the electronic components such as the sensor portions of the detector switches 68 to the control system 400 (see FIG. 2) and power supply (not shown). The sensor portion 68O may have for example a suitable light source such as an LED and a photo detector such as a photo cell. In the unactivated state of the switch the light source may, for example, illuminate the photo cell which causes the sensor portion 68O to send a signal (via traces 68E) to the control system 400 that is interpreted by the control system as being the inactivated state of the switch 68. Upon obstruction of the light source, such as by some portion of the actuation portion 68I of the switch, the signal from the photo cell changes which in turn is read by the control system as the switch now being in the actuated state. In alternate embodiments, the sensor portion 68O may be configured so the light source is obstructed when the switch 68 is in the inactivated state, and illuminating the photo detector when in the activated state.

As seen in FIG. 5, the actuation portion 68I of the switch 68 is integrated into the cover 56 of the shuttle 52. The spring biasing the actuation portion 68I is in this aspect formed by a portion of the cover 56. The cover 56 of the shuttle 52 may be made for example of plastic, or sheet metal or any other suitable material. In this aspect, cover 56 may be a one-piece member (i.e. of unitary construction). In the case the cover 56 is plastic, it may be formed for example by injection molding or any other suitable process. As seen in FIGS. 4A-4D, the cover 56 in this aspect may have a general hexahedron shape, with an upper surface 56U and perimeter walls 56W projecting from the upper surface. In alternate embodiments, the shuttle cover may have any other suitable shape. As seen best in FIG. 2, when mounted on the chassis 55, the cover 56 serves to substantially enclose the chassis within, with but a minor gap being provided between the bottom edge of the cover perimeter walls 56W and shelf 50 to facilitate free relative movement of the shuttle while minimizing entry of dust or other particulates into the shuttle systems. The top surface 56U of the cover has through holes 56H formed therein as shown in FIG. 4A. Holes 56H allow posts 66 to extend through the cover 56 as seen best in FIG. 5. Holes 56H in this aspect also serve to position the cover 56 onto the shuttle chassis 55 as also shown in FIG. 5 (the clearance between the hole edge and corresponding post 66 is sufficiently small, so that the post 66 provides accurate positioning of the cover 56 relative to chassis 55. Further, in this aspect the rims of the holes 56H are seated on collars 66C of the posts 66, as shown in FIG. 5, thereby supporting the cover 56 from the posts. In alternate embodiments, the cover may have any other desired mounting system for attaching the cover and chassis. As seen in FIGS. 4A-4B, the upper surface 56U of the cover has a number of resiliently flexible tabs or fingers 70 formed therein. The tabs 70 may be formed by any suitable means such as cutting the top surface 56U of the cover 56. The number of tabs 70 may coincide with the number of switches 68 of detection system 62. In this aspect, there are eight tabs 70 formed into the upper surface of the cover. In alternate embodiments, the cover may have any other desired number of flexible tabs formed therein. In other alternate embodiments, flexible tabs may be formed in any other desired surface of the cover. In the aspect shown in FIGS. 4A-4B, the tabs 70 are substantially similar to each other, and hence, tabs 70 may have similar resiliently flexible characteristics. In alternate embodiments, the shape (i.e. length, cross-section) of different tabs may vary to provide the different tabs with different flexibility characteristics. In this aspect, the tips 70E of the tabs 70 are located on the cover so that when the cover is mounted to the chassis each tip 70E is positioned substantially over the sensor portion 68O of the corresponding switch 68 (see FIG. 5). In alternate embodiments, the tabs may be placed so that any other desired portion of the tab (i.e. the tab mid-section) is positioned over the sensor portion of the corresponding switch. The tab orientation on the upper surface 56U of the cover may be otherwise selected as desired to provide the tab with the flexibility of an unrestrained cantilever. The orientations of tabs 70 shown in FIGS. 4A-4B are merely exemplary, and the tabs may have any other desired orientation.

As seen best in FIG. 5, in this aspect the actuation portion 68I of the switch 68 is mounted or located on the tip 70E of the corresponding tab 70. The actuation portion 68I may be of unitary construction with the tab 70 (formed for example during the molding process of the cover upper surface) or may be mounted to the tab 70 with suitable bonding means such as adhesive. The actuation portion 68I projects sufficiently from the upper surface 56U of the cover to come in contact with the corresponding pads T12-T20 of the container placed on posts 66, and by this contact generate sufficient deflection of the tab 70 to move the interrupter flag portion 68F of the actuation portion to (e.g. obstruct the light source and) cause activation of the switch 68. When the container T is removed from the shuttle 52, the flexible tab 70 resiles back to the undeflected position returning the switch to the inactivated state. As may be realized, if the container T is not properly placed on the shuttle, there may be some misalignment between pads T12-T20 of the container and at least some of the actuation portions 68I of the switches 68 so that at least some of the switches do not activate. The signal combination of some switches activated and others not, may be interpreted by the control system 400 as an indication of improper placement of the container T on the shuttle. The control system programming may then prevent motion of the shuttle 52 and command corrective action to correct placement or removal of the container from the shuttle.

As noted before, shuttle 52 may have a coupling feature 60 for positive coupling of the transport container T to the shuttle. As also noted before, posts 66 serve as kinematic coupling means between the shuttle and container during shuttle motion. In this aspect, the shuttle coupling feature 60 may also include a container clamping system 61 substantially similar to that described in U.S. Pat. No. 8,821,099 previously incorporated by reference herein in its entirety.

Referring now again to FIGS. 2 and 4A-4D, shuttle 52 may be moved (in the direction indicated by arrow M in FIG. 2) between the first or loading position and the docked position of the shuttle by drive system 54. As seen best in FIGS. 4C-4D, the shuttle drive system 54 in this aspect generally comprises an electric motor 53 driving a lead screw 57. In alternate embodiments, the shuttle may have any suitable type of drive system such as a pneumatic or hydraulic drive system. The electric motor 53 in this aspect may be any suitable type of motor such as an A.C. or D.C. motor, a stepper motor or servo motor. Motor 53 may be fixedly mounted to the shelf structure 50. The lead screw 57 is connected to the output shaft of the motor. The motor may be capable of rotating the lead screw both clockwise and counterclockwise. The lead screw 57 is also drivingly engaged to the chassis 55 of the shuttle 52 which rides along linear bearing(s) 283 (FIG. 3). Engagement between the lead screw and chassis may be provided by any suitable means such as for example a threaded bushing fixed to the chassis and threadably engaged by the lead screw. Rotation of the lead screw 57 by motor 53 results in axial motion of the bushing over the lead screw, and hence of the chassis and shuttle 52 relative to the shelf 50 to which the motor 53 is fixed. As seen in FIG. 4C the motor 53 is communicably connected to the controller 400 by a suitable circuit 91. The controller 400 may provide both command signals and power (from a suitable power supply) to motor 53 over circuit 91. The motor 54 may include a motor encoder 58E (see FIG. 4D) for sending position indication data to the controller. The controller 400 may be capable of processing the motor encoder data to identify the position of the shuttle on the load port. In alternate embodiments, a linear encoder may be mounted between the shuttle and support shelf to identify the shuttle position during movement. As seen in FIG. 4C, in this aspect circuit 91 may also include a pinch protection circuit 90 capable of detecting an obstruction to shuttle motion. The pinch protection circuit may include a current sensor 92, of any suitable type, and of desired sensitivity capable of measuring current changes to motor 53. The current sensor 92 is configured as desired to monitor the current supplied to motor 53 through circuit 91. Measurement signals from the sensor 92 are transmitted by circuit 90 to the controller 400. The pinch protection circuit 90 may be a closed loop or open loop system as desired. As may be realized, when the shuttle is being advanced by the drive motor 53 and encounters an obstruction, the current supplied the motor (via circuit 91) increases in general proportion to the level of resistance to shuttle motion provided by the obstruction. The "excess" current is detected by sensor 92 and the information is relayed to the controller 400 via circuit 90. The sensor 92 may be capable of sending raw or unprocessed sensor data to the controller 400. The controller may be programmed (such as a suitable algorithm) to process the data from the sensor to identify, from noise, when excess current, of sufficient level and of sufficient duration to indicate an obstruction, is being supplied to the motor 53. Controller 400 has an auto-reverse program 402 (see FIG. 1A) wherein upon identification of the excess current (and hence of the obstruction to shuttle motion) the controller sends a command signal to motor 53 stopping the previously commanded operation and reversing the motor direction. The rotation of the lead screw 57 effecting movement of the shuttle 52 is thus also reversed thereby causing the movement of the shuttle to be reversed away from the obstruction. The shuttle may be reversed a predetermined distance established from encoder 53E information. In alternate embodiments, the current sensor 92 may be programmable to select desired set points for detecting the excess current. In this case, the current sensor may send a suitable signal to the control upon detection of an excess current having a level and duration exceeding the programmed set points. Upon receiving the signal from the current sensor, the controller accesses the auto-reverse program 402 in the controller memory. This provides superior obstruction detection and recovery system at a lower cost than conventional systems that employ a deflectable (i.e. pinch) bar.

Referring now again to FIG. 2, the load port module in the aspect shown may have transport container advance detection system 110 (depicted schematically in FIG. 2). The container advance detection system 110 is a non-contact system to detect a feature of a container T mounted to and being advanced by the shuttle 52 and effect stopping the shuttle so that when the container is in the docked position the front face of the container is in a desired repeatable location regardless of the tolerance variations between different containers. It is desirable to stop the load port shuttle advance motion so that there is a minimum clearance between the container and the load port frame 29 without actual contact between them. Since container dimensions will vary, especially between manufactures, in conventional systems the shuttle movement is generally adjusted for "worst case", allowing an overly large clearance in most instances. The container advance detection system 110 of the load port module 24 overcomes the problems of conventional systems allowing different containers to be stopped with the front face at location L1 providing minimum clearance. The detection system 110 in this aspect has a "thru beam" sensor configuration with an emitter or source of radiating energy and a detector for detecting the radiating energy from the emitter. For example, in this aspect the detection system 110 may have a light source 112, such as a LED or laser diode on the terminal end of an optical fiber connected to a suitable remote light source. The system 110 may also have a suitable light sensing portion 114 such as a photo cell for sensing the light beam from the source 112. As seen in FIG. 2 the light source 112 and sensor 114 are positioned on opposite sides of the shuttle 52 and at a desired height so that the container T mounted and transported by the shuttle 52 will break the light beam B emitted by the source 112 and illuminating at least the sensing part of sensor 114. Though not shown in FIG. 2, the light source 112 and sensor 114 may be housed in suitable covers for contact and particulate protection and to prevent inadvertent interruption of the beam by objects other than the container transported by shuttle 52. As seen in FIG. 2, the sensors 112, 114 are positioned at an offset distance in the direction of shuttle travel (indicated by arrow M in FIG. 2) so that the light beam B is spaced a desired distance d from the location L1 of the front face of the container T when brought to the docked position by the shuttle. As may be realized, the front face of the container T advanced by the shuttle, breaks the beam B when at distance d from the docked position location L1. The controller 400 is programmed with distance d. The controller 400 is also programmed with an algorithm (program module 401 in FIG. 1A) that uses shuttle movement information, such as may be provided to the controller by motor encoder 53E (see also FIG. 4D), and the distance d to determine when shuttle advance movement is to be stopped so that the front face of the container T on the shuttle is at location L1. Hence, when the front face of the advancing container T breaks beam B, the sensor 114 sends a suitable signal to the controller 400 informing the controller of the detection of the container front face. The controller 400 then may determine when to command the shuttle advance to stop as noted above, and sends the command to the shuttle drive section 54 at the correct time. In this manner, each container T transported by the shuttle is appropriately positioned in its docked location to have the container front face at location L1 regardless of the dimensional variation between containers.

With the container T in the docked position, as shown in FIG. 1A, the door T4 of the container may be engaged by the door 30D of the load port module access port 30P. The door T4 in the front face of the container T is schematically illustrated in FIG. 6A. The door T4 may include latch systems T40, T42 that when engaged retain the door T4 in the container box. Examples of the latch systems for the container door are disclosed in U.S. Pat. No. 5,772,386, issued Jun. 30, 1998 and incorporated by reference herein in its entirety. The door latch systems T40, T42 may include a pivotable hub T44, to which the latch tabs T46 may be articulately linked. Rotation of the hub T44 causes actuation of the latch tabs T46 to engage and disengage the container housing. The latch hub T44 is accessible through latch key access holes T50 in the door T4. The container door T4 may also have locator pin holes T52 as shown in FIG. 6A. Referring again to FIG. 2, the access port door 30D of the load port module has locator pins 120 and latch keys 122 in a complementary or matching configuration to the locator pin holes T52 and latch key access holes T50 in the door T4 of the container. The locator pins 120 and latch keys 122 in port door 30D may be similar to locator pins and latch keys in U.S. Pat. No. 5,772,386 (previously incorporated by referenced herein). The latch keys 122 of the port door 30D conform to the shape of the key access holes T50 in the container door and key hole in the hub T44 of the latching system. When the port door 30D engages the container door T4, the latch keys 122 on the access door 30D enter through key access holes T50 into the key holes formed in the hub T44 of the container. Rotation of the latch keys 122 causes rotation of the hubs T44 and actuation of the latch systems to engage/disengage the latch tabs thereby locking or unlocking the container door T4 from the container. The latch keys 122 are rotatably mounted in the access door structure and are operated in a manner substantially similar to that described in U.S. patent application Ser. No. 8,821, 099, the disclosure of which was previously incorporated herein by reference in its entirety.

Figure 7A:
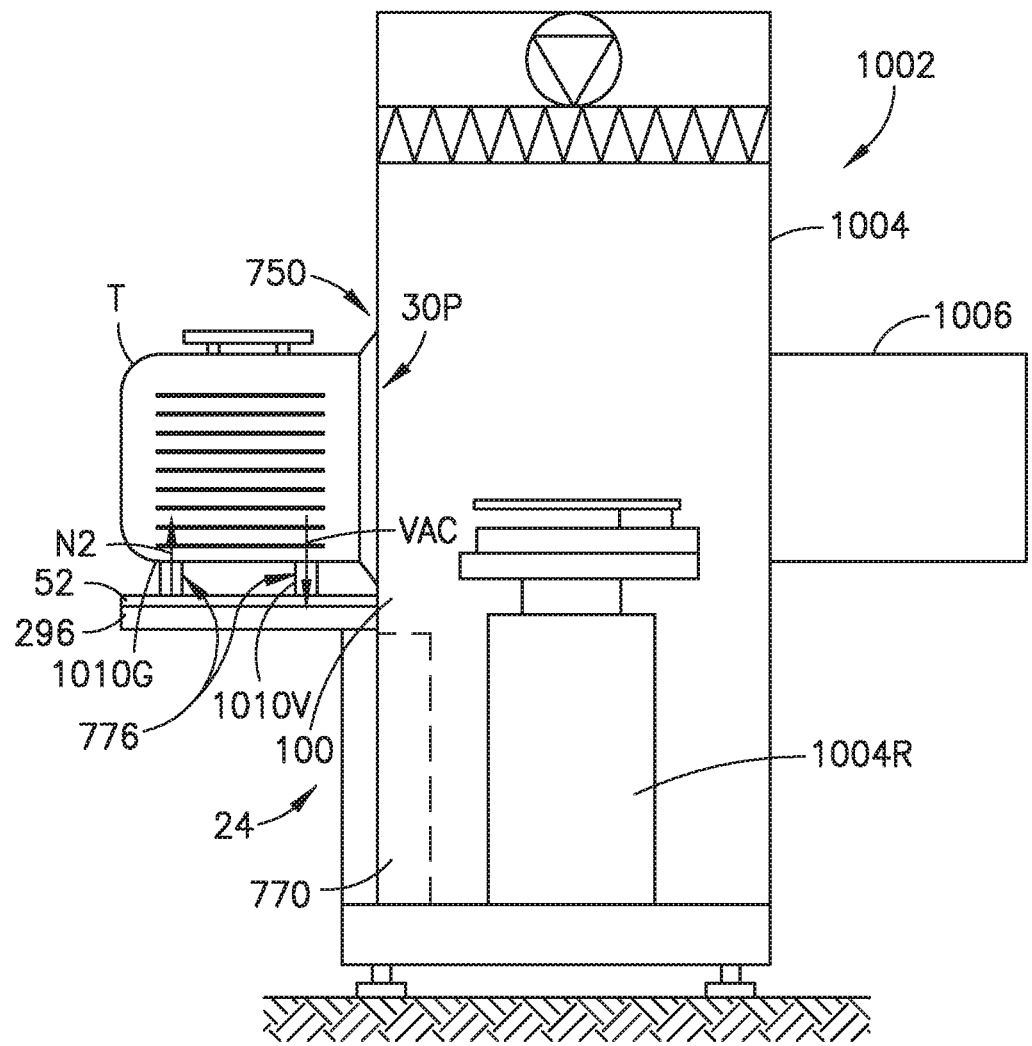
FIGS. 7A and 7B are schematic illustrations of a portion of the substrate processing apparatus of any of FIGS. 1A-1C in accordance with aspects of the present disclosure.
Figure 7B:
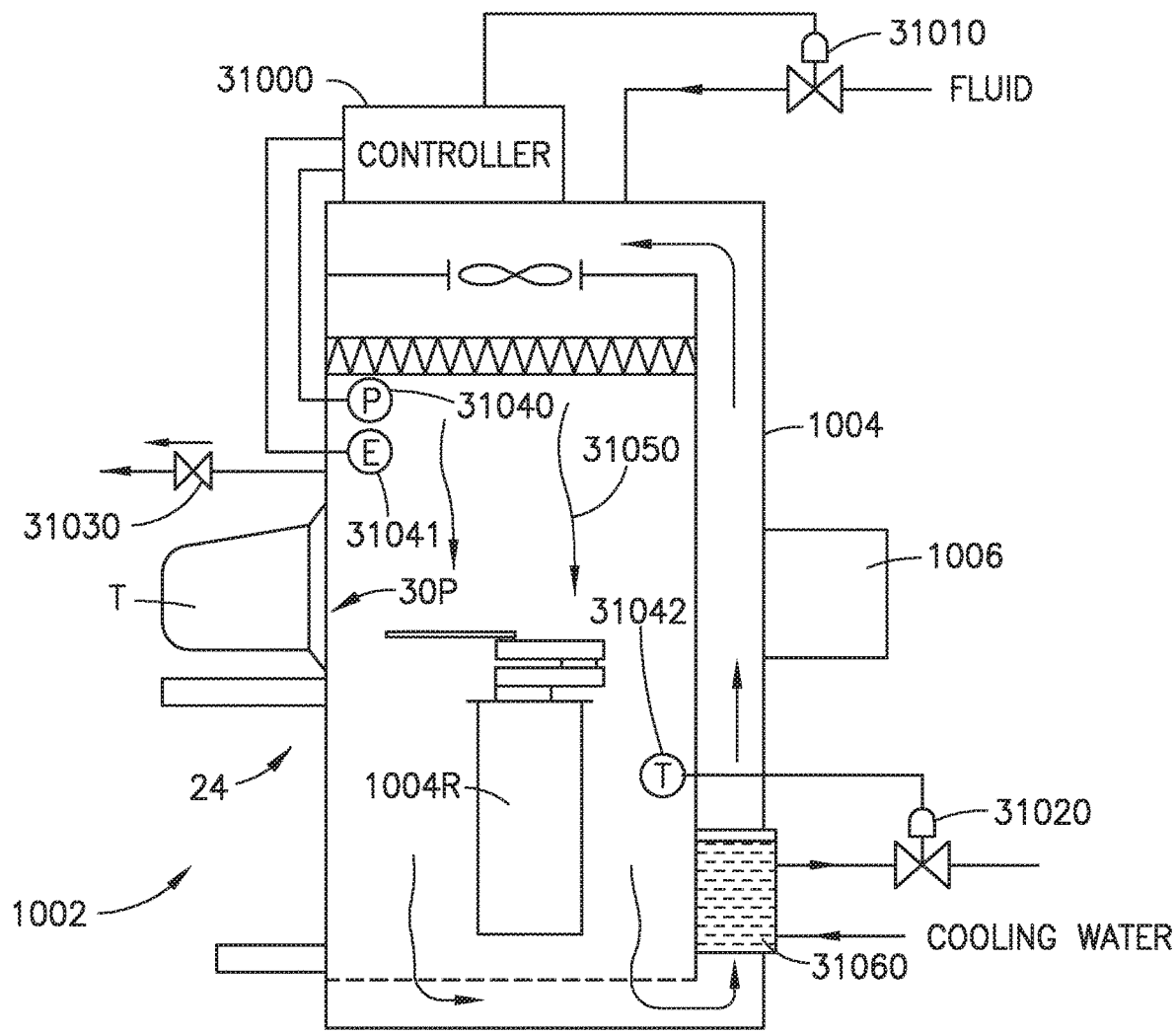

Referring now to FIGS. 7A and 7B, there is shown schematic elevation views of a substrate processing apparatus or tool 1002 and container(s) T connected thereto in accordance with another exemplary embodiment. The processing apparatus 1002, in the exemplary embodiment shown in FIG. 7A, is generally similar to the substrate processing tools illustrated in FIGS. 1A, 1B, and 1C. The process tool 1002 may generally have a process section 1006 and EFEM 1004 (continuing, for explanation purposes only, with the reference convention in which wafers may be considered to be loaded into the tool from the front). In the exemplary embodiment, the process section 1006 and EFEM 1004 may share a common controlled environment or atmosphere (e.g. inert gas (N2), (Ar), or very clean dry air). The process section 1006, is shown schematically, and may include one or more process sections or module(s) connected to the EFEM 1004 (the arrangement shown in FIG. 7A is merely exemplary and the EFEM and process section module(s) may be connected to each other in any desired arrangement in alternate embodiments). The process section(s) or module(s) 1006 may be capable of being isolated from the EFEM 1004, such as with a closable opening (e.g. a gate valve). Accordingly, the process section may also be provided with a different process atmosphere than the EFEM atmosphere. In alternate embodiments, the process section 1006 may include a load lock allowing process modules with dissimilar atmospheres or holding a vacuum to be connected to the EFEM as will be described further below.

The EFEM 1004 in the exemplary embodiment shown in FIG. 7A, may be similar to those described above except as otherwise noted. The EFEM 1004 may include suitable environmental controls to maintain a desired controlled environment or atmosphere in the EFEM when substrate are transported to and from the process section 1006. For example, the EFEM 1004 may include a controller 31000 (which may be substantially similar to controller 400 described above), one or more fluid control valves 31010, 31020, a pressure relief or check valve 31030 and sensors, such as for example, pressure sensor 31040, contamination sensor 31041 and temperature sensor 31042. The controller may be configured to adjust or regulate attributes such as the temperature pressure and rate of gas flow 31050 of the controlled environment within the EFEM (and process section 1006). For example, the controller 31000 may receive signals from the pressure sensor 31040, temperature sensor 31042 and environmental contamination sensor 31041. Depending on the environmental information in those signals the controller may release or increase pressure within the EFEM, increase or reduce air flow 31050 within the EFEM by actuating the appropriate valves 31010, 31030. The controller 31000 may also be configured to increase or decrease the temperature of the gas within the EFEM (e.g. via adjusting coolant flow through radiator 31060) based on temperature readings provided by temperature sensor 31042. As may be realized, while the controller 31000 and associated valves and sensors are described with respect to FIGS.

7A and 7B, the controller 31000 may be used to control the environment(s) of the other embodiments disclosed herein.

The EFEM 1004 may include a substrate transport apparatus or robot 1004R (the robot, as may be realized, may be of any desired type) capable of holding and transporting substrates. Similar to that described above, the EFEM 1004 may include the load port 24 (as described herein) for interfacing one or more container(s) T to the tool 1002, and allowing substrates to be loaded and unloaded to and from the tool 1002. The load port 24, of the EFEM 1004, and a corresponding complementing interface portion of the container(s) T (as described herein), may be configured to enable loading and unloading of substrates between container and EFEM without degradation of the controlled environment in the EFEM 1004 and process section 1006. The EFEM load port 24, and complementing interface portion of the container T, which may be collectively referred to as the container to EFEM interface, may be arranged so that container(s) T interfaced to the EFEM, are integrated into the tool. By way of example, the container(s) T so integrated via the load port 24, may define a chamber(s) sharing the same controlled atmosphere as the EFEM, and thus capable of holding substrates in the same controlled atmosphere as the EFEM, so that substrates may be transported directly from container T to process section or process module by the EFEM transport robot 1004R. Similar to the aspects of the present disclosure described before, the container to EFEM interface in the exemplary embodiment shown in FIG. 7A, defines what may be referred to before as a clean tunnel (with substantially the same cleanliness as throughout the EFEM and process section) from within the container chamber, through the interface into the EFEM, and throughout the process section. The clean tunnel may be closed (such as when the container(s) is removed from the load port), and opened freely without degradation to the clean tunnel. In the aspect shown in FIG. 7A, the container to EFEM interface may also be arranged to enable direct integration of the container T with the tool (substantially as described above) independent of container environment prior to interface, in a manner substantially similar to that described in U.S. Pat. No. 9,105,673 entitled "Side Opening Unified Pod" and issued on Aug. 11, 2015, the disclosure of which is incorporated herein by reference in its entirety. Thus, in the aspect illustrated in FIG. 7A, the container(s) T may be interfaced with and integrated directly to process tools having different or dissimilar environments (e.g. clean air to inert gas environment, or clean air to vacuum) and then transport directly between tools with different dissimilar environment and interfaced and integrated again with the tools as will be described further below. Accordingly, a substrate(s) at one tool with a controlled environment may be transferred directly with the EFEM robot 1004R, from the process section (similar to process section 1006) through the clean tunnel into the container(s) T, the container(s) T transported directly and interfaced to the EFEM (similar to EFEM 1004) of another tool possibly with a dissimilar/different controlled environment, and the substrate(s) transferred directly with the EFEM robot through the clean tunnel now defined in the other tool to the process section without degradation of the controlled environment in the other process tool. In effect, the container to EFEM interface in combination with the container may be considered to define an exterior load lock, or container load lock.

Referring still to FIG. 7A, in the aspect illustrated in FIG. 7A, the load port 24 is shown interfacing with one container T for example purposes, though in alternate embodiments, the load port may be arranged to interface with any desired number of containers. For example, in alternate aspects, the load port may have a generally stacked configuration capable of interfacing a number of containers arrayed in a stack similar to that described in U.S. Pat. No. 9,105,673, the disclosure of which has been previously incorporated by reference herein in its entirety. In accordance with the present disclosure, the load port 24 may have a vacuum source 1010V capable of being communicably connected to the container(s) T held on the load port in order to pump down the container, for example to clean molecular contaminants from the container interior and substrates therein when the container is on the load port. Conversely, the container may be arranged in any suitable manner to communicably interface with the vacuum source 1010V at the load port and to withstand atmospheric pressure in the container casement when the container is pumped down to vacuum, such as described in U.S. Pat. No. 9,105,673.

The container T may have suitable passages and orifice(s) or ports 776 (which may be vacuum ports, purge gas ports, or the ports may be common to both vacuum and purge gas sources) so that, on connection or coupling the container with the load port 24, the vacuum source 1010V of the load port is automatically coupled to the container housing and communicates with the container interior. As may be realized, container seals (see, e.g., door seal 940 in FIG. 9) have desired integrity to withstand vacuum across the seal.

As seen in FIG. 7A, in the exemplary embodiment illustrated, the container T may also be configured to be communicably connected to a gas feed, such as a source of vent or purge gas. In the exemplary embodiment shown in FIG. 7A, the container T may be communicably connected to gas source/feed 1010G, when seated on the container support of the load port 24. As may be realized, the container T may have a suitable inlet port 776 (plug (and suitable gas channels connecting the container interior) to couple (for example automatically) to a nozzle of the gas feed 1010G, such as when the container is placed on the load port support surfaces. The arrangement of the gas source interface between load port and container shown in FIG. 7A is merely exemplary and in alternate embodiments the gas source interface between container and load port may have any other desired location and configuration. As noted before, the gas source 1010G may be capable of providing for example purge and/or vent gas to the container seated on or located at the load port 24. By way of example, with the container T suitably positioned (such as from an overhead transport) at load port 24, and the gas feed nozzle connected to the container to feed gas into the container housing, a purge gas (e.g. N2) may be fed into the container if desired (depending on the interior atmosphere of the container when positioned at the load port, and the environment being maintained in the EFEM). Thus, if the container for example contains some process atmosphere, (such as from an interface with a previous tool), and the EFEM 1004 may be maintained with an inert gas or very clean air atmosphere, that may be dissimilar from the container atmosphere, upon positioning the container at the load port, desired purge gas may be fed into the container such as via gas feed 1010G, purging the container atmosphere so that the container may be interfaced with the load port opening and integrated to the tool 1002 is previously described. Moreover, in the event that container atmosphere is considered incompatible with or possibly presenting undesired contaminants to, the EFEM environment, upon positioning the container at the load port (but for example before opening the container interior to the EFEM environment), the container interior may be pumped to sufficient vacuum via vacuum source 1010V, and filled with the inert gas (e.g. N2, very clean air) similar to the environment in the EFEM to clean the potential contaminants from the container T, and allowing integration of the container T to the tool as previously described. As may be realized, one or more of the ports 776 may be coupled to the vacuum source 1010V and one or more other ports 776 may be coupled to the purge gas source 1010G to effect purging of the container T.

As noted above, the purge gas feed 1010G may, in addition to or in lieu the vacuum source 1010V, operate the actuator 5000 in a manner substantially similar to that described above. Information regarding the container atmosphere may be recorded on a RFID (radio frequency identification) tag, or other suitable data storage device, capable of being read (or otherwise accessed) by a suitable reader at or proximate to the load port 24 with which the container is being loaded. Accordingly, suitable information regarding the container interior may be obtained by the tool controller, reviewed with a desired protocol and if desired the container may be pumped and vented as previously described when positioned at the load port 24. Information regarding the container atmosphere for example may be recorded on the container borne storage device when the container is docked to the load port, or any other suitable time. Such information may also be tracked by a FAB wide controller if desired. As may be realized, the container T may also be interfaced with an EFEM that may not have vacuum and gas feed connections. In alternate embodiments, the container may include an internal or onboard source of purge gas, such as described in U.S. Pat. No. 9,105,673, to effect purging the container when positioned at a load port. As may be realized, in other aspects, the load port interface interfacing with the container may be provided with a vacuum connection, and no gas feed, that gas being provided for example from a gas source on board the container. Thus, as may be realized the container may now serve as a substrate cleaning chamber of the tool, storing substrates at the tool so they are undergoing cleaning. As may be realized, the container pump/vent may also be performed prior to removal of the container T from the load port 24 such as when repositioning the container T to another tool.

As noted before, the arrangement of the load port and container to tool interface shown in FIG. 7A is merely exemplary, and in other aspects, the interface may have any other desired configuration. For example, the gas feed may be positioned as desired to vent gas from EFEM environment into the container after the container interior has been pumped.

Referring now to FIGS. 2, 6, 8, and 9A the support station 36 of load port module 24 includes selectably configurable cassette support purge ports 810, 811 with more than one purge port nozzle locations 800A, 800B, 801A, 801B, 802A, 802B, 803A, 803B, 804A, 804B disposed on the container T support, such as support station 36. Each of the more than one purge port nozzle locations 800A, 800B, 801A, 801B, 802A, 802B, 803A, 803B, 804A, 804B is configured so that a purge nozzle 900-903 at a respective purge port nozzle location 800A, 800B, 801A, 801B, 802A, 802B, 803A, 803B, 804A, 804B couples to at least one purge port 600-609 of the container(s) T-TJ. Each purge port nozzle location 800A, 800B, 801A, 801B, 802A, 802B, 803A, 803B, 804A, 804B defines an interchangeable purge nozzle interface 820-831 (FIGS. 8 and 9A) so that different interchangeable purge nozzles 900-903, corresponding to different interchangeable purge nozzle modules 1910, 910 (as will be described below) are fast swapped between the different purge nozzle locations reconfiguring the load port module on the fly with purge nozzles at desired locations (so as to mate different containers having different characteristics at the same load port module). Each of the different interchangeable purge nozzle modules 1910, 910 has a different predetermined purge nozzle configuration (e.g., that corresponds with a predetermined purge port configuration of a container T to be coupled to the load port 24). Each of the different interchangeable purge nozzle modules 1910, 910 is removably mounted to a respective purge nozzle interface 820-831 of one or more of the purge port nozzle locations 800A, 800B, 801A, 801B, 802A, 802B, 803A, 803B, 804A, 804B that correspond to the different predetermined purge nozzle configurations of the interchangeable purge nozzle modules 1910, 910. Each of the different interchangeable purge nozzle modules 1910, 910 are in conformance with and effect coupling to different purge ports 600-603, of the at least one purge port 600-609, of different containers T-TJ (FIG. 6B), of at least one container T-TJ, having different purge port 600-609 characteristics.

Still referring to FIGS. 2, 6, 8, and 9A each of the interchangeable purge nozzle modules 1910, 910 has at least one purge nozzle 900-903 and is selectable from an number of different interchangeable purge nozzle modules 1910, 910. Each of the purge nozzle modules 1910, 910 having a different predetermined purge nozzle configuration for modular mounting to the interchangeable purge nozzle interface 820-831, so that selectable mounting of the interchangeable purge nozzle module 1910, 910 changes the configuration of the cassette support purge ports 810, 811 from a first configuration with the at least one purge nozzle 900-903 at purge port nozzle locations 800A, 800B, 801A, 801B, 802A, 802B, 803A, 803B, 804A, 804B conformal with and effecting coupling with a first of the container T-TJ having a first predetermined purge port characteristic, to a second configuration with the purge port nozzle 900-903 at purge port nozzle locations 800A, 800B, 801A, 801B, 802A, 802B, 803A, 803B, 804A, 804B conformal with and effecting coupling with a second of the containers T-TJ having a second predetermined purge port characteristic different than the first predetermined purge port characteristic. For example, as can be seen in FIG. 6B the different purge port characteristics of the containers T-TJ is a location/configuration of the purge ports 600-609 relative to the kinematic locating features (e.g., slots T22) of the respective container T-TJ. For example, purge ports 600, 601 of the containers T, TA, TD are referred to herein as narrow outside front purge ports (such as found on the Shin-Etsu Polymer Co. Ltd. OB-CB_SHIN_ETSY FOUP) and correspond with purge port nozzle locations 801A, 801B of the load port 24. Purge ports 606, 607 of the containers TG, TH, TJ are referred to herein as wide outside front purge ports (such as found on the Entegris, Inc. Spectra™ and F300 FOUPS, the Miraial Co., Ltd. 4 port and 2 Port FOUPS, and the and the Shin-Etsu Polymer Co. Ltd. CT-CF-S_SHIN_ETSY and T-CF-S_SHIN_ETSY FOUP) and correspond with purge port nozzle locations 802A, 802B of the load port 24. Purge ports 608, 609 of the containers TE, TF, TI are referred to herein as inside front purge ports (such as found on the Entegris, Inc. A300 FOUP and the Shin-Etsu Polymer Co. Ltd. CF-A_SHIN-ENSY FOUP) correspond with purge port nozzle locations 800A, 800B of the load port 24. Purge ports 602, 603 of the containers T, TB, TE, TJ are referred to herein as forward rear purge ports (such as found on the Entegris, Inc. Spectra™ FOUP, the Miraial Co., Ltd. 4 port FOUP, and the Shin-Etsu Polymer Co. Ltd. CT-CF-S_SHIN_ETSY and T-CF-S_SHIN_ETSY FOUP) and correspond with purge port nozzle locations 803A, 803B of the load port 24. Purge ports 604, 605 of the containers TC, TD, TH, TI are referred to herein as rearward rear purge ports (such as found on the Entegris, Inc. A300 FOUP and the Shin-Etsu Polymer Co. Ltd. CF-A_SHIN-ENSY FOUP) and correspond with purge port nozzle locations 804A, 804B of the load port 24. As such, each of containers T-TJ has a respective purge port configuration that is different from a purge port configuration of another of the containers T-TJ.

The interchangeable purge nozzle modules 1910, 910 may be physical purge nozzle modules, virtual purge nozzle modules, or a combination of both physical purge nozzle modules and virtual purge nozzle modules. Each different purge port nozzle module 1910, 910 (virtual modules 910 have similar configurations to physical modules 1910 and are similarly numbered except as noted) corresponds to a different predetermined purge port characteristic of different ones of the at least one substrate cassette container T-TJ (generally referred to herein as container T unless a particular aspect of the container T-TJ is being referred to), such as for example, a location (e.g., wide outside front purge ports, narrow outside front purge ports, inside front purge ports, forward rear purge ports, rearward rear purge ports) and/or configuration (e.g., hard plastic purge port mating interfaces, fluoroelastomer purge port interfaces) of the purge ports 600-609 of the container T.

Referring to FIGS. 9A-9G, examples of the physical purge nozzle modules 1900 are purge nozzle modules 1910T, 1910TA, 1910TB, 1910TC, 1910TD, 1910TE, 1910TF, 1910TG, 1910TH, 191011, 1910TJ and purge nozzle modules 1910TFLU, 1910TAFLU, 1910TBFLU, 1910TCFLU, 1910TDFLU, 1910TEFLU, 1910TFFLU, 1910TGFLU, 1910THFLU, 1910TIFLU, 1910TJFLU (noting that purge nozzle modules 1910TFLU, 1910TAFLU, 1910TBFLU, 1910TCFLU, 1910TDFLU, 1910TEFLU, 1910TFFLU, 1910TGFLU, 1910THFLU, 1910TIFLU, 1910TJFLU are substantially similar to a corresponding one of purge nozzle modules 1910T, 1910TA, 1910TB, 1910TC, 1910TD, 1910TE, 1910TF, 1910TG, 1910TH, 1910TI, 1910TJ (e.g., 1910TFLU corresponds with 1910T, 1910TAFLU corresponds with 1910TA, etc.) but have a different type of purge nozzle coupler portion (see coupler portions 934A, 934B in FIG. 9A) than the corresponding one of the purge nozzles 1910T, 1910TA, 1910TB, 1910TC, 1910TD, 1910TE, 1910TF, 1910TG, 1910TH, 1910TI, 1910TJ. Referring to purge nozzle modules 1910TB, 1910TC in FIGS. 9A and 9B, the purge nozzle modules 1910TB, 1910TC may interchangeably be disposed adjacent rear side (opposite the opening 300 of the load port 24 frame 29) of the shuttle 52 to respectively interface with corresponding forward rear purge ports 602, 603 or rearward rear purge ports 604, 605 of the corresponding containers TB, TC. Each different physical purge port nozzle module 1910TB, 1910TC has a module frame (e.g., see bases/frames 950 that are not present with virtual purge port nozzle modules 910) with each corresponding purge port nozzle 902, 903 mounted to the respective base 950 so that the base 950 is common to each corresponding purge port nozzle 902, 903, and the base 950 defines a common removable mount coupling to the support station 36 so that removably coupling the base 950 to the support station 36 effects mounting of each purge port nozzle 902, 903 to the respective purge port nozzle interface 826-830 as a common module unit. In other aspects, the base 950 may be fixed to the container support 36 for employment with virtual purge port nozzle modules 910 as described herein, where the base 950 remains affixed to the support station 36.

It is noted that the purge nozzle modules 1910TB, 1910TC, 1910TBFLU, 1910TCFLU will be described with respect to purge nozzle module 1910TB. Purge nozzle module 1910TC, 1910TBFLU, 1910TCFLU are substantially similar to purge nozzle module 1910TB except where otherwise noted. The base 950 of each different purge port nozzle module 1910TB, 1910TC, 1910TBFLU, 1910TCFLU with the corresponding purge port nozzle(s) 902, 903 thereon is interchangeable as a module unit with another module frame 950 of each other different purge port nozzle module 1910TB, 1910TC, 1910TBFLU, 1910TCFLU with the corresponding different purge port nozzle(s) thereon 902, 903, as described herein. The purge nozzle module 1910TB includes the base 950 and a nozzle support 951 movably coupled to the base 950. The nozzle support 951 may be movably coupled to be base 950 in any suitable manner (such as with linear guide(s) 955) so as to move at least in direction 999 (which is a direction that is substantially normal to a support plane of the containers T as defined by locating/kinematic coupling pins 66). Any suitable physical limit stops 946, 947 may be provided on the base 950 and/or the nozzle support 951 to limit a height 1200 (FIG. 12A) of the purge nozzles 902, 903 above the shuttle surface 52S (it is noted that the height 1200 is representative and the height 1200 of one or more of the purge nozzle modules may have different corresponding heights). A linear actuator 985 is provided and is communicably coupled to the controller 400, where under commands from the controller 400 the linear actuator 985 raises (or lowers) the nozzle support 951 and the purge port nozzles 902, 903 thereon so that the purge port nozzles 902, 903 engage or disengage the container T. The controller 400 may be taught, in any suitable manner, actuator engagement/disengagement pose(s), that in some aspects may vary between purge nozzle modules 1910TB, 1910TC (and 1910TBFLU, 1910TBTCFLU) and the containers TB, TC. Each of the different actuator engagement/disengagement pose(s) may be taught to the controller 400 and programmed into a controller selector table 403 (see FIG. 1A) so that at the swapping of the different purge nozzle modules 1910TB, 1910TC (and 1910TBFLU, 1910TCFLU) the newly installed purge nozzle module is detected/identified by the controller (or an operator inputs into the controller an identification of the newly installed purge nozzle module) and the controller 400 selects the corresponding actuator engagement/disengagement pose(s) from the controller selector table 403. Any suitable biasing member 954 may be provided to bias the at least one purge nozzle 902, 903 coupled to the purge nozzle module 1910TB away from (such as where the linear actuator 985 lifts the nozzle support 951 towards the container T) or against (such as where the linear actuator 985 lowers the nozzle support 951 away from the container T) the forward rear purge ports 602, 603 of the respective container TB. Where the biasing member 954 biases the at least one purge nozzle 902, 903 against the forward rear purge ports 602, 603, the biasing member 954 may provide a predetermined engagement force (noting the at least one purge nozzle 902, 903 of purge nozzle module 1910TC is biased against rearward rear purge ports 604, 605 of container TC).

Each of the interchangeable purge port nozzle interfaces 820-831 (FIGS. 8 and 9A) is disposed so as to have a predetermined position relative to a predetermined datum (e.g., the kinematic locating pins 66) of the cassette support station so that each purge port nozzle interface 820-831 is deterministically located with respect to a predetermined datum (such as slots T22) of each different substrate cassette container T. In other words, the interchangeable purge port nozzle interface 826-830 is disposed so as to have a predetermined position relative to a predetermined datum (e.g., such as the pins 66) of the support station 36 so that each purge port nozzle 902, 903, of the different interchangeable purge port nozzle modules 1910TB, 1910TC, 1910TBFLU, 1910TCFLU, mounted to the interchangeable purge nozzle interface 826-830 is deterministically located with respect to a predetermined datum (such as the slots T22) of each different substrate cassette container T. For example, the base 950 includes any suitable locating features 956, such as holes/apertures, that mate with corresponding pins 957 of the shuttle 52 so that the purge nozzle modules 1910TB, 1910TC, 1910TBFLU, 1910TCFLU may be interchangeably and repeatably located relative to any suitable datum(s) (e.g., the kinematic locating pins 66) of the shuttle 52. In other aspects, the base 950 may be coupled to the shuttle 52 and may be interchangeably and repeatably located relative to any suitable datum(s) (e.g., the kinematic locating pins 66) of the shuttle 52 in any suitable manner, such as with any suitable locating jig 967 that interfaces with, e.g., the locating pins 66 and, for example, locating features 956 (or other suitable locating features) of the base 950 for positioning the base 950 on the shuttle 52 relative to the locating pins 66. The repeatable locating of the purge nozzle modules 1910TB, 1910TC, 1910TBFLU, 1910TCFLU relative to the kinematic locating pins 66 positions the purge nozzle modules 1910TB, 1910TC, 1910TBFLU, 1910TCFLU and the at least one purge nozzle 902, 903 coupled thereto relative to the purge ports 602-604 substantially upon coupling of the purge nozzle modules 1910TB, 1910TC, 1910TBFLU, 1910TCFLU to the shuttle 52 (i.e., without further positioning of the purge nozzles 902, 903 or the module 1910TB, 1910TC, 1910TBFLU, 1910TCFLU after coupling with the shuttle 52). Accordingly, the purge nozzle modules 1910TB, 1910TC, 1910TBFLU, 1910TCFLU may be fast swap so that the load port 24 arrangement may be reconfigured on the fly between each of the different purge nozzle module configurations commensurate with the container TB, TC purge port configurations.

Referring to FIGS. 9A, 9B, 13 and 14, each of the interchangeable purge port nozzle interfaces 826-829 defines a nozzle positioning datum (or purge nozzle datums) 952, 953 deterministically representing each of the at least one purge port 602-605 of the different substrate cassette containers TB, TC having different purge port characteristics (e.g., inlet, outlet, position, etc.). For example, the nozzle support 951 includes purge nozzle datums 952, 953 that are coupled to the nozzle support 951, so as to define purge port nozzle locations 803A, 803B, 804A, 804B. The datums 952, 953 include any suitable purge nozzle locating features 1300 (such as holes/apertures) to which the purge nozzles 902, 903 are coupled (such as with suitable pins 1400 (FIG. 9A) that are inserted into the respective purge nozzle locating features 1300). The fit between the pins 1400 and purge nozzle locating features 1300 may be such that the purge nozzles 902, 903 are retained on the shuttle 52 so that the load port 24 operates to load and unload containers T to and from the processing apparatus. In other aspects, the purge nozzles 902, 903 may be retained on the shuttle 52 in any suitable manner (e.g., fasteners, clips, tabs, etc.).

Referring also to FIG. 10, the purge nozzles 902, 903 may be coupled to the input gas manifold 10030 or the exhaust gas manifold 10040 in any suitable manner. In one aspect, the purge nozzles 902, 903 may have a respective fluid hard/rigid line or fluid pipe 990, 991 coupled thereto where a respective coupling 992 of the fluid pipe 990, 991 extends below the container support station 36. A respective flexible hose (see hoses 1020-1023) may couple the respective coupling 992 to the fluid pipe 990, 991 to connect the purge nozzle 902, 903 to the input gas manifold 10030 or the exhaust gas manifold 10040. In other aspects the respective flexible gas manifold may couple the purge nozzles 902, 903 to the input gas manifold 10030 or the exhaust gas manifold 10040 without an intervening fluid pipe 990, 991.

The purge nozzle modules may be configured as purge nozzle module 1910TB, 1910TBFLU (to interface with forward rear purge ports 602, 603) or as purge nozzle module 1910TC, 1910TCFLU (to interface with rearward rear purge ports 604, 605) depending on the purge nozzle characteristics of the container(s) TB, TC to be coupled with the load port 24. Each purge nozzle 902, 903 is removably mounted to the interchangeable purge port nozzle interface 826-829 as a unit independent from another purge port nozzle 902, 903 of the corresponding purge port nozzle module 1910TB, 1910TC, 1910TBFLU, 1910TCFLU, and each independently mounted purge port nozzle 902, 903, of the corresponding purge port nozzle module 1910TB, 1910TC, 1910TBFLU, 1910TCFLU, is independently interchanged with a different purge port nozzle 902, 903 of a different corresponding purge port nozzle module 1910TB, 1910TC, 1910TBFLU, 1910TCFLU so as to effect interchange of the corresponding purge port nozzle module 1910TB, 1910TC, 1910TBFLU, 1910TCFLU with the different corresponding purge port nozzle module 1910TB, 1910TC, 1910TBFLU, 1910TCFLU. For example, each purge nozzle datum 952, 953 includes a set of slots 1305 that define datum stops 1302, 1303 that interface with respective locating fasteners 905, 906. To move the purge nozzle datum 952, 953 into position (e.g., a forward position) for interfacing with purge ports 602, 603 and configure the purge nozzle module as purge nozzle module 1910TB, 1910TBFLU the locating fasteners 905, 906 are loosened to provide for sliding of the purge nozzle datum 952, 953 in direction 1401 so that datum stop 1303 substantially contacts and rests against locating fastener 905 (as shown in FIG. 14). Here the purge nozzles 902, 903 of the purge nozzle module 1910TB, 1910TBFLU, in the forward position, are located in purge port nozzle locations 803A, 803B. Similarly, to configure the purge nozzle module as purge nozzle module 1910TC, 1910TCFLU, so as to interface with purge ports 604, 605, the locating fasteners 905, 906 are loosened to provide for sliding of the purge nozzle datum 952, 953 into position (e.g., a reward position) for interfacing with purge ports 604, 605, where the purge nozzle datum 952, 953 is moved in direction 1301 so that datum stop 1302 substantially contacts and rests against locating fastener 906 (as shown in FIG. 13). Here, the purge nozzles 902, 903 of the purge nozzle module 1910TC, 1910TCFLU, in the rearward position, are located in purge port nozzle locations 803A, 803B.

Referring to FIGS. 8, 9A, and 9C-9E, the purge nozzle modules 1910TG, 1910TA, 1910TF, 1910TGFLU, 1910TAFLU, 1910TFFLU may interchangeably be disposed adjacent front side (adjacent the opening 300 if the load port 24 frame 29) of the shuttle 52 to interface with corresponding narrow outside front purge ports 600, 601 or wide outside front purge ports 606, 607 or inside front purge ports 608, 609 of the corresponding containers TA, TG, TF. Each different purge port nozzle module 1910TG, 1910TA, 1910TF, 1910TGFLU, 1910TAFLU, 1910TFFLU has a module frame (e.g., see base/frames 970) with each corresponding purge port nozzle 900, 901 mounted to the respective base 970 so that the base 970 is common to each corresponding purge port nozzle 900, 901, and the base 970 defines a common removable mount coupling to the support station 36 so that removably coupling the base 970 to the support station 36 effects mounting of each purge port nozzle 900, 901 to the respective purge port nozzle interface 820-825, 831 as a common module unit. In other aspects, the base 970 may be fixed to the container support 36 for employment with virtual purge port nozzle modules as described herein.

It is noted that the purge nozzle modules 1910TG, 1910TA, 1910TF, 1910TGFLU, 1910TAFLU, 1910TFFLU will be described with respect to purge nozzle module 1910TG. Purge nozzle modules 1910TA, 1910TF, 1910TGFLU, 1910TAFLU, 1910TFFLU are substantially similar to purge nozzle module 1910TG except where otherwise noted. The base 970 of each different purge port nozzle module 1910TG, 1910TA, 1910TF, 1910TGFLU, 1910TAFLU, 1910TFFLU with the corresponding purge port nozzle 900, 901 thereon is interchangeable as a module unit with another module frame 970 of each other different purge port nozzle module 1910TG, 1910TA, 1910TF, 1910TGFLU, 1910TAFLU, 1910TFFLU with the corresponding different purge port nozzle thereon 900, 901 as described herein. The purge nozzle module 1910TG includes the base 970, a nozzle support 971 movably coupled to the base 970, and a support bridge 972. The support bridge 972 is coupled to and carried by the nozzle support 971. The nozzle support 971 may be movably coupled to be base 970 in any suitable manner (such as with linear guide(s) 975) so as to move at least in direction 999 (which is a direction that is substantially normal to a support plane of the containers T as defined by locating/kinematic coupling pins 66). The support bridge 972 may be configured to engage an interior surface 1202 (FIG. 12A) of the shuttle 52 so as to control a height 1201 of the purge nozzles 900, 901 above the surface 52S of the shuttle 52 (it is noted that the height 1201 is representative and the height 1201 of one or more of the purge nozzle modules may have different corresponding heights). In a manner similar to that described above, a linear actuator 985 is provided and communicably coupled to the controller 400 so as to raise (or lower) the nozzle support 971 and the purge port nozzles thereon 900, 901 so that the purge port nozzles 900, 901 engage or disengage the container T. In a manner similar to that described above, the controller may detect/identify a newly installed purge nozzle module 1910TG, 1910TGFLU, 1910TA, 1910TAFLU, 1910TF, 1910TFFLU (or an operator may manually input an identification of the newly installed purge nozzle module) so that the controller 400 selects a corresponding actuator engagement/disengagement pose(s) from the controller selector table 403 upon swapping of the purge nozzle modules. Any suitable biasing member 974 may be provided to bias the at least one purge nozzle 900, 901 coupled to the purge nozzle module 1910TG (and purge nozzle module 1910TGFLU) away from (such as where the linear actuator 985 lifts the nozzle support 951 towards the container T) or against (such as where the linear actuator 985 lowers the nozzle support 951 away from the container T) the wide outside front purge ports 606, 607 of the respective container. TG Where the biasing member 974 biases the at least one purge nozzle 900, 901 against the wide outside front purge ports 606, 607, the biasing member 974 may provide a predetermined engagement force (noting that the at least one purge nozzle 900, 901 of purge nozzle module 1910TA, 1910TAFLU is biased against the narrow outside front purge ports 600, 601 and the at least one purge nozzle 900, 901 of purge nozzle module 1910TF, 1910TFFLU is biased against the inside front purge ports 608, 609).

As noted above, each of the interchangeable purge port nozzle interfaces 820-831 (FIGS. 8 and 9A) is disposed so as to have a predetermined position relative to a predetermined datum (e.g., the kinematic locating pins 66) of the cassette support station 36 so that each purge port nozzle interface 820-831 is deterministically located with respect to a predetermined datum (such as slots T22) of each different substrate cassette container T. In other words, the interchangeable purge port nozzle interface 820-825, 831 is disposed so as to have a predetermined position relative to a predetermined datum (e.g., such as the pins 66) of the support station 36 so that each purge port nozzle 900, 901, of the different interchangeable purge port nozzle modules 1910TG, 1910TA, 1910TF, 1910TGFLU, 1910TAFLU, 1910TFFLU mounted to the interchangeable purge nozzle interface 820-825, 831 is deterministically located with respect to a predetermined datum (such as the slots T22) of each different substrate cassette container T. For example, the base 970 includes any suitable locating features 976, such as holes/apertures, that mate with corresponding pins 977 of the shuttle 52 so that the purge nozzle modules 1910TG, 1910TA, 1910TF, 1910TGFLU, 1910TAFLU, 1910TFFLU may be interchangeably and repeatably located relative to any suitable datum(s) (e.g., the kinematic locating pins 66) of the shuttle 52. In other aspects, the base 970 may be coupled to the shuttle 52 and may be interchangeably and repeatably located relative to any suitable datum(s) (e.g., the kinematic locating pins 66) of the shuttle 52 in any suitable manner, such as with any suitable locating jig 968 that interfaces with, e.g., the locating pins 66 and, for example, locating features 976 (or other suitable locating features) of the base 970 for positioning the base 970 on the shuttle 52 relative to the locating pins 66. The repeatable locating of the purge nozzle modules 1910TG, 1910TA, 1910TF, 1910TGFLU, 1910TAFLU, 1910TFFLU relative to the kinematic locating pins 66 positions the purge nozzle modules 1910TG, 1910TA, 1910TF, 1910TGFLU, 1910TAFLU, 1910TFFLU and the at least one purge nozzle 900, 901 coupled thereto relative to the purge ports 600, 601, 606-609 substantially upon coupling of the purge nozzle modules 1910TG, 1910TA, 1910TF, 1910TGFLU, 1910TAFLU, 1910TFFLU to the shuttle 52 (i.e., without further positioning of the purge nozzles 900, 901 or the module 1910TG, 1910TA, 1910TF, 1910TGFLU, 1910TAFLU, 1910TFFLU after coupling with the shuttle 52). Accordingly, the purge nozzle modules 1910TG, 1910TA, 1910TF, 1910TGFLU, 1910TAFLU, 1910TFFLU may be fast swap so that the load port 24 arrangement may be reconfigured on the fly between each of the different purge nozzle module configurations commensurate with the container TG, TA, TC purge port configurations.

Referring to FIGS. 9A, 9C-9E, 13 and 14, as noted above, each of the interchangeable purge port nozzle interfaces 820-825 defines a nozzle positioning datum (or purge nozzle datums) 980A, 980B, 981A, 981B, 982A, 982B deterministically representing each of the at least one purge port 600, 601, 606-609 of the different substrate cassette containers T having different purge port characteristics (e.g., inlet, outlet, etc.). For example, the nozzle support 971 includes purge nozzle datums 980A, 980B, 981A, 981B, 982A, 982B that are coupled to the nozzle support 971, so as to define purge port nozzle locations 801A, 801B, 802A, 802B, 800A, 800B. The datums 980A, 980B, 981A, 981B, 982A, 982B include any suitable purge nozzle locating features 1300 (such as holes/apertures) to which the purge nozzles 900,

901 are coupled (such as with suitable pins 1400 (FIG. 9A) that are inserted into the respective purge nozzle locating features 1300). The fit between the pins 1400 and purge nozzle locating features 1300 may be such that the purge nozzles 900, 901 are retained on the shuttle 52 so that the load port 24 operates to load and unload containers T to and from the processing apparatus. In other aspects, the purge nozzles 900, 901 may be retained on the shuttle 52 in any suitable manner (e.g., fasteners, clips, tabs, etc.). Referring also to FIG. 10, the purge nozzles 900, 901 may be coupled to the input gas manifold 10030 or the exhaust gas manifold 10040 in any suitable manner. In one aspect, the purge nozzles 900, 901 may have a respective fluid hard/rigid line or fluid pipe 993, 994 coupled thereto where a respective coupling 995 of the fluid pipe 993, 994 extends below the container support station 36. A respective flexible hose (see hoses 1020-1023) may couple to the respective coupling 995 of the fluid pipe 993, 994 to connect the purge nozzle 900, 901 to the input gas manifold 10030 or the exhaust gas manifold 10040. In other aspects the respective flexible hose may couple the purge nozzles 900, 901 to the input gas manifold 10030 or the exhaust gas manifold 10040 without an intervening fluid pipe 993, 994.

The purge nozzle modules may be configured as purge nozzle module 1910TG, 1910TGFLU (to interface with wide outside front purge ports 606, 607), as purge nozzle module 1910TA, 1910TAFLU (to interface with narrow outside front purge ports 600, 601), or as purge nozzle module 1910TF, 1910TFFLU (to interface with inside front purge ports 608, 609) depending on the purge nozzle characteristics of the container(s) T to be coupled with the load port 24. Each purge nozzle 900, 901 is removably mounted to the interchangeable purge port nozzle interface 820-825 as a unit independent from another purge port nozzle 900, 901 of the corresponding purge port nozzle module 1910TG, 1910TA, 1910TF, 1910TGFLU, 1910TAFLU, 1910TFFLU and each independently mounted purge port nozzle 900, 901, of the corresponding purge port nozzle module 1910TG, 1910TA, 1910TF, 1910TGFLU, 1910TAFLU, 1910TFFLU is independently interchanged with a different purge port nozzle 900, 901 of a different corresponding purge port nozzle module 1910TG, 1910TA, 1910TF, 1910TGFLU, 1910TAFLU, 1910TFFLU so as to effect interchange of the corresponding purge port nozzle module 1910TG, 1910TA, 1910TF, 1910TGFLU, 1910TAFLU, 1910TFFLU with the different corresponding purge port nozzle module 1910TG, 1910TA, 1910TF, 1910TGFLU, 1910TAFLU, 1910TFFLU. For example, the locating features 1300 of the datums 980A, 980B, 981A, 981B, 982A, 982B and the purge nozzles 900, 901 are configured so that the purge nozzles 900, 901 can be selectably and interchangeably positioned at any one or more of the purge port nozzle locations 800A, 800B, 801A, 801B, 802A, 802B defined by the respective datums 980A, 980B, 981A, 981B, 982A, 982B. Here, to configure the purge nozzle module as the purge nozzle module 1910TG, 1910TGFLU, the purge nozzles 900, 901 are coupled to the datums 980A, 980B corresponding to purge port nozzle locations 802A, 802B where the interface between, for example, the purge nozzle locating features 1300 and pins 1400 (FIG. 9A) interchangeably and repeatably locate the purge nozzles 900, 901 relative to any suitable datum(s) (e.g., the kinematic locating pins 66) of the shuttle 52. The repeatable locating of the purge nozzles 900, 901 relative to the kinematic locating pins 66 positions the purge nozzle modules 1910TG, 1910TA, 1910TF, 1910TGFLU, 1910TAFLU, 1910TFFLU and the at least one purge nozzle 900, 901 coupled thereto relative to the purge ports 600, 601, 606-609 substantially upon coupling the purge nozzle modules 1910TG, 1910TA, 1910TF, 1910TGFLU, 1910TAFLU, 1910TFFLU to the shuttle (i.e., without further positioning of the purge nozzles 900, 901 or the module 1910TG, 1910TA, 1910TF, 1910TGFLU, 1910TAFLU, 1910TFFLU after coupling with the shuttle 52).

Figure 9F:
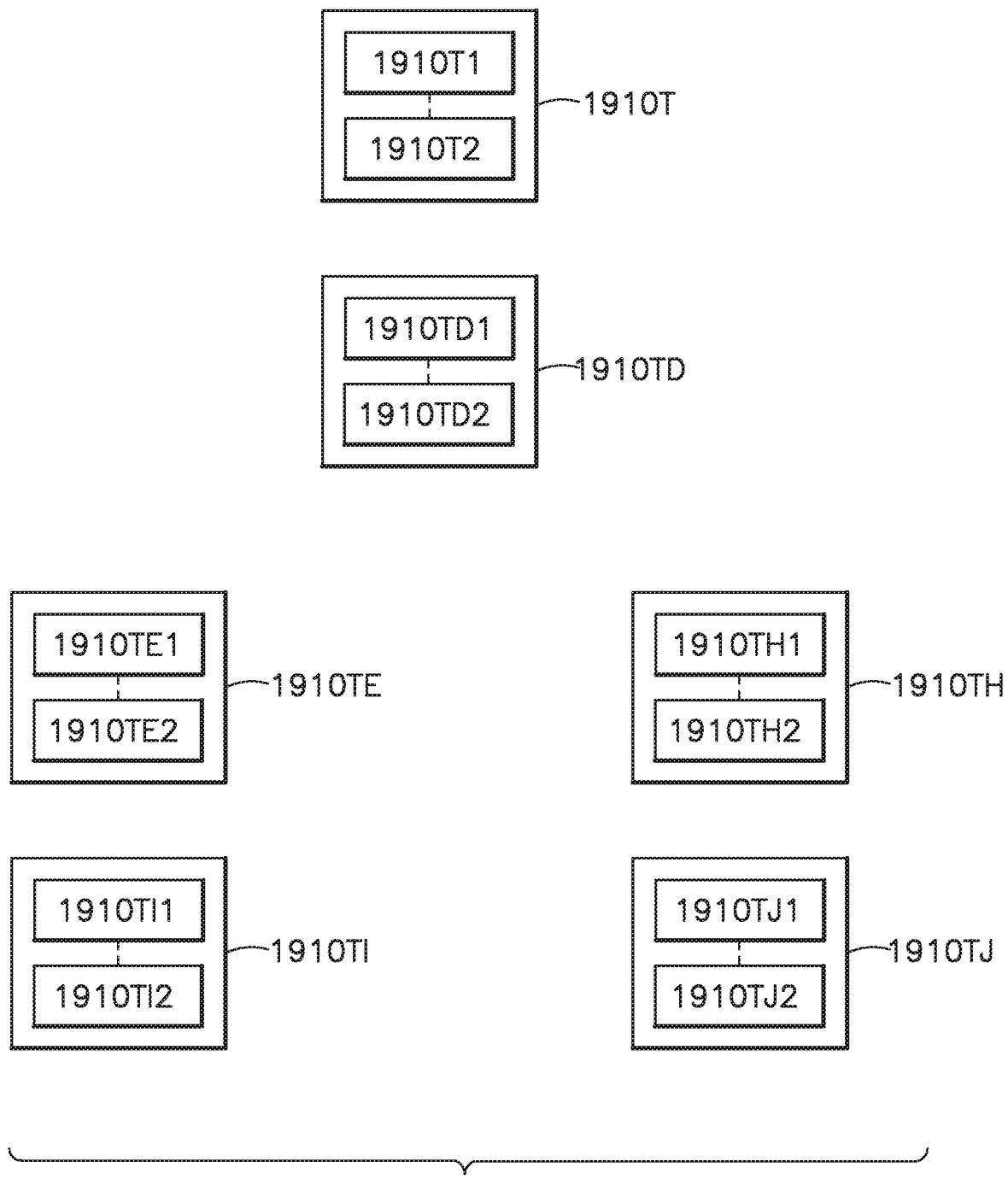
Figure 10:
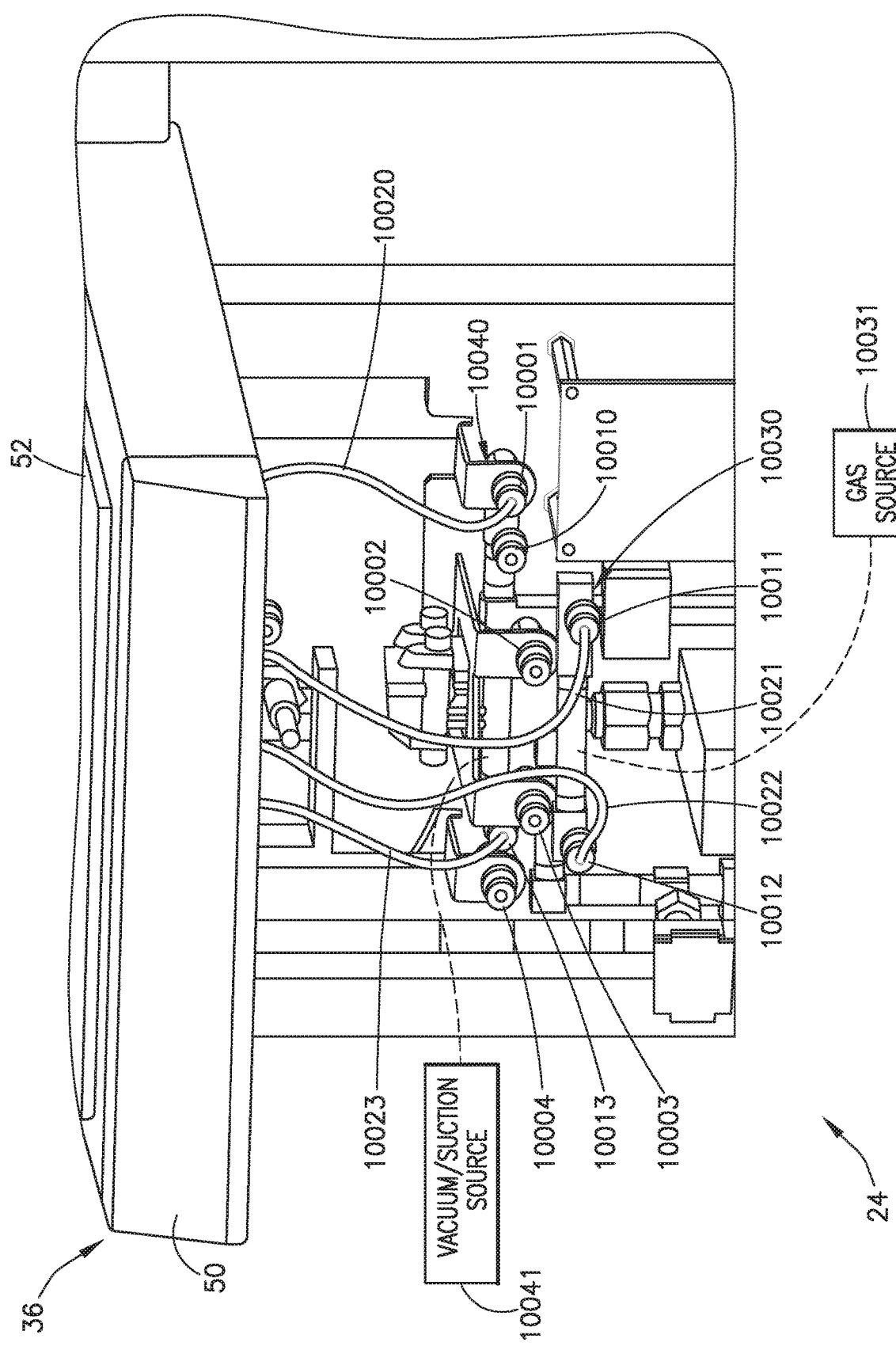
FIG. 10 is a schematic illustration of a portion of the load port module of FIG. 2 in accordance with aspects of the present disclosure.

While physical interchangeable purge nozzle modules 1910TA, 1910TF, 1910TG, 1910TB, 1910TC, 1910TAFLU, 1910TFFLU, 1910TGFLU, 1910TBFLU, 1910TCFLU are described as being configured for coupling with containers TA, TF, TG, TB, TC having two purge ports, physical interchangeable purge nozzle modules 1910T, 1910TD, 1910TE, 1910TH, 191011, 1910TJ, 1910TFLU, 1910TDFLU, 1910TEFLU, 1910THFLU, 1910TIFLU, 1910TJFLU may also include front and rear portions to effect coupling with containers T, TD, TE, TH, TI, TJ having four purge ports as illustrated in FIGS. 9F and 9G. The front and rear portions of the purge nozzle modules 1910T, 1910TD, 1910TE, 1910TH, 191011, 1910TJ, 1910TFLU, 1910TDFLU, 1910TEFLU, 1910THFLU, 1910TIFLU, 1910TJFLU may be separate portions that are coupled to the container support 36 independently/separately of each other or, in other aspects, the front and rear portions may be a unitary module is that coupled to the container support 36 as a single unit. The purge nozzle modules 1910T, 1910TD, 1910TE, 1910TH, 191011, 1910TJ, 1910TFLU, 1910TDFLU, 1910TEFLU, 1910THFLU, 1910TIFLU, 1910TJFLU may also be fast swap so that the load port 24 arrangement may be reconfigured on the fly between each of the different purge nozzle module configurations commensurate with the container T-TJ purge port configurations.

Purge nozzle module 1910T (and purge nozzle module 1910TFLU which is substantially similar to purge nozzle module 1910T) is configured for coupling with the four purge ports 600, 601, 602, 603 of container T. Purge nozzle module 1910T includes a front portion 1910T1 that is substantially similar to purge nozzle module 1910TA for coupling with narrow outside front purge ports 600, 601. The purge nozzle module 1910T also includes a rear portion 1910T2 that is substantially similar to purge nozzle module 1910TB for coupling with forward rear purge ports 602, 603.

Purge nozzle module 1910TD (and purge nozzle module 1910TDFLU which is substantially similar to purge nozzle module 1910TD) is configured for coupling with the four purge ports 600, 601, 604, 605 of container TD. Purge nozzle module 1910TD includes a front portion 1910TD1 that is substantially similar to purge nozzle module 1910TA for coupling with narrow outside front purge ports 600, 601. The purge nozzle module 1910TD also includes a rear portion 1910TD2 that is substantially similar to purge nozzle module 1910TC for coupling with rearward rear purge ports 604, 605.

Purge nozzle module 1910TE (and purge nozzle module 1910TEFLU which is substantially similar to purge nozzle module 1910TE) is configured for coupling with the four purge ports 608, 609, 602, 603 of container TE. Purge nozzle module 1910TE includes a front portion 1910TE1 that is substantially similar to purge nozzle module 1910TF for coupling with inside front purge ports 608, 609. The purge nozzle module 1910TE also includes a rear portion 1910TE2 that is substantially similar to purge nozzle module 1910TB for coupling with forward rear purge ports 602, 603.

Purge nozzle module 1910TH (and purge nozzle module 1910THFLU which is substantially similar to purge nozzle module 1910TH) is configured for coupling with the four purge ports 606, 607, 604, 605 of container TH. Purge nozzle module 1910TH includes a front portion 1910TH1 that is substantially similar to purge nozzle module 1910TG for coupling with wide outside front purge ports 606, 607. The purge nozzle module 1910TH also includes a rear portion 1910TH2 that is substantially similar to purge nozzle module 1910TC for coupling with rearward rear purge ports 604, 605.

Purge nozzle module 1910TI (and purge nozzle module 1910TIFLU which is substantially similar to purge nozzle module 1910TI) is configured for coupling with the four purge ports 608, 609, 604, 605 of container TI. Purge nozzle module 1910TI includes a front portion 1910TI1 that is substantially similar to purge nozzle module 1910TF for coupling with inside front purge ports 608, 609. The purge nozzle module 1910TI also includes a rear portion 1910TI2 that is substantially similar to purge nozzle module 1910TC for coupling with rearward rear purge ports 604, 605.

Purge nozzle module 1910TJ (and purge nozzle module 1910TJFLU which is substantially similar to purge nozzle module 1910TJ) is configured for coupling with the four purge ports 606, 607, 602, 603 of container TJ. Purge nozzle module 1910TJ includes a front portion 1910TJ1 that is substantially similar to purge nozzle module 1910TG for coupling with wide outside front purge ports 606, 607. The purge nozzle module 1910TJ also includes a rear portion 1910TJ2 that is substantially similar to purge nozzle module 1910TB for coupling with forward rear purge ports 602, 603.

The purge nozzle modules 1910T-1910TJ (and 1910TFLU-1910TJFLU which are substantially similar to 1910T-1910TJ as described herein) are illustrated as having purge nozzles 900-903 that include (referring to FIGS. 9A and 9B) a base portion 936 (see, e.g., FIG. 9D) and a coupler portion 934A. The base portion 936 may be substantially similar for all purge nozzles 900-903. The coupler portion 934A removably couples with the base portion 936 in any suitable manner (e.g., such as with clips, threads, snaps, or any other releasable fastener) and is configured to interface with a respective purge port 600-609 (depending on a location of the purge nozzle on the support station 36) so as to substantially form a seal between the respective purge port 600-609 and the purge nozzle 900-903. The coupler portion 934A may be configured to interface with hard plastic (or other suitable hard material) configured purge port and includes a sealing member 935A (e.g., such as a fluoroelastomer O-ring shown in FIGS. 9A, 9B) that substantially contacts and seals with the hard plastic (or other suitable hard material) configured purge port. In other aspects, the coupler portion 934A of the purge nozzle modules 1910T-1910TJ may be replaced with (e.g., be interchangeable with in a manner similar to that described below) coupler portion 934B that is configured to interface with a fluoroelastomer configured purge port and includes a substantially hard surface 935B (FIG. 9A) that substantially contacts and seals with the fluoroelastomer configured purge port. In still other aspects, purge nozzle modules 1910TFLU-1910TJFLU (see FIG. 9G) may be provided where the purge nozzle modules 1910TFLU-1910TJFLU are substantially similar to the corresponding purge nozzle modules 19101-191011; however, the purge nozzle modules 191011-19101J are configured with the coupler portion 934B instead of the coupler portion 934A.

As noted above, the interchangeable purge nozzle modules 1910, 910 may be physical purge nozzle modules, virtual purge nozzle modules, or a combination of both physical purge nozzle modules and virtual purge nozzle modules. Examples of the virtual purge nozzle modules 910 include virtual purge nozzle modules 910T, 910TA, 910TB, 910TC, 910TD, 910TE, 910TF, 910TG, 910TH, 91011, 910TJ, 91011, 910TA1, 910TB1, 910TC1, 910TD1, 9101E1, 910TF1, 910TG1, 910TH1, 910111, 910TJ1 illustrated in FIG. 9A. The virtual purge nozzle modules 910 may be sets of purge nozzles 900-903, 900A-903A that are interchangeably coupled to the purge port nozzle interfaces 820-829 at a respective one of the purge port nozzle locations 801A, 801B, 802A, 802B, 800A, 800B, 803A, 803B, 804A, 804B. For example, virtual purge nozzle modules 910T, 191011 correspond to the purge port configuration of container T (having purge ports narrow outside front purge ports 600, 601 and forward rear purge ports 602, 603603); virtual purge nozzle modules 910TD, 910TD1 correspond to the purge port configuration of container TD (having narrow outside front purge ports 600, 601 and rearward rear purge ports 604, 605); virtual purge nozzle modules 910TE, 9101E1 correspond to the purge port configuration of container TE (having inside front purge ports 602, 603, forward rear purge ports 602, 603); virtual purge nozzle modules 910TH, 910TH1 correspond to the purge port configuration of container TH (having wide outside front purge ports 606, 607 and rearward rear purge ports 604, 605); virtual purge nozzle modules 91011, 910111 correspond to the purge port configuration of container TI (having inside front purge ports 608, 609 and rearward rear purge ports 604, 605); and virtual purge nozzle module 910TJ, 910TJ1 correspond to the purge port configuration of container TJ (having wide outside front purge ports 606, 607 and forward rear purge ports 602, 603).

The virtual purge nozzle modules 910TA, 910TA1 correspond to the purge port configuration of container TA (having narrow outside front purge ports 606, 607). The virtual purge nozzle modules 910TF, 910TF1 correspond to the purge port configuration of container TF (having inside front purge ports 608, 609). The virtual purge nozzle modules 910TG, 910TG1 correspond to the purge port configuration of container TG (having wide outside front purge ports 606, 607).

The virtual purge nozzle modules 910TB, 910TB1 correspond to the purge port configuration of container TB (having forward rear purge ports 602, 603). The virtual purge nozzle modules 910TC, 910TC1 correspond to the purge port configuration of container TC (having rearward rear purge ports 604, 605).

As may be realized, in one aspect, the purge nozzles 900-903, 900A-903A are fungible/interchangeable with each other such that the purge nozzles 900, 901, 900A, 901A intended for coupling with the front container purge ports may be located on the container support 36 so as to interface with the rear container purge ports and the purge nozzles 902, 903, 902A, 903B intended for coupling with the rear container purge ports may be located on the container support 36 so as to interface with the front container purge ports. In addition, purge nozzles 902, 903 may be moved between the purge port nozzle locations 803A, 803B, 804A, 804B by moving the purge nozzle datum 952, 953 as described herein while the frame 950 remains affixed to the container support 36.

In other aspects there may also be different virtual purge nozzle modules 910T-910TJ, 910T1-910TJ1 corresponding to one or more (or each) of the containers T-TJ (as described above) such as where the purge ports 600-609 of the containers have different coupling characteristics (e.g., such as hard plastic configured purge ports or fluoroelastomer configured purge ports). For example, referring to FIGS. 9A and 9B and as noted above, each purge nozzle 900-903, 900A-903A includes a base portion 936 (see, e.g., FIG. 9D)

and a coupler portion 934A, 934B (see, e.g., FIGS. 9A and 9B). The base portion 936 may be substantially similar for all purge nozzles 900-903, 900A-903A and as such the different coupler portions 934A, 934B may be interchangeable with each of the purge nozzles 900-903, 900A-903A and purge nozzle locations 801A, 801B, 802A, 802B, 800A, 800B, 803A, 803B, 804A, 804B. The base portion 936 includes e.g., pins 1400 (FIG. 9A) that are inserted into the respective purge nozzle locating features 1300 as described herein. The base portions 936 is also configured for coupling with the respective flexible hose (see hoses 1020-1023) and/or the respective fluid pipe 990, 991, 993, 994.

The coupler portions 934A, 934B removably couple with the base portion 936 in any suitable manner (e.g., such as with clips, threads, snaps, or any other releasable fastener) and is configured to interface with a respective purge port 600-609 (depending on a location of the purge nozzle on the support station 36) so as to substantially form a seal between the respective purge port 600-609 and the purge nozzle 900-903, 900A-903A. The coupler portion 934A may be configured to interface with hard plastic (or other suitable hard material) configured purge port and includes a sealing member 935A (e.g., such as a fluoroelastomer O-ring shown in FIGS. 9A, 9B) that substantially contacts and seals with the hard plastic (or other suitable hard material) configured purge port. The coupler portion 934B may be configured to interface with a fluoroelastomer configured purge port and includes a substantially hard surface 935B (FIG. 9A) that substantially contacts and seals with the fluoroelastomer configured purge port. The configurations of the purge nozzles 900-903, 900A-903A described herein are exemplary and the purge nozzles may have any other suitable configuration for coupling with any suitable purge port of any suitable container.

As each purge nozzle 900-903, 900A-903A of the virtual purge nozzle modules 910T-910TJ, 910T1-910TJ1 are separate and distinct purge nozzles (i.e., individual purge nozzles that are installed and/or removed from the container support 36 on a frame as with modules 1910TG, 1910TB) so that each purge port nozzle 900-903, 900A-903A is removably mounted to the purge port nozzle interface 820-829 as a unit independent from another purge port nozzle 900-903, 900A-903A of the corresponding purge port nozzle module 910T-910TJ, 910T1-910TJ1. The corresponding purge port nozzle module 910T-910TJ, 910T1-910TJ1 may also be interchanged with a different purge port nozzle module 910T-910TJ, 910T1-910TJ1 with different corresponding purge port nozzles 900-903, 900A-903A. For example, where virtual purge nozzle module 910TG is to be coupled to the container support 36 in place of virtual purge nozzle module 910T, each purge nozzle 900-903 of virtual purge nozzle module 910T is individually removed/uncoupled from container support 36 in any suitable order. After removal of the purge nozzles 900-903 of virtual purge nozzle module 910T, the purge nozzles 900A, 901A of virtual purge nozzle module 910TG are individually installed/coupled to container support 36 in any suitable order. In other aspects, rather than exchanging the entirety of purge nozzles 900, 901, the coupler portions 934A of virtual purge nozzle module 910T may be removed and replaced with coupler portions 934B so as to reconfigure virtual purge nozzle module 910T as virtual purge nozzle module 910T1. As described herein, the purge nozzles 900-903, 900A-903A may be coupled to the container support 36 in any of the different purge port nozzle locations 800A, 800B, 801A, 801B, 802A, 802B, 803A, 803B, 804A, 804B depending on the purge port characteristics of the container T.

As described above, the interchangeable purge port nozzle interface 820-829, to which a purge nozzle 900-903, 900A-903A is coupled, is disposed so as to have a predetermined position relative to the predetermined datum (e.g., the pins 66) of the cassette support 36 so that selectable mounting of the interchangeable purge port nozzle module 912-914, 912A-914A effects, substantially coincident with mounting, deterministic positioning of each purge port nozzle 900-903, 900A-903A, of the interchangeable purge port nozzle module 910T-910TJ, 910T1-910TJ1, mounted to the interchangeable purge nozzle interface 820-829 with respect to a predetermined datum (e.g., the slots T22) of each different substrate cassette container T.

Referring to FIGS. 11A-14, the container support 36 is illustrated with the purge nozzles 900-903 and/or purge nozzle modules 1910TG, 1910TA, 1910TF, 1910TB, 1910TC in different configurations (while purge nozzles 900-903 are illustrated it should be understood that purge nozzles 900A-903A may be used in lieu of or in combination with purge nozzles 900-903). It is noted that the configurations illustrated in FIGS. 11A-14 are non-exhaustive of the configurations described herein. For example, FIGS. 11A and 11B illustrate the purge nozzles 900, 901 located in purge port nozzle locations 802A, 802B (e.g., to interface with the wide outside front purge ports 606, 607) and purge nozzles 902, 903 located in purge nozzle locations 804A, 804B (e.g., to interface with the rearward rear purge ports 604, 605). As described above, in one aspect, the purge nozzles 900-903 may be configured as virtual purge nozzle modules 910TH, 910TH1 or a combination of virtual purge nozzle modules 910TG, 910TG1 and 910TC, 910TC1. In other aspects, the purge nozzles 902-903 may be part of physical purge nozzle module 1910TC, 1910TCFLU (to interface with rearward rear purge ports 604, 605—see FIG. 6B) and purge nozzles 900-901 may be configured as purge nozzle module 1910TG, 1910TGFLU (to interface with the wide outside front purge ports 606, 607—see FIG. 6B). In still other aspects, purge nozzles 900,901 may be configured as virtual purge nozzle module 910TG, 910TG1 while purge nozzles 902, 903 are configured as physical purge nozzle module 1910TC, 1910TCFLU. In other aspects, purge nozzles 900, 901 may be configured as physical purge nozzle module 1910TG, 1910TGFLU while purge nozzles 902, 903 are configured as virtual purge nozzle module 910TC, 910TC1.

FIGS. 12A and 12B illustrate the purge nozzles 900, 901 located in purge port nozzle locations 800A, 800B (e.g., to interface with the inside front purge ports 600, 601) and purge nozzles 902, 903 located in purge nozzle locations 803A, 803B (e.g., to interface with the forward rear purge ports 602, 603). As described above, in one aspect, the purge nozzles 900-903 may be configured as virtual purge nozzle module 910TE, 910TEFLU or a combination of virtual purge nozzle modules 910TF, 910TF1 and 910TB, 910TB1. In other aspects, the purge nozzles 902-903 may be part of physical purge nozzle module 1910TB, 1910TBFLU (to interface with the forward rear purge ports 602, 603—see FIG. 6B) and purge nozzles 900-901 may be configured as purge nozzle module 1910TF, 1910TFFLU (to interface with purge inside front purge ports 608, 609—see FIG. 6B). In still other aspects, purge nozzles 900,901 may be configured as virtual purge nozzle module 910TF, 910TF1 while purge nozzles 902, 903 are configured as physical purge nozzle module 1910TB. In other aspects, purge nozzles 900, 901 may be configured as physical purge nozzle module 1910TF, 1910TFFLU while purge nozzles 902, 903 are configured as virtual purge nozzle module 910TB, 910TB1.

FIG. 13 illustrates the purge nozzles 900-901 located in purge port nozzle locations 801A, 801B (e.g., to interface with the narrow outside front purge ports 600, 601). In this aspect, the base 950 and the nozzle support 951 are illustrated as being fixed to the container support 36 (with the locating features 1300 located in purge port nozzle locations 804A, 804B to interface with the rearward rear purge ports 604, 605) for use with virtual purge nozzle modules 910TC, 910TC1; however, in the purge nozzle configuration illustrated in FIG. 13 the virtual purge nozzle modules 910TC, 910TC1 are not employed. As described above, in one aspect, the purge nozzles 900, 901 may be configured as one of virtual purge nozzle modules 910TA, 910TA1. In other aspects, the purge nozzles 900, 901 may be part of physical purge nozzle 1910TA, 1910TAFLU (to interface with the narrow outside front purge ports 600, 601—see FIG. 6B).

FIG. 14 illustrates the purge nozzles 900-901 located in purge port nozzle locations 802A, 802B (e.g., to interface with the wide outside front purge ports 606, 607). In this aspect, the base 950 and the nozzle support 951 are illustrated as being fixed to the container support 36 (with the locating features 1300 located in purge port nozzle locations 803A, 803B to interface with the forward rear purge ports 602, 603) for use with virtual purge nozzle modules 910TB, 910TB1; however, in the purge nozzle configuration illustrated in FIG. 13 the virtual purge nozzle modules 910TB, 910TB1 are not employed. As described above, in one aspect, the purge nozzles 900, 901 may be configured as one of virtual purge nozzle modules 910TG, 910TG1. In other aspects, the purge nozzles 900, 901 may be part of physical purge nozzle 1910TG, 1910TGFLU (to interface with wide outside front purge ports 606, 607—see FIG. 6B).

Referring to FIGS. 8 and 10, as described above, flexible fluid hoses 10020-10023, at least in part, selectably couple each purge nozzle 900-903 to either an input gas manifold 10030 or an exhaust gas manifold 10040. In accordance with the aspects of the present disclosure any one of the purge nozzles 900-903 located at any one of the different purge port nozzle locations 800A, 800B, 801A, 801B, 802A, 802B, 803A, 803B, 804A, 804B may be configured, through coupling with one of the input gas manifold 10030 or the exhaust gas manifold 10040, as an input nozzle (e.g., for inputting gas/fluid into a container T coupled to the container support 36) or an output nozzle (e.g., for outputting gas/fluid from a container T coupled to the container support 36). For example, the input gas manifold 10030 may include any suitable number of coupling ports 10010-10013 for coupling one or more of the purge nozzles 900-903 to any suitable gas source 10031. The output gas manifold 10040 may include any suitable number of coupling ports 10001-10004 for coupling one or more of the purge nozzles 900-903 to any suitable vacuum/suction source 10041.

It is noted that while each of the input gas manifold 10030 and the output gas manifold are illustrated with four coupling ports 10010-10013, 1001-1004, in other aspects, one or more of the input gas manifold 10030 and the output gas manifold 10040 may be provided with more or less than four coupling ports depending on, e.g., a number of purge nozzles to be coupled to the container support 36. In one aspect, the number of input gas manifold 10030 coupling ports may be equal to the number of purge port nozzle locations of the container support 36. In one aspect, the number of output gas manifold 10040 coupling ports may be equal to the number of purge port nozzle locations of the container support 36. In accordance with the above, the input gas manifold 10030 and the output gas manifold 10040 are configured to support any suitable combination of input nozzles and output nozzles. For example, the input gas manifold 10030 may include any suitable number of coupling ports so that all of the purge nozzles 900-901 (noting again, there may be more or less than four purge nozzles) located at one or more (or all) of the different purge port nozzle locations 800A, 800B, 801A, 801B, 802A, 802B, 803A, 803B, 804A, 804B are input nozzles. The output gas manifold 10040 may include any suitable number of coupling ports so that all of the purge nozzles 900-901 (noting again, there may be more or less than four purge nozzles) located at one or more (or all) of the different purge port nozzle locations 800A, 800B, 801A, 801B, 802A, 802B, 803A, 803B, 804A, 804B are output nozzles. As another example, any suitable combination of input and output nozzles may be provided by the input gas manifold 10030 and/or the output gas manifold 10040.

Figure 15:
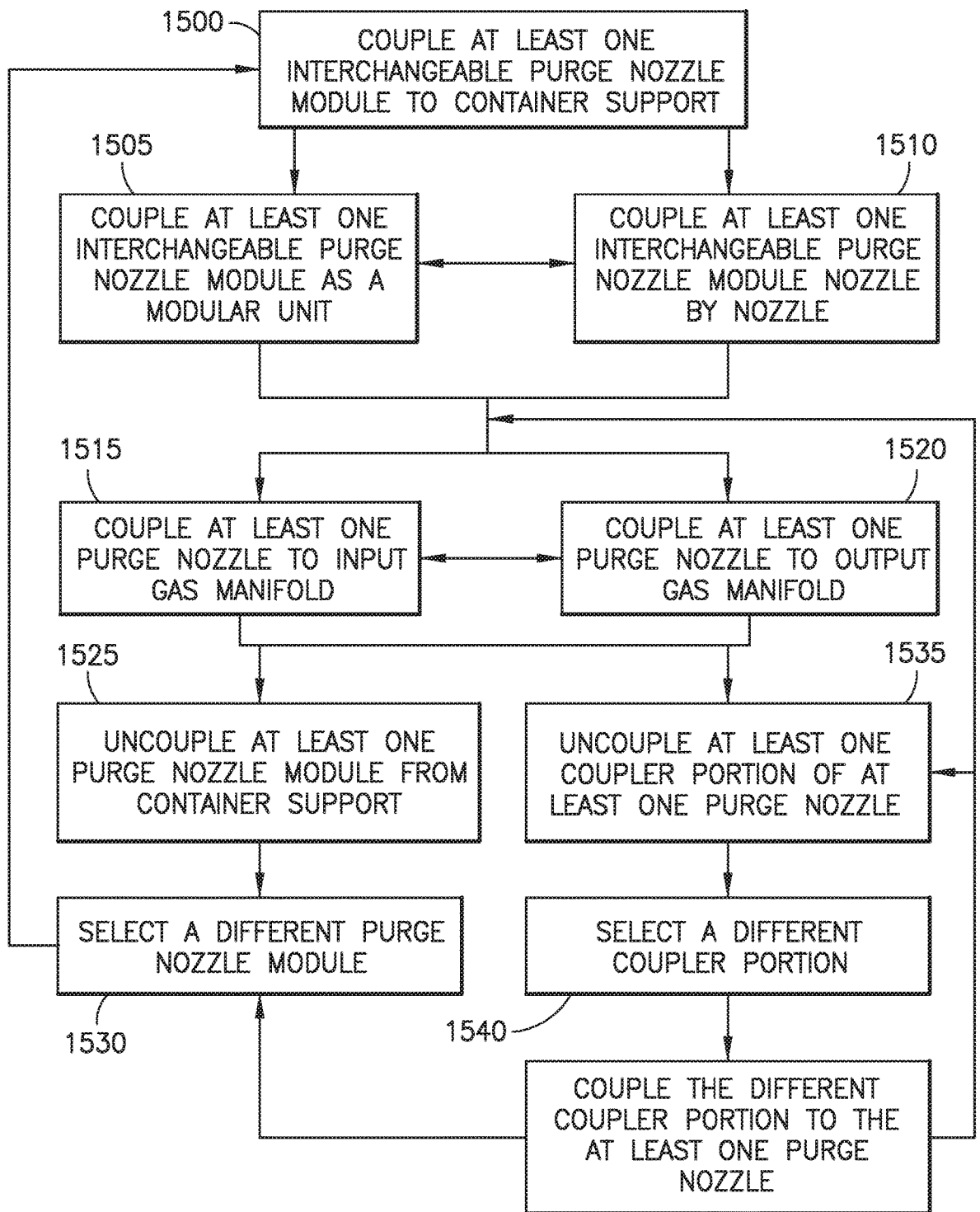
FIG. 15 is an exemplary flow diagram in accordance with aspects of the present disclosure.
Figure 16:
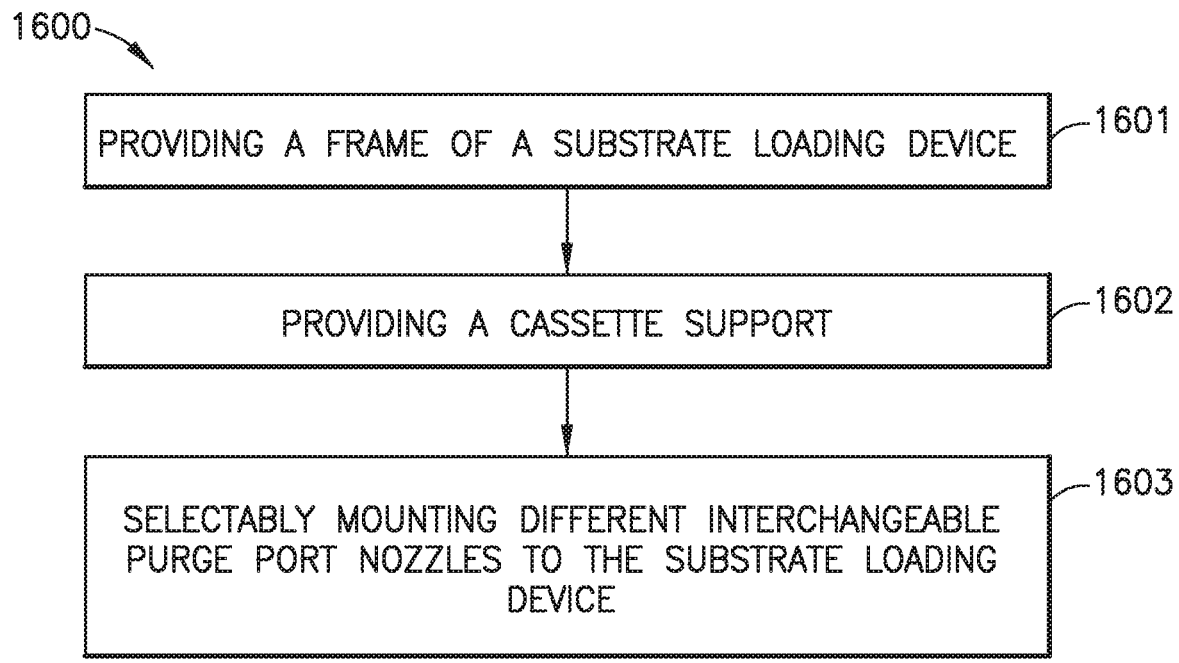
FIG. 16 is an exemplary flow diagram in accordance with aspects of the present disclosure.

Referring to FIGS. 8, 9A-9C, 10 and 15 an exemplary method will be described in accordance with aspects of the present disclosure. In one aspect, at least one interchangeable purge nozzle module 1910T-1910TJ, 1910TFLU-1910TJFLU, 910T-910TJ, 910T1-910TJ1 from a number of different interchangeable purge nozzle modules 1910T-1910TJ, 1910TFLU-1910TJFLU, 910T-910TJ, 910T1-910TJ1 is selectably coupled to the container support 36 of the load port 24 (FIG. 15, Block 1500). In one aspect, coupling the at least one interchangeable purge nozzle module 1910T-1910TJ, 1910TFLU-1910TJFLU to the container support includes coupling more than one purge nozzle 900-903 to the container support 36 as a modular unit (FIG. 15, Block 1505) where the more than one purge nozzle 900-903 are mounted on a common frame 950, 970 as described herein. In another aspect, coupling the at least one interchangeable purge nozzle module 910T-910TJ, 910T1-910TJ1 to the container support 36 includes coupling more than one purge nozzle 900-903 to the container support 36 nozzle by nozzle (FIG. 15, Block 1510) where the more than one purge nozzle 900-903 are separate individual nozzles that are coupled to the container support 36 independent of other purge nozzles of the more than one purge nozzle 900-903 as described above. In one aspect, at least one of the at least one interchangeable purge nozzle module 1910T-1910TJ, 1910TFLU-1910TJFLU is coupled to the container support 36 as a modular unit (FIG. 15, Block 1505), while another of the at least one purge nozzle module 910T-910TJ, 910T1-910TJ1 is coupled to the container support 36 nozzle by nozzle (FIG. 15, Block 1510).

In one aspect, at least one of the more than one purge nozzle 900-901 is communicably coupled to the input gas manifold 10030 (FIG. 15, Block 1515) to configured the at least one of the more than one purge nozzle 900-903 as an input nozzle as described herein. In another aspect, at least one of the more than one purge nozzle 900-901 is communicably coupled to the output gas manifold 10040 (FIG. 15, Block 1520) to configured the at least one of the more than one purge nozzle 900-903 as an output nozzle as described herein. In still another aspect, at least one of the more than one purge nozzle 900-901 is communicably coupled to the input gas manifold 10030 (FIG. 15, Block 1515), while another of the more than one purge nozzle 900-901 is communicably coupled to the output gas manifold 10040 (FIG. 15, Block 1520).

The at least one interchangeable purge nozzle module 1910T-1910TJ, 1910TFLU-1910TJFLU, 910T-910TJ, 910T1-910TJ1 may be removed/uncoupled from the container support 36 (FIG. 15, Block 1525) and another of the different interchangeable purge nozzle module 1910T-1910TJ, 1910TFLU-1910TJFLU, 910T-910TJ, 910T1-910TJ1 may be selected (FIG. 15, Block 1530) based on purge port characteristics of the container T to be coupled to the container support 36. In another aspect, at least one coupler portion 934A, 934B of at least one purge nozzle 900-903 of the at least one purge nozzle module 1910T-1910TJ, 1910TFLU-1910TJFLU, 910T-910TJ, 910T1-910TJ1 may be uncoupled/removed from a respective base portion 936 of a respective purge nozzle 900-903 (FIG. 15, Block 1535) and another different coupler portion 934A, 934B may be selected (FIG. 15, Block 1540) based on purge port characteristics of the container T to be coupled to the container support 36. The different coupler portion 934A, 934B is coupled to the at least one purge nozzle 900-903 from which the coupler portion 934A, 934B was uncoupled/removed (FIG. 15, Block 1545). In accordance with the aspects of the present disclosure, the respective purge nozzles 900-901 may be connected, decoupled, and reconnected to/from the input gas manifold 10030 and the output gas manifold 10040 as desired depending, e.g., on the purge port characteristics of the container T.

Referring to FIGS. 8, 9A-9C, 10 and 16 an exemplary method 1600 will be described in accordance with aspects of the present disclosure. The method 1600 includes providing a frame of a substrate loading device (FIG. 16, Block 1601) adapted to connect the substrate loading device to a substrate processing apparatus 10, the frame having a transport opening 30P through which substrates are transported between the substrate loading device and the substrate processing apparatus 10. A cassette support 36 is provided (FIG. 16, Block 1602) and connected to the frame for holding at least one substrate cassette container T for transfer of substrates to and from the at least one substrate cassette container T through the transport opening 30P. Different interchangeable purge port nozzles 900-903 are selectably mounted to the substrate loading device (FIG. 16, Block 1603) where cassette support purge ports 810, 811 with more than one purge port nozzle locations 800A, 800B, 801A, 801B, 802A, 802B, 803A, 803B, 804A, 804B are disposed on the cassette support 36. Each of the more than one purge port nozzle locations 800A, 800B, 801A, 801B, 802A, 802B, 803A, 803B, 804A, 804B is configured so that a purge port nozzle 900-903 at the purge port nozzle location 800A, 800B, 801A, 801B, 802A, 802B, 803A, 803B, 804A, 804B couples to at least one purge port 600-609 of the at least one substrate cassette container T. Each purge port nozzle location 800A, 800B, 801A, 801B, 802A, 802B, 803A, 803B, 804A, 804B defines an interchangeable purge port nozzle interface 820-831 so that the different interchangeable purge port nozzles 900-903, corresponding to different interchangeable purge port nozzle modules 1910-910 each having different predetermined purge nozzle configurations, are removably mounted to respective purge port nozzle interfaces 820-831 of the more than one purge port nozzle locations 800A, 800B, 801A, 801B, 802A, 802B, 803A, 803B, 804A, 804B that correspond to the different predetermined purge nozzle configurations of the interchangeable purge port nozzle modules 1910-910, in conformance with and effecting coupling to different ports, of the at least one purge port 600-609, of different substrate cassette containers T, of the at least one substrate cassette container T, having different purge port characteristics.

Figure 17:
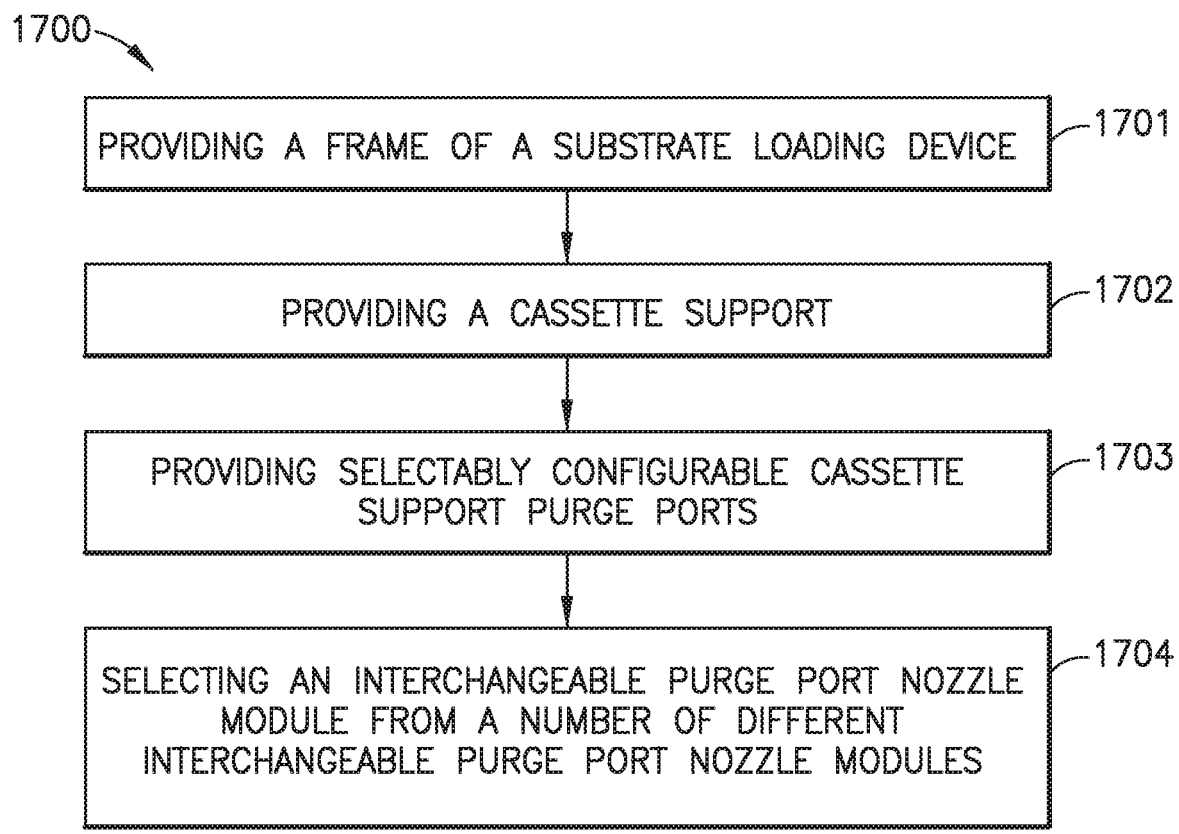
FIG. 17 is an exemplary flow diagram in accordance with aspects of the present disclosure.

Referring to FIGS. 8, 9A-9C, 10 and 17 an exemplary method 1700 will be described in accordance with aspects of the present disclosure. The method 1700 includes providing a frame of a substrate loading device (FIG. 17, Block 1701) adapted to connect the substrate loading device to a substrate processing apparatus 10, the frame having a transport opening 30P through which substrates are transported between the substrate loading device and the substrate processing apparatus 10. A cassette support 36 is provided (FIG. 17, Block 1702) and connected to the frame for holding at least one substrate cassette container T for transfer of substrates to and from the at least one substrate cassette container T through the transport opening 30P. Selectably configurable cassette support purge ports 810, 811 are provided (FIG. 17, Block 1703). The selectably configurable cassette support purge ports 810, 811 have more than one purge port nozzle locations 800A, 800B, 801A, 801B, 802A, 802B, 803A, 803B, 804A, 804B disposed on the cassette support 36. Each of the more than one purge port nozzle locations 800A, 800B, 801A, 801B, 802A, 802B, 803A, 803B, 804A, 804B being configured so that a purge port nozzle at the purge port nozzle location 800A, 800B, 801A, 801B, 802A, 802B, 803A, 803B, 804A, 804B couples to at least one purge port 600-609 of the at least one substrate cassette container T. Each purge port nozzle location 800A, 800B, 801A, 801B, 802A, 802B, 803A, 803B, 804A, 804B defines an interchangeable purge port nozzle interface 820-831. An interchangeable purge port nozzle module having at least one purge port nozzle is selected (FIG. 17, Block 1704) from a number of different interchangeable purge port nozzle modules 1910-910, each having different predetermined purge port nozzle configurations for modular mounting to the interchangeable purge port nozzle interface 820-831, so that selectable mounting of the interchangeable purge port nozzle module changes the configuration of the selectably configurable cassette support purge ports 810, 811 from a first configuration with the purge port nozzle at purge port nozzle locations 800A, 800B, 801A, 801B, 802A, 802B, 803A, 803B, 804A, 804B conformal with and effecting coupling with a first of the at least one substrate cassette container T having a first predetermined purge port characteristic, to a second configuration with the purge port nozzle at purge port nozzle locations 800A, 800B, 801A, 801B, 802A, 802B, 803A, 803B, 804A, 804B conformal with and effecting coupling with a second of the at least one substrate cassette container T having a second predetermined purge port characteristic different that the first predetermined purge port characteristic.

In accordance with one or more aspects of the present disclosure, a substrate loading device includes a frame adapted to connect the substrate loading device to a substrate processing apparatus, the frame having a transport opening through which substrates are transported between the substrate loading device and the substrate processing apparatus; a cassette support connected to the frame for holding at least one substrate cassette container for transfer of substrates to and from the at least one substrate cassette container through the transport opening; and cassette support purge ports with more than one purge port nozzle locations disposed on the cassette support, each of the more than one purge port nozzle locations being configured so that a purge port nozzle at the purge port nozzle location couples to at least one purge port of the at least one substrate cassette container; wherein each purge port nozzle location defines an interchangeable purge port nozzle interface so that different interchangeable purge port nozzles, corresponding to different interchangeable purge port nozzle modules each having different predetermined purge nozzle configurations, are removably mounted to respective purge port nozzle interfaces of the more than one purge port nozzle locations that correspond to the different predetermined purge nozzle configurations of the interchangeable purge port nozzle modules, in conformance with and effecting coupling to different ports, of the at least one purge port, of different substrate cassette containers, of the at least one substrate cassette container, having different purge port characteristics.

In accordance with one or more aspects of the present disclosure, each of the interchangeable purge port nozzle interfaces is disposed so as to have a predetermined position relative to a predetermined datum of the cassette support so that each purge port nozzle interface is deterministically located with respect to a predetermined datum of each different substrate cassette container.

In accordance with one or more aspects of the present disclosure, each of the interchangeable purge port nozzle interfaces and the different predetermined purge nozzle configurations of each respective one of the different interchangeable purge port nozzle modules are configured so as to effect fast swap mounting of each respective one of the different interchangeable purge port nozzle modules with another one of the different interchangeable purge port nozzle modules.

In accordance with one or more aspects of the present disclosure, each of the interchangeable purge port nozzle interfaces defines a nozzle positioning datum deterministically representing each of the at least one purge port of the different substrate cassette containers having different purge port characteristics.

In accordance with one or more aspects of the present disclosure, each purge port nozzle is removably mounted to the interchangeable purge port nozzle interface as a unit independent from another purge port nozzle of the corresponding purge port nozzle module, and each independently mounted purge port nozzle, of the corresponding purge port nozzle module, is independently interchanged with a different purge port nozzle of a different corresponding purge port nozzle module so as to effect interchange of the corresponding purge port nozzle module with the different corresponding purge port nozzle module.

In accordance with one or more aspects of the present disclosure, each purge port nozzle is removably mounted to the purge port nozzle interface as a unit independent from another purge port nozzle of the corresponding purge port nozzle module, and the corresponding purge port nozzle module is interchanged nozzle by nozzle with a different purge port nozzle module with different corresponding purge port nozzles.

In accordance with one or more aspects of the present disclosure, each different purge port nozzle module has a module frame with each corresponding purge port nozzle mounted to the module frame so that the module frame is common to each corresponding purge port nozzle, and the module frame defines a common removable mount coupling to the cassette support so that removably coupling the module frame to the cassette support effects mounting of each purge port nozzle to the respective purge port nozzle interface as a common module unit.

In accordance with one or more aspects of the present disclosure, the module frame of each different purge port nozzle module with the corresponding purge port nozzle thereon is interchangeable as a module unit with another module frame of each other different purge port nozzle module with the corresponding different purge port nozzle thereon.

In accordance with one or more aspects of the present disclosure, each different purge port nozzle module corresponds to a different predetermined purge port characteristic of different ones of the at least one substrate cassette container.

In accordance with one or more aspects of the present disclosure, a substrate loading device includes a frame adapted to connect the substrate loading device to a substrate processing apparatus, the frame having a transport opening through which substrates are transported between the substrate loading device and the substrate processing apparatus; a cassette support connected to the frame for holding at least one substrate cassette container for transfer of substrates to and from the at least one substrate cassette container through the transport opening; and selectably configurable cassette support purge ports with more than one purge port nozzle locations disposed on the cassette support, each of the more than one purge port nozzle locations being configured so that a purge port nozzle at the purge port nozzle location couples to at least one purge port of the at least one substrate cassette container; wherein each purge port nozzle location defines an interchangeable purge port nozzle interface; and an interchangeable purge port nozzle module, with at least one purge port nozzle, and being selectable from a number of different interchangeable purge port nozzle modules, each having different predetermined purge port nozzle configurations for modular mounting to the interchangeable purge port nozzle interface, so that selectable mounting of the interchangeable purge port nozzle module changes the configuration of the selectably configurable cassette support purge ports from a first configuration with the purge port nozzle at purge port nozzle locations conformal with and effecting coupling with a first of the at least one substrate cassette container having a first predetermined purge port characteristic, to a second configuration with the purge port nozzle at purge port nozzle locations conformal with and effecting coupling with a second of the at least one substrate cassette container having a second predetermined purge port characteristic different that the first predetermined purge port characteristic.

In accordance with one or more aspects of the present disclosure, the interchangeable purge port nozzle interface is disposed so as to have a predetermined position relative to a predetermined datum of the cassette support so that each purge port nozzle, of the different interchangeable purge port nozzle modules, mounted to the interchangeable purge nozzle interface is deterministically located with respect to a predetermined datum of each different substrate cassette container.

In accordance with one or more aspects of the present disclosure, the interchangeable purge port nozzle interface is disposed so as to have a predetermined position relative to a predetermined datum of the cassette support so that selectable mounting of the interchangeable purge port nozzle module effects, substantially coincident with mounting, deterministic positioning of each purge port nozzle, of the interchangeable purge port nozzle module, mounted to the interchangeable purge nozzle interface with respect to a predetermined datum of each different substrate cassette container.

In accordance with one or more aspects of the present disclosure, each of the interchangeable purge port nozzle interface is disposed so as to have a predetermined position relative to a predetermined datum of the cassette support so that each of the interchangeable purge port nozzle interface is deterministically located with respect to a predetermined datum of each different substrate cassette container.

In accordance with one or more aspects of the present disclosure, each of the interchangeable purge port nozzle interfaces and the different predetermined purge nozzle configurations of each respective one of the different interchangeable purge port nozzle modules are configured so as to effect fast swap mounting of each respective one of the different interchangeable purge port nozzle modules with another one of the different interchangeable purge port nozzle modules.

In accordance with one or more aspects of the present disclosure, each of the interchangeable purge port nozzle interfaces defines a nozzle positioning datum deterministically representing each of the at least one purge port of the different substrate cassette containers having different purge port characteristics.

In accordance with one or more aspects of the present disclosure, each purge port nozzle is removably mounted to the interchangeable purge port nozzle interface as a unit independent from another purge port nozzle of the interchangeable purge port nozzle module, and each independently mounted purge port nozzle, of the interchangeable purge port nozzle module, is independently interchanged with a different purge port nozzle of another different purge port nozzle module from the number of different purge port nozzle modules so as to effect interchange of the interchangeable purge port nozzle module with the other different purge port nozzle module.

In accordance with one or more aspects of the present disclosure, each purge port nozzle is removably mounted to the interchangeable purge port nozzle interface as a unit independent from another purge port nozzle of the interchangeable purge port nozzle module, and the interchangeable purge port nozzle module is interchanged nozzle by nozzle with another of the different purge port nozzle modules with different corresponding purge port nozzles.

In accordance with one or more aspects of the present disclosure, each different purge port nozzle module from the number of different purge port nozzle modules has a module frame with each corresponding purge port nozzle mounted to the module frame so that the module frame is common to each corresponding purge port nozzle, and the module frame defines a common removable mount coupling to the cassette support so that removably coupling the module frame to the cassette support effects mounting of each purge port nozzle to a respective purge port nozzle interface as a common module unit.

In accordance with one or more aspects of the present disclosure, the module frame of each different purge port nozzle module with the corresponding purge port nozzle thereon is interchangeable as a module unit with another module frame of each different purge port nozzle module from the number of different purge port nozzle modules with the corresponding different purge port nozzle thereon.

In accordance with one or more aspects of the present disclosure, each different purge port nozzle module from the number of different purge port nozzle modules corresponds to a different predetermined purge port characteristic of different ones of the at least one substrate cassette container.

In accordance with one or more aspects of the present disclosure a method is provided. The method including providing a frame of a substrate loading device adapted to connect the substrate loading device to a substrate processing apparatus, the frame having a transport opening through which substrates are transported between the substrate loading device and the substrate processing apparatus, providing a cassette support connected to the frame for holding at least one substrate cassette container for transfer of substrates to and from the at least one substrate cassette container through the transport opening, and selectably mounting different interchangeable purge port nozzles to the substrate loading device where cassette support purge ports with more than one purge port nozzle locations are disposed on the cassette support, each of the more than one purge port nozzle locations is configured so that a purge port nozzle at the purge port nozzle location couples to at least one purge port of the at least one substrate cassette container, each purge port nozzle location defines an interchangeable purge port nozzle interface so that the different interchangeable purge port nozzles, corresponding to different interchangeable purge port nozzle modules each having different predetermined purge nozzle configurations, are removably mounted to respective purge port nozzle interfaces of the more than one purge port nozzle locations that correspond to the different predetermined purge nozzle configurations of the interchangeable purge port nozzle modules, in conformance with and effecting coupling to different ports, of the at least one purge port, of different substrate cassette containers, of the at least one substrate cassette container, having different purge port characteristics.

In accordance with one or more aspects of the present disclosure further including disposing each of the interchangeable purge port nozzle interfaces so as to have a predetermined position relative to a predetermined datum of the cassette support so that each purge port nozzle interface is deterministically located with respect to a predetermined datum of each different substrate cassette container.

In accordance with one or more aspects of the present disclosure further including effecting fast swap mounting of each respective one of the different interchangeable purge port nozzle modules with another one of the different interchangeable purge port nozzle modules.

In accordance with one or more aspects of the present disclosure each of the interchangeable purge port nozzle interfaces defines a nozzle positioning datum deterministically representing each of the at least one purge port of the different substrate cassette containers having different purge port characteristics.

In accordance with one or more aspects of the present disclosure each purge port nozzle is removably mounted to the interchangeable purge port nozzle interface as a unit independent from another purge port nozzle of the corresponding purge port nozzle module, and each independently mounted purge port nozzle, of the corresponding purge port nozzle module, is independently interchanged with a different purge port nozzle of a different corresponding purge port nozzle module, the method further comprising effecting interchange of the corresponding purge port nozzle module with the different corresponding purge port nozzle module.

In accordance with one or more aspects of the present disclosure each purge port nozzle is removably mounted to the purge port nozzle interface as a unit independent from another purge port nozzle of the corresponding purge port nozzle module, the method further comprising interchanging the corresponding purge port nozzle module nozzle by nozzle with a different purge port nozzle module with different corresponding purge port nozzles.

In accordance with one or more aspects of the present disclosure each different purge port nozzle module has a module frame with each corresponding purge port nozzle mounted to the module frame so that the module frame is common to each corresponding purge port nozzle, and the module frame defines a common removable mount coupling to the cassette support, the method further comprising removably coupling the module frame to the cassette support to effect mounting of each purge port nozzle to the respective purge port nozzle interface as a common module unit.

In accordance with one or more aspects of the present disclosure the module frame of each different purge port nozzle module with the corresponding purge port nozzle thereon is interchangeable as a module unit with another module frame of each other different purge port nozzle module with the corresponding different purge port nozzle thereon.

In accordance with one or more aspects of the present disclosure each different purge port nozzle module corresponds to a different predetermined purge port characteristic of different ones of the at least one substrate cassette container.

In accordance with one or more aspects of the present disclosure a method is provided. The method including providing a frame of a substrate loading device adapted to connect the substrate loading device to a substrate processing apparatus, the frame having a transport opening through which substrates are transported between the substrate loading device and the substrate processing apparatus, providing a cassette support connected to the frame for holding at least one substrate cassette container for transfer of substrates to and from the at least one substrate cassette container through the transport opening, and providing selectably configurable cassette support purge ports with more than one purge port nozzle locations disposed on the cassette support, each of the more than one purge port nozzle locations being configured so that a purge port nozzle at the purge port nozzle location couples to at least one purge port of the at least one substrate cassette container, wherein each purge port nozzle location defines an interchangeable purge port nozzle interface, and selecting an interchangeable purge port nozzle module having at least one purge port nozzle from a number of different interchangeable purge port nozzle modules, each having different predetermined purge port nozzle configurations for modular mounting to the interchangeable purge port nozzle interface, so that selectable mounting of the interchangeable purge port nozzle module changes the configuration of the selectably configurable cassette support purge ports from a first configuration with the purge port nozzle at purge port nozzle locations conformal with and effecting coupling with a first of the at least one substrate cassette container having a first predetermined purge port characteristic, to a second configuration with the purge port nozzle at purge port nozzle locations conformal with and effecting coupling with a second of the at least one substrate cassette container having a second predetermined purge port characteristic different that the first predetermined purge port characteristic.

In accordance with one or more aspects of the present disclosure the interchangeable purge port nozzle interface is disposed so as to have a predetermined position relative to a predetermined datum of the cassette support so that each purge port nozzle, of the different interchangeable purge port nozzle modules, mounted to the interchangeable purge nozzle interface is deterministically located with respect to a predetermined datum of each different substrate cassette container.

In accordance with one or more aspects of the present disclosure the interchangeable purge port nozzle interface is disposed so as to have a predetermined position relative to a predetermined datum of the cassette support so that selectable mounting of the interchangeable purge port nozzle module effects, substantially coincident with mounting, deterministic positioning of each purge port nozzle, of the interchangeable purge port nozzle module, mounted to the interchangeable purge port nozzle interface with respect to a predetermined datum of each different substrate cassette container.

In accordance with one or more aspects of the present disclosure each of the interchangeable purge port nozzle interface is disposed so as to have a predetermined position relative to a predetermined datum of the cassette support so that each of the interchangeable purge port nozzle interface is deterministically located with respect to a predetermined datum of each different substrate cassette container.

In accordance with one or more aspects of the present disclosure further including effecting fast swap mounting of each respective one of the different interchangeable purge port nozzle modules with another one of the different interchangeable purge port nozzle modules.

In accordance with one or more aspects of the present disclosure each of the interchangeable purge port nozzle interfaces defines a nozzle positioning datum deterministically representing each of the at least one purge port of the a respective one of the at least one substrate cassette containers having different purge port characteristics.

In accordance with one or more aspects of the present disclosure each purge port nozzle is removably mounted to the interchangeable purge port nozzle interface as a unit independent from another purge port nozzle of the interchangeable purge port nozzle module, and each independently mounted purge port nozzle, of the interchangeable purge port nozzle module, is independently interchanged with a different purge port nozzle of another different purge port nozzle module from the number of different purge port nozzle modules so as to effect interchange of the interchangeable purge port nozzle module with the other different purge port nozzle module.

In accordance with one or more aspects of the present disclosure each purge port nozzle is removably mounted to the interchangeable purge port nozzle interface as a unit independent from another purge port nozzle of the interchangeable purge port nozzle module, and the interchangeable purge port nozzle module is interchanged nozzle by nozzle with another of the different purge port nozzle modules with different corresponding purge port nozzles.

In accordance with one or more aspects of the present disclosure each different purge port nozzle module from the number of different purge port nozzle modules has a module frame with each corresponding purge port nozzle mounted to the module frame so that the module frame is common to each corresponding purge port nozzle, and the module frame defines a common removable mount coupling to the cassette support so that removably coupling the module frame to the cassette support effects mounting of each purge port nozzle to a respective purge port nozzle interface as a common module unit.

In accordance with one or more aspects of the present disclosure the module frame of each different purge port nozzle module with the corresponding purge port nozzle thereon is interchangeable as a module unit with another module frame of each different purge port nozzle module from the number of different purge port nozzle modules with the corresponding different purge port nozzle thereon.

In accordance with one or more aspects of the present disclosure each different purge port nozzle module from the number of different purge port nozzle modules corresponds to a different predetermined purge port characteristic of different ones of the at least one substrate cassette container.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims, that may be appended hereto, does not indicate that a combination of these features cannot be advantageously used, such a combination remaining within the scope of the aspects of the present disclosure.

What is claimed is:

1. A substrate loading device comprising:
a frame adapted to connect the substrate loading device to a substrate processing apparatus, the frame having a transport opening through which substrates are transported between the substrate loading device and the substrate processing apparatus;
a cassette support connected to the frame for holding at least one substrate cassette container for transfer of substrates to and from the at least one substrate cassette container through the transport opening; and
cassette support purge ports with more than one purge port nozzle locations disposed on the cassette support, each of the more than one purge port nozzle locations being configured so that a purge port nozzle at the purge port nozzle location couples to at least one purge port of the at least one substrate cassette container;
wherein each purge port nozzle location defines an interchangeable purge port nozzle interface so that different interchangeable purge port nozzles, corresponding to different interchangeable purge port nozzle modules each having different predetermined purge nozzle configurations, are removably mounted to respective purge port nozzle interfaces of the more than one purge port nozzle locations that correspond to the different predetermined purge nozzle configurations of the interchangeable purge port nozzle modules, in conformance with and effecting coupling to different ports, of the at least one purge port, of different substrate cassette containers, of the at least one substrate cassette container, having different purge port characteristics.

2. The substrate loading device of claim 1, wherein each of the interchangeable purge port nozzle interfaces is disposed so as to have a predetermined position relative to a predetermined datum of the cassette support so that each purge port nozzle interface is deterministically located with respect to a predetermined datum of each different substrate cassette container.

3. The substrate loading device of claim 1, wherein each of the interchangeable purge port nozzle interfaces and the different predetermined purge nozzle configurations of each respective one of the different interchangeable purge port nozzle modules are configured so as to effect fast swap mounting of each respective one of the different interchangeable purge port nozzle modules with another one of the different interchangeable purge port nozzle modules.

4. The substrate loading device of claim 1, wherein each of the interchangeable purge port nozzle interfaces defines a nozzle positioning datum deterministically representing each of the at least one purge port of the different substrate cassette containers having different purge port characteristics.

5. The substrate loading device of claim 1, wherein each purge port nozzle is removably mounted to the interchangeable purge port nozzle interface as a unit independent from another purge port nozzle of the corresponding purge port nozzle module, and each independently mounted purge port nozzle, of the corresponding purge port nozzle module, is independently interchanged with a different purge port nozzle of a different corresponding purge port nozzle module so as to effect interchange of the corresponding purge port nozzle module with the different corresponding purge port nozzle module.

6. The substrate loading device of claim 1, wherein each purge port nozzle is removably mounted to the purge port nozzle interface as a unit independent from another purge port nozzle of the corresponding purge port nozzle module, and the corresponding purge port nozzle module is interchanged nozzle by nozzle with a different purge port nozzle module with different corresponding purge port nozzles.

7. The substrate loading device of claim 1, wherein each different purge port nozzle module corresponds to a different predetermined purge port characteristic of different ones of the at least one substrate cassette container.

8. The substrate loading device of claim 1, wherein each different purge port nozzle module has a module frame with each corresponding purge port nozzle mounted to the module frame so that the module frame is common to each corresponding purge port nozzle, and the module frame defines a common removable mount coupling to the cassette support so that removably coupling the module frame to the cassette support effects mounting of each purge port nozzle to the respective purge port nozzle interface as a common module unit.

9. The substrate loading device of claim 8, wherein the module frame of each different purge port nozzle module with the corresponding purge port nozzle thereon is interchangeable as a module unit with another module frame of each other different purge port nozzle module with the corresponding different purge port nozzle thereon.

10. A substrate loading device comprising:
a frame adapted to connect the substrate loading device to a substrate processing apparatus, the frame having a transport opening through which substrates are transported between the substrate loading device and the substrate processing apparatus;
a cassette support connected to the frame for holding at least one substrate cassette container for transfer of substrates to and from the at least one substrate cassette container through the transport opening; and
selectably configurable cassette support purge ports with more than one purge port nozzle locations disposed on the cassette support, each of the more than one purge port nozzle locations being configured so that a purge port nozzle at the purge port nozzle location couples to at least one purge port of the at least one substrate cassette container;
wherein each purge port nozzle location defines an interchangeable purge port nozzle interface; and
an interchangeable purge port nozzle module, with at least one purge port nozzle, and being selectable from a number of different interchangeable purge port nozzle modules, each having different predetermined purge port nozzle configurations for modular mounting to the interchangeable purge port nozzle interface, so that selectable mounting of the interchangeable purge port nozzle module changes the configuration of the selectably configurable cassette support purge ports from a first configuration with the purge port nozzle at purge port nozzle locations conformal with and effecting coupling with a first of the at least one substrate cassette container having a first predetermined purge port characteristic, to a second configuration with the purge port nozzle at purge port nozzle locations conformal with and effecting coupling with a second of the at least one substrate cassette container having a second predetermined purge port characteristic different that the first predetermined purge port characteristic.

11. The substrate loading device of claim 10, wherein the interchangeable purge port nozzle interface is disposed so as to have a predetermined position relative to a predetermined datum of the cassette support so that each purge port nozzle, of the different interchangeable purge port nozzle modules, mounted to the interchangeable purge nozzle interface is deterministically located with respect to a predetermined datum of each different substrate cassette container.

12. The substrate loading device of claim 10, wherein the interchangeable purge port nozzle interface is disposed so as to have a predetermined position relative to a predetermined datum of the cassette support so that selectable mounting of the interchangeable purge port nozzle module effects, substantially coincident with mounting, deterministic positioning of each purge port nozzle, of the interchangeable purge port nozzle module, mounted to the interchangeable purge nozzle interface with respect to a predetermined datum of each different substrate cassette container.

13. The substrate loading device of claim 10, wherein each of the interchangeable purge port nozzle interface is disposed so as to have a predetermined position relative to a predetermined datum of the cassette support so that each of the interchangeable purge port nozzle interface is deterministically located with respect to a predetermined datum of each different substrate cassette container.

14. The substrate loading device of claim 10, wherein each of the interchangeable purge port nozzle interfaces and the different predetermined purge nozzle configurations of each respective one of the different interchangeable purge port nozzle modules are configured so as to effect fast swap mounting of each respective one of the different interchangeable purge port nozzle modules with another one of the different interchangeable purge port nozzle modules.

15. The substrate loading device of claim 10, wherein each of the interchangeable purge port nozzle interfaces defines a nozzle positioning datum deterministically representing each of the at least one purge port of the different substrate cassette containers having different purge port characteristics.

16. The substrate loading device of claim 10, wherein each purge port nozzle is removably mounted to the interchangeable purge port nozzle interface as a unit independent from another purge port nozzle of the interchangeable purge port nozzle module, and each independently mounted purge port nozzle, of the interchangeable purge port nozzle module, is independently interchanged with a different purge port nozzle of another different purge port nozzle module from the number of different purge port nozzle modules so as to effect interchange of the interchangeable purge port nozzle module with the other different purge port nozzle module.

17. The substrate loading device of claim 10, wherein each purge port nozzle is removably mounted to the interchangeable purge port nozzle interface as a unit independent from another purge port nozzle of the interchangeable purge port nozzle module, and the interchangeable purge port nozzle module is interchanged nozzle by nozzle with another of the different purge port nozzle modules with different corresponding purge port nozzles.

18. The substrate loading device of claim 10, wherein each different purge port nozzle module from the number of different purge port nozzle modules corresponds to a different predetermined purge port characteristic of different ones of the at least one substrate cassette container.

19. The substrate loading device of claim 10, wherein each different purge port nozzle module from the number of different purge port nozzle modules has a module frame with each corresponding purge port nozzle mounted to the module frame so that the module frame is common to each corresponding purge port nozzle, and the module frame defines a common removable mount coupling to the cassette support so that removably coupling the module frame to the cassette support effects mounting of each purge port nozzle to a respective purge port nozzle interface as a common module unit.

20. The substrate loading device of claim 19, wherein the module frame of each different purge port nozzle module with the corresponding purge port nozzle thereon is interchangeable as a module unit with another module frame of each different purge port nozzle module from the number of different purge port nozzle modules with the corresponding different purge port nozzle thereon.

21. A method comprising:
providing a frame of a substrate loading device adapted to connect the substrate loading device to a substrate processing apparatus, the frame having a transport opening through which substrates are transported between the substrate loading device and the substrate processing apparatus;
providing a cassette support connected to the frame for holding at least one substrate cassette container for transfer of substrates to and from the at least one substrate cassette container through the transport opening; and
selectably mounting different interchangeable purge port nozzles to the substrate loading device where cassette support purge ports with more than one purge port nozzle locations are disposed on the cassette support, each of the more than one purge port nozzle locations is configured so that a purge port nozzle at the purge port nozzle location couples to at least one purge port of the at least one substrate cassette container, each purge port nozzle location defines an interchangeable purge port nozzle interface so that the different interchangeable purge port nozzles, corresponding to different interchangeable purge port nozzle modules each having different predetermined purge nozzle configurations, are removably mounted to respective purge port nozzle interfaces of the more than one purge port nozzle locations that correspond to the different predetermined purge nozzle configurations of the interchangeable purge port nozzle modules, in conformance with and effecting coupling to different ports, of the at least one purge port, of different substrate cassette containers, of the at least one substrate cassette container, having different purge port characteristics.

22. The method of claim 21, further comprising disposing each of the interchangeable purge port nozzle interfaces so as to have a predetermined position relative to a predetermined datum of the cassette support so that each purge port nozzle interface is deterministically located with respect to a predetermined datum of each different substrate cassette container.

23. The method of claim 21, further comprising effecting fast swap mounting of each respective one of the different interchangeable purge port nozzle modules with another one of the different interchangeable purge port nozzle modules.

24. The method of claim 21, wherein each of the interchangeable purge port nozzle interfaces defines a nozzle positioning datum deterministically representing each of the at least one purge port of the different substrate cassette containers having different purge port characteristics.

25. The method of claim 21, wherein each purge port nozzle is removably mounted to the interchangeable purge port nozzle interface as a unit independent from another purge port nozzle of the corresponding purge port nozzle module, and each independently mounted purge port nozzle, of the corresponding purge port nozzle module, is independently interchanged with a different purge port nozzle of a different corresponding purge port nozzle module, the method further comprising effecting interchange of the corresponding purge port nozzle module with the different corresponding purge port nozzle module.

26. The method of claim 21, wherein each purge port nozzle is removably mounted to the purge port nozzle interface as a unit independent from another purge port nozzle of the corresponding purge port nozzle module, the method further comprising interchanging the corresponding purge port nozzle module nozzle by nozzle with a different purge port nozzle module with different corresponding purge port nozzles.

27. The method of claim 21, wherein each different purge port nozzle module corresponds to a different predetermined purge port characteristic of different ones of the at least one substrate cassette container.

28. The method of claim 21, wherein each different purge port nozzle module has a module frame with each corresponding purge port nozzle mounted to the module frame so that the module frame is common to each corresponding purge port nozzle, and the module frame defines a common removable mount coupling to the cassette support, the method further comprising removably coupling the module frame to the cassette support to effect mounting of each purge port nozzle to the respective purge port nozzle interface as a common module unit.

29. The method of claim 28, wherein the module frame of each different purge port nozzle module with the corresponding purge port nozzle thereon is interchangeable as a module unit with another module frame of each other different purge port nozzle module with the corresponding different purge port nozzle thereon.

* * * * *